(12) United States Patent  
Miyake et al.

(10) Patent No.: US 9,425,220 B2  
(45) Date of Patent: Aug. 23, 2016

(54) SEMICONDUCTOR DEVICE

(71) Applicant: Semiconductor Energy Laboratory Co., Ltd., Atsugi-shi, Kanagawa-ken (JP)

(72) Inventors: Hiroyuki Miyake, Kanagawa (JP); Shunpei Yamazaki, Tokyo (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 14/010,841

(22) Filed: Aug. 27, 2013

(65) Prior Publication Data

US 2014/0061636 A1 Mar. 6, 2014

(30) Foreign Application Priority Data

Aug. 28, 2012 (JP) .................. 2012-188010  
Mar. 15, 2013 (JP) .................. 2013-053989

(51) Int. Cl.  
*H01L 29/12* (2006.01)  
*H01L 27/12* (2006.01)  
*G02F 1/1362* (2006.01)

(52) U.S. Cl.  
CPC ..... *H01L 27/1255* (2013.01); *G02F 1/136213* (2013.01); *G02F 1/136286* (2013.01); *G02F 2201/40* (2013.01)

(58) Field of Classification Search  
CPC . H01L 29/7869; H01L 29/24; H01L 29/479; H01L 21/16; H01L 21/00  
USPC .............................. 257/43, 59, 68  
See application file for complete search history.

(56) References Cited

U.S. PATENT DOCUMENTS 5,299,041 A 3/1994 Morin et al.  
5,724,107 A 3/1998 Nishikawa et al.  
(Continued)

FOREIGN PATENT DOCUMENTS

EP 1037095 A 9/2000  
EP 1 737 044 A1 12/2006  
(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Quoc Hoang  
(74) *Attorney, Agent, or Firm* — Fish & Richardson P.C.

(57) ABSTRACT

A semiconductor device having a high aperture ratio, including a capacitor with increased capacitance, and consuming low power is provided. The semiconductor device includes pixels defined by x (x is an integer of 2 or more) scan lines and y (y is an integer of 1 or more) signal lines, and each of the pixels includes a transistor, and a capacitor. The transistor includes a semiconductor film having a light-transmitting property. The capacitor includes a dielectric film between a pair of electrodes. In the capacitor between an (m−1)-th (m is an integer of 2 or more and x or less) scan line and an m-th scan line, a semiconductor film on the same surface as the semiconductor film having a light-transmitting property of the transistor serves as one of the pair of electrodes and is electrically connected to the (m−1)-th scan line.

21 Claims, 42 Drawing Sheets

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,421,101 B1 | 7/2002 | Zhang et al. |
| 6,559,477 B2 | 5/2003 | Tada et al. |
| 6,563,174 B2 | 5/2003 | Kawasaki et al. |
| 6,727,522 B1 | 4/2004 | Kawasaki et al. |
| 6,784,949 B1 | 8/2004 | Nagata et al. |
| 7,006,082 B2 | 2/2006 | Akai et al. |
| 7,034,790 B2 | 4/2006 | Fukami et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,142,260 B2 | 11/2006 | Yang |
| 7,211,825 B2 | 5/2007 | Shih et al |
| 7,250,991 B2 | 7/2007 | Nagata et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,515,217 B2 | 4/2009 | Yang |
| 7,674,650 B2 | 3/2010 | Akimoto et al. |
| 7,732,819 B2 | 6/2010 | Akimoto et al. |
| 7,745,798 B2 | 6/2010 | Takahashi |
| 7,750,882 B2 | 7/2010 | Akai et al. |
| 7,773,167 B2 | 8/2010 | Tsai et al. |
| 7,872,261 B2 | 1/2011 | Ikeda |
| 7,910,490 B2 | 3/2011 | Akimoto et al. |
| 7,932,521 B2 | 4/2011 | Akimoto et al. |
| 7,952,651 B2 | 5/2011 | Kimura |
| 7,978,277 B2 | 7/2011 | Kimura |
| 8,039,842 B2 | 10/2011 | Jinbo |
| 8,102,476 B2 | 1/2012 | Son et al. |
| 8,138,500 B2 | 3/2012 | Hosoya |
| 8,274,077 B2 | 9/2012 | Akimoto et al. |
| 8,368,066 B2 | 2/2013 | Yamazaki et al. |
| 8,384,077 B2 | 2/2013 | Yano et al. |
| 8,441,011 B2 | 5/2013 | Yamazaki et al. |
| 8,466,463 B2 | 6/2013 | Akimoto et al. |
| 8,481,373 B2 | 7/2013 | Okabe et al. |
| 8,502,226 B2 | 8/2013 | Kondo et al. |
| 8,614,916 B2 | 12/2013 | Nagatsuka et al. |
| 8,619,011 B2 | 12/2013 | Kimura |
| 8,629,441 B2 | 1/2014 | Yamazaki et al. |
| 8,937,307 B2 | 1/2015 | Yamazaki |
| 2001/0046027 A1 | 11/2001 | Tai et al. |
| 2002/0039814 A1 | 4/2002 | Jada et al. |
| 2002/0056838 A1 | 5/2002 | Ogawa |
| 2002/0132454 A1 | 9/2002 | Ohtsu et al. |
| 2003/0189210 A1 | 10/2003 | Yamazaki et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0169991 A1 | 9/2004 | Nagata et al. |
| 2004/0246424 A1 | 12/2004 | Sawasaki et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1* | 7/2007 | Lai et al. .............. 257/59 |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0215945 A1 | 9/2007 | Tokunaga et al. |
| 2007/0236640 A1 | 10/2007 | Kimura |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0068361 A1* | 3/2008 | Miyazawa ............ 345/204 |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0141203 A1 | 6/2009 | Son et al. |
| 2009/0152506 A1 | 6/2009 | Umeda et al. |
| 2009/0152541 A1 | 6/2009 | Maekawa et al. |
| 2009/0189156 A1 | 7/2009 | Akimoto |
| 2009/0278122 A1 | 11/2009 | Hosono et al. |
| 2009/0280600 A1 | 11/2009 | Hosono et al. |
| 2009/0283762 A1 | 11/2009 | Kimura |
| 2009/0289256 A1 | 11/2009 | Jinbo |
| 2010/0044711 A1 | 2/2010 | Imai |
| 2010/0065844 A1 | 3/2010 | Tokunaga |
| 2010/0092800 A1 | 4/2010 | Itagaki et al. |
| 2010/0102311 A1 | 4/2010 | Ito et al. |
| 2010/0109002 A1 | 5/2010 | Itagaki et al. |
| 2010/0123136 A1 | 5/2010 | Lee et al. |
| 2010/0163867 A1 | 7/2010 | Yamazaki et al. |
| 2010/0163874 A1 | 7/2010 | Koyama et al. |
| 2010/0289020 A1 | 11/2010 | Yano et al. |
| 2011/0024750 A1 | 2/2011 | Yamazaki et al. |
| 2011/0024751 A1 | 2/2011 | Yamazaki et al. |
| 2011/0031491 A1 | 2/2011 | Yamazaki et al. |
| 2011/0031492 A1 | 2/2011 | Yamazaki et al. |
| 2011/0032435 A1 | 2/2011 | Kimura |
| 2011/0037068 A1 | 2/2011 | Yamazaki et al. |
| 2011/0084271 A1 | 4/2011 | Yamazaki et al. |
| 2011/0121300 A1 | 5/2011 | Miyairi et al. |
| 2011/0297930 A1 | 12/2011 | Choi et al. |
| 2012/0062811 A1 | 3/2012 | Miyake |
| 2012/0108018 A1 | 5/2012 | Okabe et al. |

(56) References Cited

U.S. PATENT DOCUMENTS

| | | |
|---|---|---|
| 2012/0211745 A1 | 8/2012 | Ueda et al. |
| 2012/0273780 A1 | 11/2012 | Yamazaki et al. |
| 2012/0280230 A1 | 11/2012 | Akimoto et al. |
| 2013/0146452 A1 | 6/2013 | Yano et al. |
| 2013/0328044 A1 | 12/2013 | Yamazaki et al. |
| 2014/0014948 A1 | 1/2014 | Matsukura |
| 2014/0034954 A1 | 2/2014 | Yamazki et al. |
| 2014/0042432 A1 | 2/2014 | Yamazaki |
| 2014/0042443 A1 | 2/2014 | Yamazaki |
| 2014/0061654 A1 | 3/2014 | Yamazaki et al. |
| 2014/0070209 A1 | 3/2014 | Yamazaki et al. |
| 2015/0115265 A1 | 4/2015 | Yamazaki |

FOREIGN PATENT DOCUMENTS

| | | |
|---|---|---|
| EP | 2192441 A | 6/2010 |
| EP | 2 226 847 A2 | 9/2010 |
| EP | 2458577 A | 5/2012 |
| EP | 2579237 A | 4/2013 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | 2004/114391 A1 | 12/2004 |
| WO | WO-2009/075281 | 6/2009 |
| WO | WO-2011/010415 | 1/2011 |
| WO | WO-2011/148537 | 12/2011 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and SN-Doped Zinc Indium Oxide Thin Film Transistors for Amoled Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543

Fung, T et al., "2-D Numerical Simulation of High Performance Amorphous In—Ga—Zn—O TFTs for Flat Panel Displays,"AM-FDP '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology,"SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancles In ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MoO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the In2O3 and SC2O3—A2O3—BO Systems [A; Fe, Ga, or Al; B: Mg, Mn, Fe, Ni, Cu,or Zn] At Temperatures Over 1000° C," Journal of Solid State Chemistry, 1985, vol. 60, pp. 382-384.

(56) References Cited

OTHER PUBLICATIONS

Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, Vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nakamura, M et al., "The phase relations in the In2O3—Ga2ZnO4—ZnO systems at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTS With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display,"AM-FPD '09 Digest of Technical Papers, Jul. 1, 2009, pp. 227-230, The Japan Society of Applied Physics.

Orita, M et al., "Amorphous transparent conductive oxide InGaO3(XnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, Vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous Gizo (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

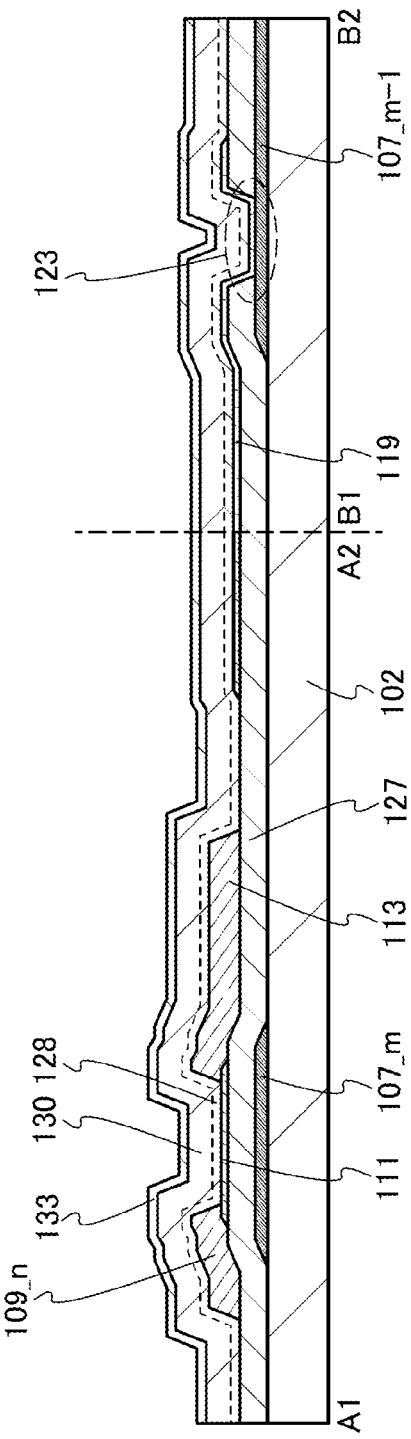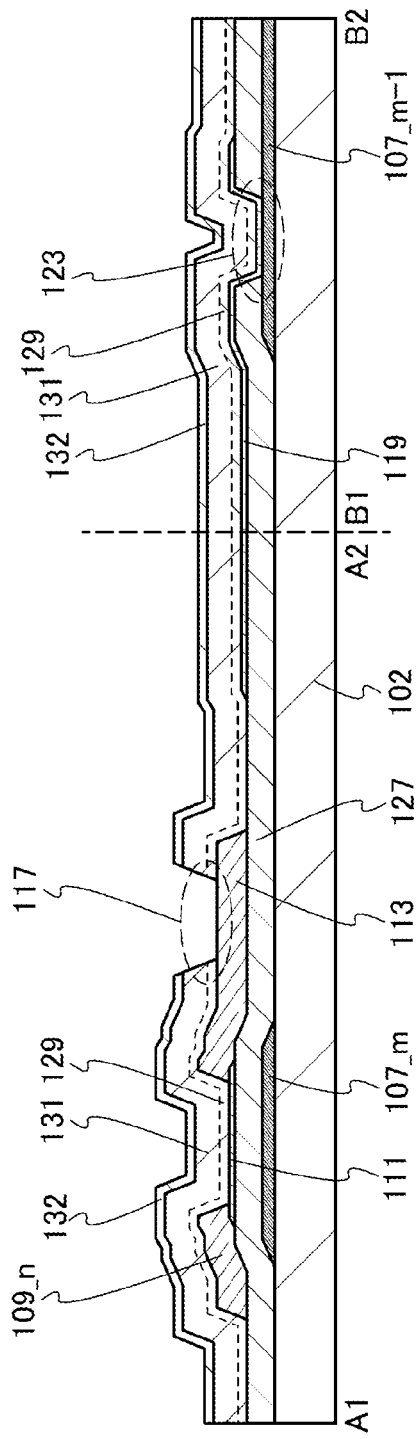

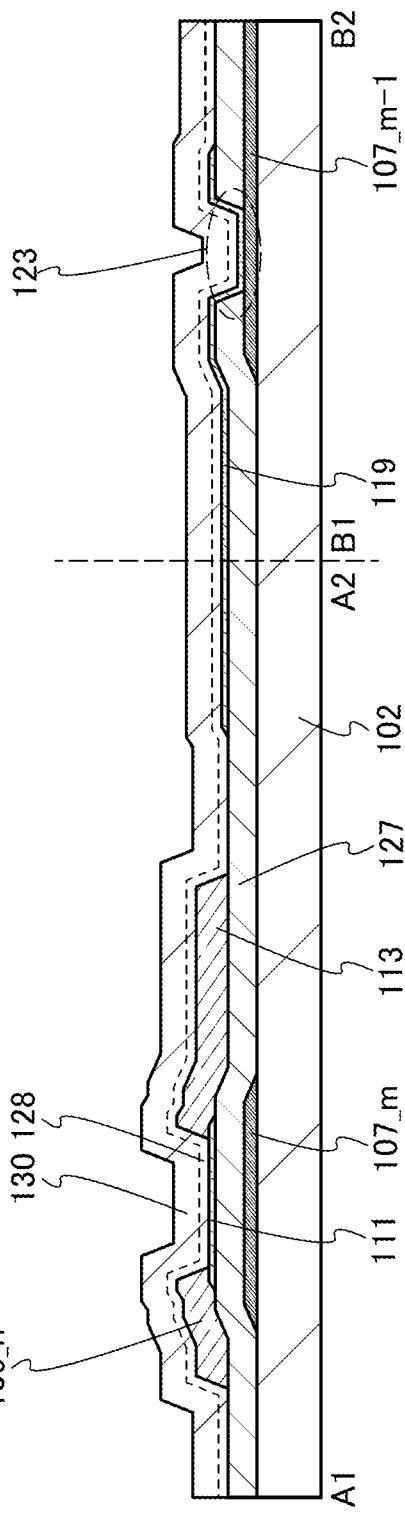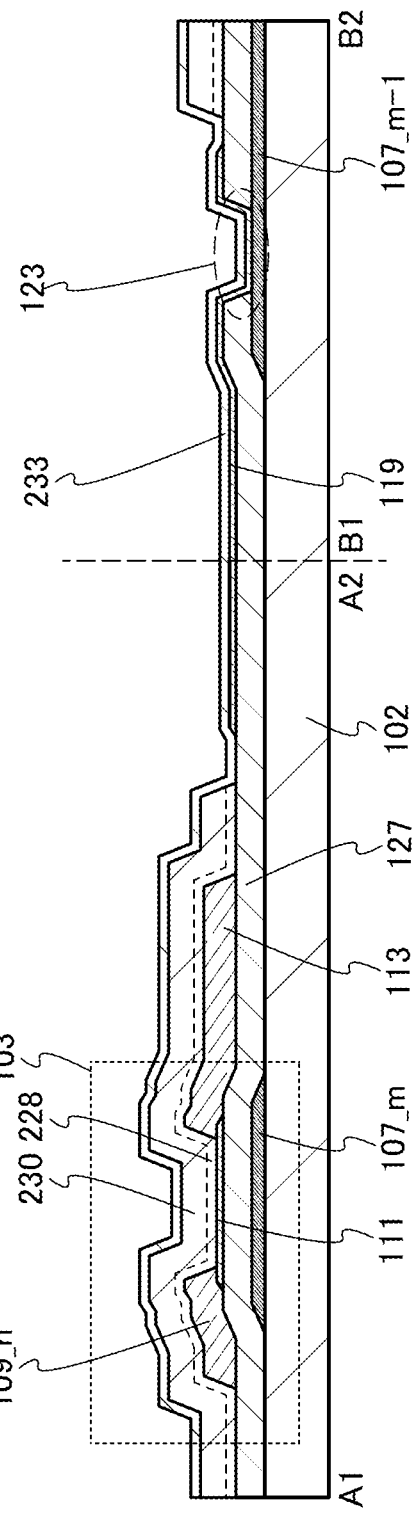

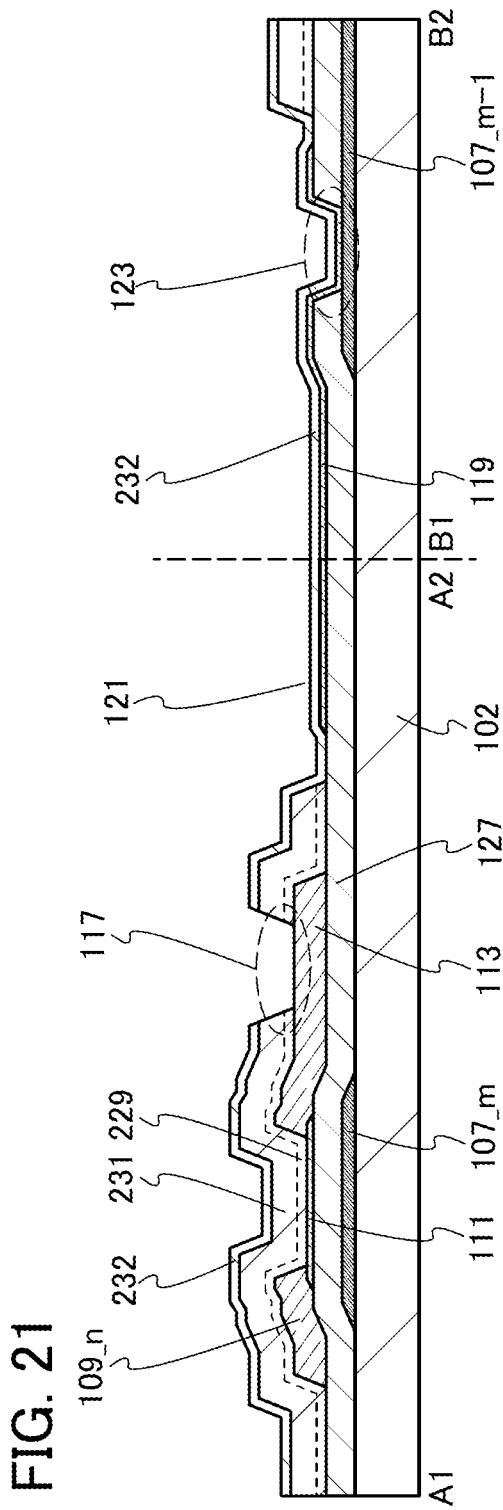

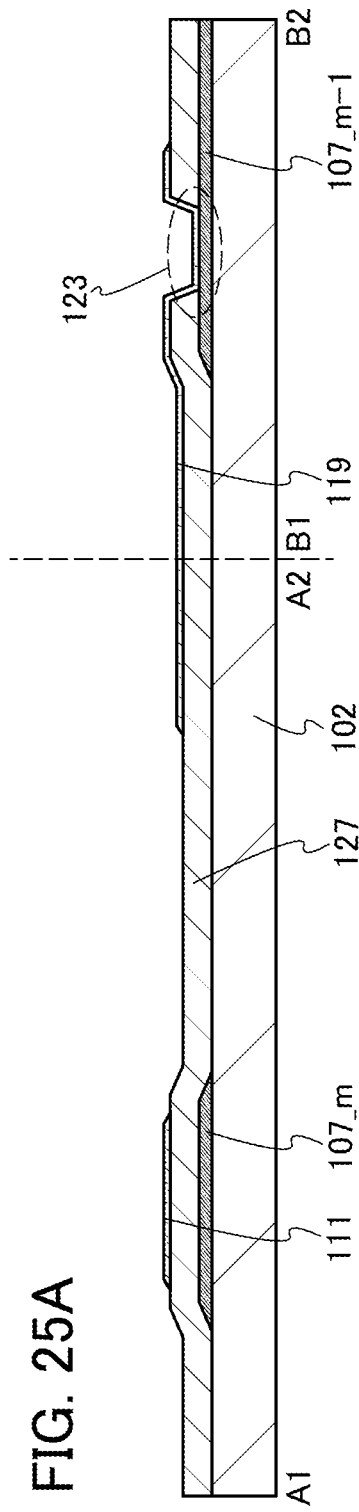
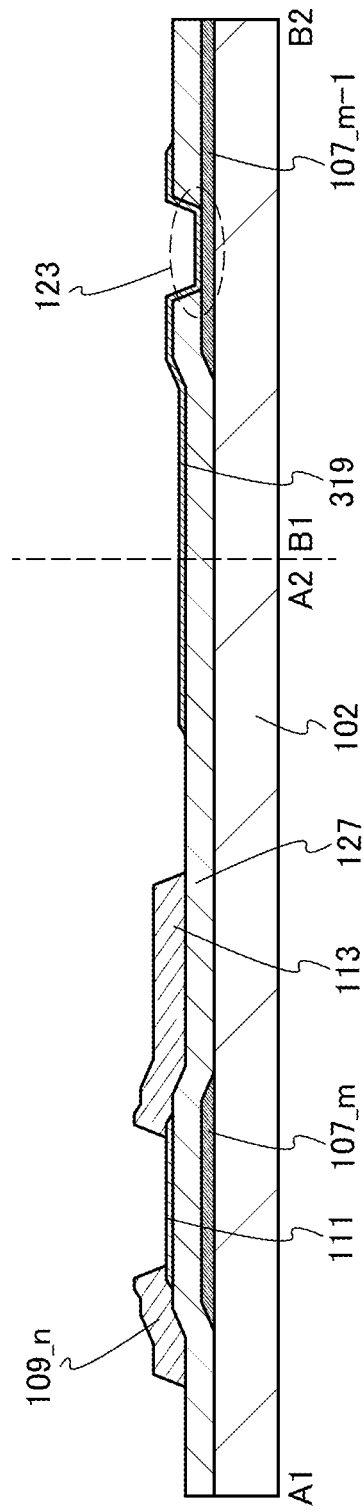
FIG. 25A
FIG. 25B

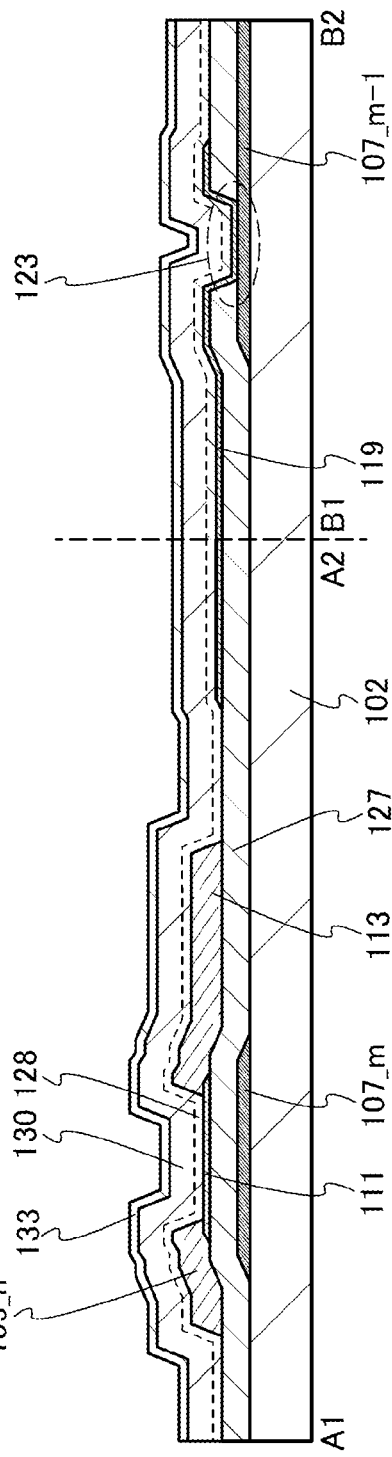
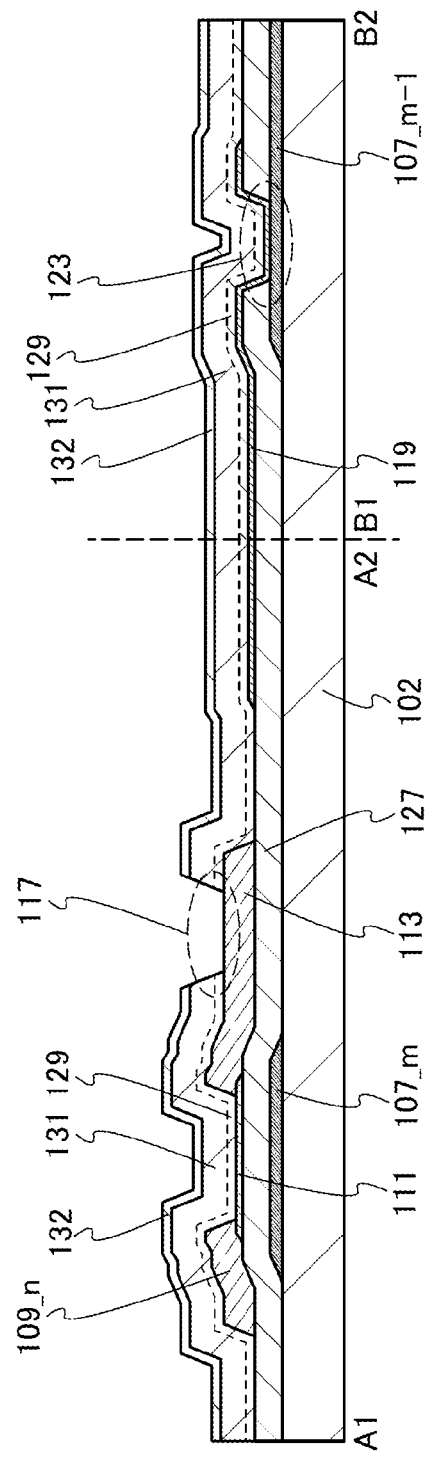

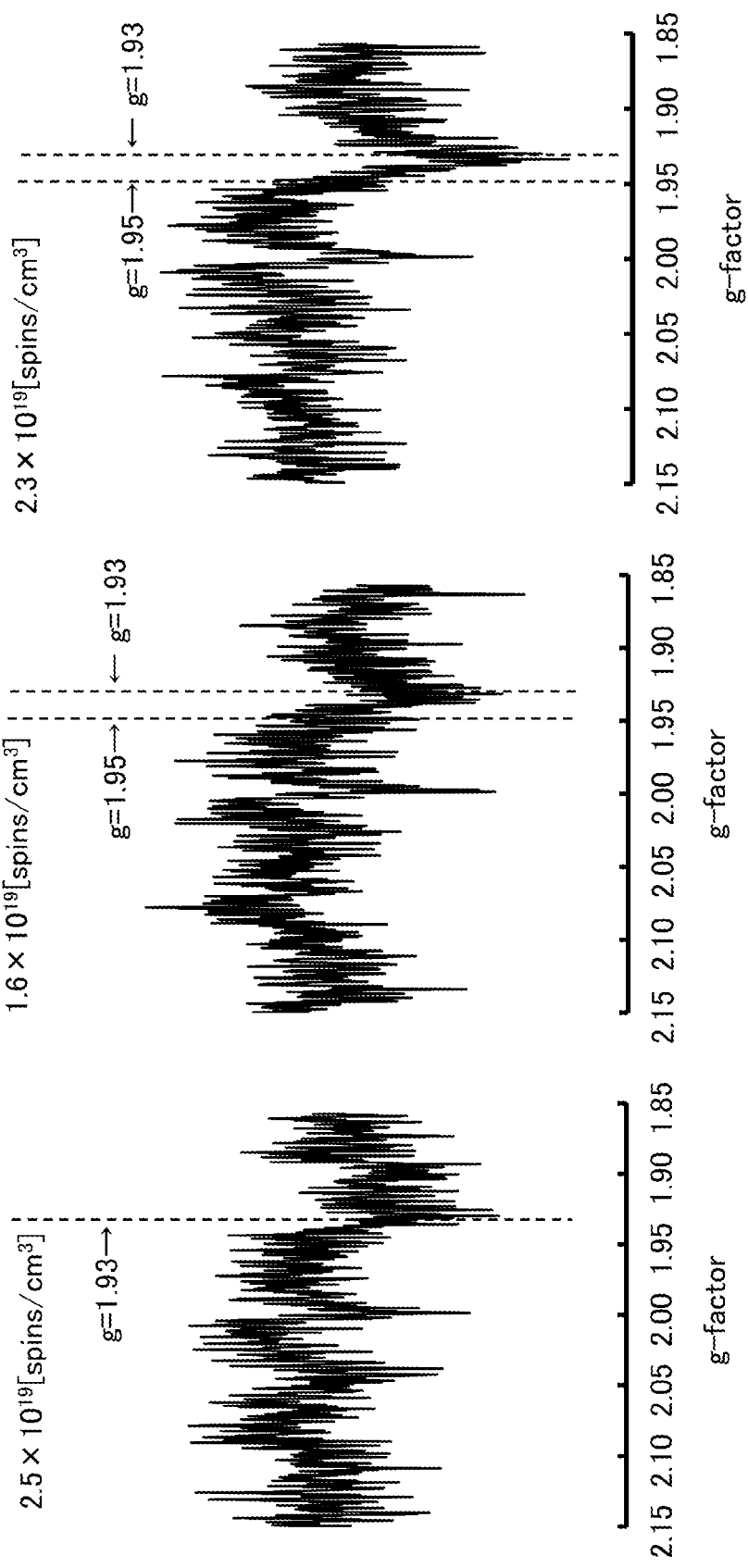

● In  ○ Ga  ○ Zn  ● O  ◉ H

SEMICONDUCTOR DEVICE

BACKGROUND OF THE INVENTION

1. Field of the Invention

The invention disclosed in this specification and the like relates to semiconductor devices.

2. Description of the Related Art

In recent years, flat panel displays such as liquid crystal displays have been widespread. In each of pixels provided in the row direction and the column direction in a display device such as a flat panel display, a transistor serving as a switching element, a liquid crystal element electrically connected to the transistor, and a capacitor connected to the liquid crystal element in parallel are provided.

As a semiconductor material for forming a semiconductor film of the transistor, a silicon semiconductor such as amorphous silicon or polysilicon (polycrystalline silicon) is generally used.

Besides, metal oxides having semiconductor characteristics (hereinafter referred to as oxide semiconductors) can be used for semiconductor films of transistors.

For example, techniques for forming transistors including zinc oxide or an In—Ga—Zn-based oxide semiconductor are disclosed (see Patent Documents 1 and 2).

REFERENCE

Patent Document

[Patent Document 1] Japanese Published Patent Application No. 2007-123861
[Patent Document 2] Japanese Published Patent Application No. 2007-096055

SUMMARY OF THE INVENTION

In a capacitor, a dielectric film is provided between a pair of electrodes at least one of which is formed, in many cases, using a light-shielding conductive film for forming a gate electrode, a source electrode, a drain electrode, or the like of a transistor.

As the capacitance value of a capacitor is increased, a period during which the alignment of liquid crystal molecules of a liquid crystal element can be kept constant in the state where an electric field is applied can be made longer. When the period can be made longer in a display device which displays a still image, the number of times of rewriting image data can be reduced, leading to a reduction in power consumption.

One of methods for increasing the capacitance of a capacitor is to increase the area occupied by the capacitor, specifically, to increase the area of a region where a pair of electrodes overlaps with each other. However, when the area of a light-shielding conductive film is increased to increase the area of a region where a pair of electrodes overlaps with each other, the aperture ratio of a pixel is lowered and thus display quality of an image is degraded.

In view of the above, one object of one embodiment of the present invention is to provide a semiconductor device having a high aperture ratio and including a capacitor capable of increasing capacitance. Another object is to provide a semiconductor device having a high aperture ratio, including a capacitor capable of increasing capacitance, and consuming low power.

One embodiment of the present invention is a semiconductor device in which pixels are arranged in the row direction and the column direction. Each of the pixels includes a transistor and a light-transmitting capacitor. One of a pair of electrodes included in the capacitor is electrically connected to a scan line included in an adjacent pixel in the row direction.

One electrode of the capacitor can be formed using a semiconductor film having a light-transmitting property. The semiconductor film having a light-transmitting property can be formed using, for example, an oxide semiconductor that has an energy gap of greater than or equal to 3.0 eV and has high visible light transmittance.

The light-transmitting capacitor can be formed by utilizing a formation process of the transistor. One electrode of the capacitor can be formed by utilizing a formation process of a semiconductor film of the transistor. An oxide semiconductor film can be used as the semiconductor film of the transistor, and a transistor including an oxide semiconductor film which is processed appropriately has an extremely low off-state current. Thus, power consumption of a semiconductor device including such a transistor can be reduced.

One embodiment of the present invention is a semiconductor device including pixels defined by x (x is an integer of 2 or more) scan lines and y (y is an integer of 1 or more) signal lines, and each of the pixels includes a transistor and a capacitor. The transistor includes a semiconductor film having a light-transmitting property. The capacitor includes a dielectric film between a pair of electrodes and is electrically connected to the transistor. In the capacitor between an (m−1)-th (m is an integer of 2 or more and x or less) scan line and an m-th scan line, a semiconductor film on the same surface as the semiconductor film having a light-transmitting property of the transistor serves as one of the pair of electrodes and is electrically connected to the (m−1)-th scan line.

The dielectric film of the capacitor can be formed by utilizing a formation process of an insulating film provided over the semiconductor film of the transistor. The other electrode of the capacitor can be formed by utilizing a formation process of a pixel electrode electrically connected to the transistor.

That is, the semiconductor device of one embodiment of the present invention includes a pixel electrode electrically connected to the transistor. The pixel electrode serves as the other of the pair of electrodes, and an insulating film over the semiconductor film having a light-transmitting property of the transistor serves as the dielectric film.

With such a structure, the capacitor has a light-transmitting property and thus can be formed large (in a large area) in a region of the pixel where the transistor is not formed. Accordingly, one embodiment of the present invention can provide a semiconductor device whose aperture ratio and capacitance are increased. Further, an increase in aperture ratio can result in a semiconductor device with excellent display quality. Note that in the semiconductor device of one embodiment of the present invention, the scan line included in the adjacent pixel in the row direction also serves as a wiring (capacitor line) for supplying a potential to one electrode of the capacitor. As a result, a capacitor line does not need to be additionally provided in the pixel; thus, the aperture ratio of the pixel can be higher than that of a conventional semiconductor device.

In the semiconductor device, when the insulating film over the semiconductor film of the transistor is a stack of an oxide insulating film and a nitride insulating film, the dielectric film of the capacitor can be a stack of the oxide insulating film and the nitride insulating film.

In the case where the insulating film provided over the semiconductor film of the transistor is a stack of an oxide insulating film and a nitride insulating film, the oxide insulating film is removed only in a region over the capacitor, so that the dielectric film of the capacitor can be a single layer of the nitride insulating film. In other words, the nitride insulating film is in contact with the oxide semiconductor film serving as one electrode of the capacitor. With a structure in which a nitride insulating film is in contact with an oxide semiconductor film, a defect level (interface state) is formed at the interface between the nitride insulating film and the oxide semiconductor film. When the nitride insulating film is formed by a plasma CVD method or a sputtering method, the semiconductor film is exposed to plasma and thus, oxygen vacancies are generated. In addition, nitrogen and/or hydrogen contained in the nitride insulating film move/moves to the semiconductor film. When hydrogen contained in the nitride insulating film enters the defect levels or the oxygen vacancies, electrons serving as carriers are generated. As a result, the electrical conductivity of the semiconductor film is increased, and the semiconductor film has n-type conductivity and serves as a conductive film. The conductivity of the oxide semiconductor film is increased, so that the oxide semiconductor film can serve as one electrode of the capacitor sufficiently and easily. Since the dielectric film can be made thin, the capacitance of the capacitor can be increased.

One embodiment of the present invention is a semiconductor device including pixels defined by x (x is an integer of 2 or more) scan lines and y (y is an integer of 1 or more) signal lines, and each of the pixels includes a transistor and a capacitor. The transistor includes a semiconductor film having a light-transmitting property. The capacitor includes a dielectric film between a pair of electrodes. In the transistor, an insulating film having a stack of an oxide insulating film and a nitride insulating film is over the semiconductor film having a light-transmitting property. In the capacitor between an (m−1)-th (m is an integer of 2 or more and x or less) scan line and an m-th scan line, a semiconductor film on the same surface as the semiconductor film having a light-transmitting property of the transistor serves as one of the pair of electrodes and is electrically connected to the (m−1)-th scan line. The nitride insulating film included in the insulating film serves as the dielectric film.

Also in the semiconductor device, a pixel electrode electrically connected to the transistor serves as the other of the pair of electrodes.

An oxide semiconductor film serving as one electrode of the capacitor may be provided in direct contact with a scan line which serves as a capacitor line and is included in the adjacent pixel; thus, the oxide semiconductor film is electrically connected to the scan line. Alternatively, the oxide semiconductor film serving as one electrode can be electrically connected to the scan line through a conductive film formed in a process for forming a source electrode or a drain electrode of the transistor.

In particular, the conductive film may be provided in contact with an edge portion of the oxide semiconductor film serving as one electrode. For example, the conductive film can be provided in contact with the oxide semiconductor film along the outer periphery thereof. With such a structure, the conductivity of the oxide semiconductor film can be increased. The oxide semiconductor film can easily serve as one electrode of the capacitor by increasing its conductivity.

In the semiconductor device, the oxide semiconductor film serving as one electrode of the capacitor is preferably n-type and the electrical conductivity thereof is preferably increased. That is, one electrode of the capacitor is preferably an n-type oxide semiconductor film which is on the same surface as the oxide semiconductor film of the transistor and includes a region whose electrical conductivity is made higher than that of the oxide semiconductor film. With such a structure, the oxide semiconductor film can serve as one electrode of the capacitor sufficiently and easily. Further, the capacitor can operate stably in the whole operation period.

To make the oxide semiconductor film have n-type conductivity and to increase the electrical conductivity thereof, for example, one or more elements selected from boron, nitrogen, fluorine, aluminum, phosphorus, arsenic, indium, tin, antimony, and a rare gas element is preferably added to the oxide semiconductor film. Any of the above elements can be added to the oxide semiconductor film by an ion implantation method, an ion doping method, or the like, or by exposing the oxide semiconductor film to plasma containing any of the above elements. In that case, the electrical conductivity of the oxide semiconductor film serving as one electrode of the capacitor is greater than or equal to 10 S/cm and less than or equal to 1000 S/cm, preferably greater than or equal to 100 S/cm and less than or equal to 1000 S/cm.

Note that with a structure in which an oxide semiconductor film serving as one electrode of a capacitor is in contact with a nitride insulating film as in the above semiconductor device, a step of adding any of the above elements by an ion implantation method, an ion doping method, or the like can be skipped; thus, the yield of a semiconductor device can be improved and the manufacturing cost thereof can be reduced.

In the case where the insulating film which is provided over the oxide semiconductor film of the transistor included in the semiconductor device is a stack of an oxide insulating film and a nitride insulating film, it is preferable that the oxide insulating film be not easily permeable to nitrogen, that is, have a barrier property against nitrogen.

With such a structure, nitrogen can be prevented from diffusing to the oxide semiconductor film of the transistor; thus, variations in electric characteristics of the transistor can be prevented. Accordingly, the reliability of the semiconductor device can be improved.

Note that a method for manufacturing a semiconductor device of one embodiment of the present invention is also one embodiment of the present invention.

According to one embodiment of the present invention, a semiconductor device including a capacitor whose capacitance is increased while the aperture ratio is improved can be provided. Further, a semiconductor device which has a high aperture ratio and low power consumption and which includes a capacitor with large capacitance can be provided.

BRIEF DESCRIPTION OF THE DRAWINGS

FIGS. 8A and 8B are cross-sectional views illustrating a method for manufacturing a semiconductor device.

FIGS. 20A and 20B are cross-sectional views illustrating a method for manufacturing a semiconductor device.

FIG. 21 is a cross-sectional view illustrating a method for manufacturing a semiconductor device.

FIGS. 25A and 25B are cross-sectional views illustrating a method for manufacturing a semiconductor device.

FIGS. 26A and 26B are cross-sectional views illustrating a method for manufacturing a semiconductor device.

FIGS. 37A to 37C show results of ESR measurement.

DETAILED DESCRIPTION OF THE INVENTION

Figure 1A:
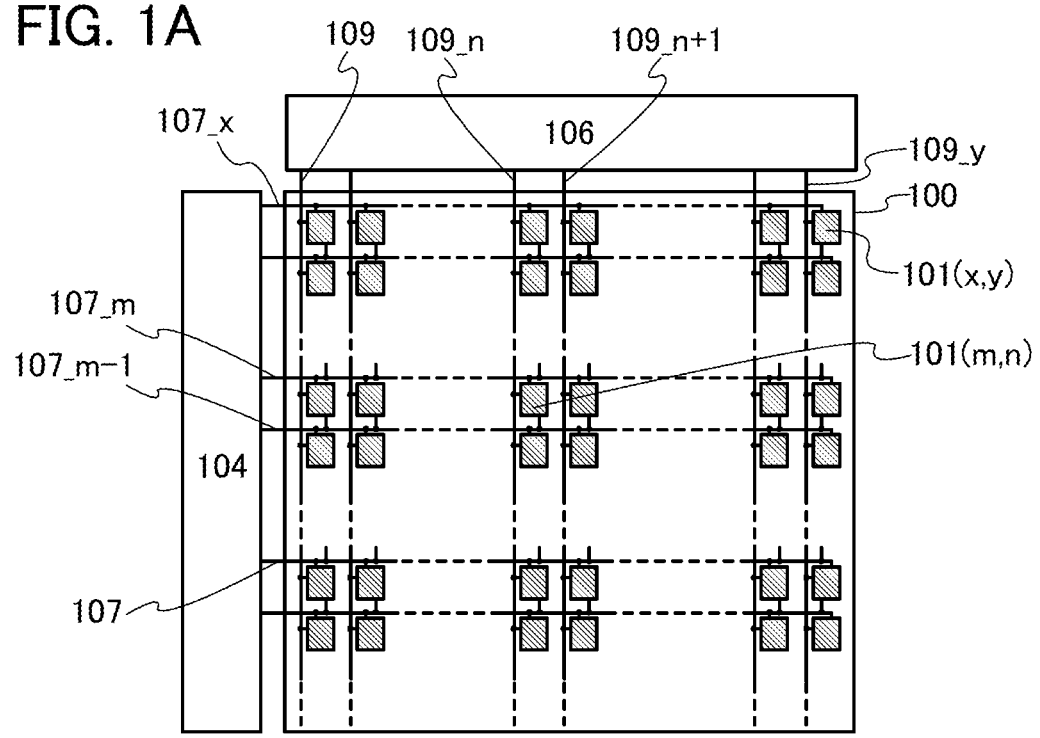
FIG. 1A is a diagram illustrating a semiconductor device and FIG. 1B is a circuit diagram of a pixel.

Embodiments and examples of the present invention will be described below in detail with reference to the accompanying drawings. However, the present invention is not limited to the following description and it is easily understood by those skilled in the art that the mode and details can be variously changed. In addition, the present invention should not be construed as being limited to the description in the following embodiments and examples.

Note that in structures of the present invention described below, the same portions or portions having similar functions are denoted by the same reference numerals in different drawings, and description thereof is not repeated. Further, the same hatching pattern is applied to portions having similar functions, and in some cases the portions are not especially denoted by reference numerals.

Note that in each drawing described in this specification, the size, the film thickness, or the region of each component is in some cases exaggerated for simplicity. Therefore, the embodiments and the examples of the present invention are not limited to such scales.

Note that the ordinal numbers such as "first" and "second" in this specification and the like are used for convenience and do not indicate the order of steps or the stacking order of layers. In addition, the ordinal numbers in this specification and the like do not indicate particular names which specify the present invention.

Functions of a "source" and a "drain" in the present invention are sometimes replaced with each other when the direction of current flow is changed in circuit operation, for example. Therefore, the terms "source" and "drain" can be used to denote the drain and the source, respectively, in this specification.

Note that a voltage refers to a difference between potentials of two points, and a potential refers to electrostatic energy (electric potential energy) of a unit charge at a given point in an electrostatic field. In general, a difference between a potential of one point and a reference potential (e.g., a ground potential) is merely called a potential or a voltage, and a potential and a voltage are used in many cases as synonymous words. Thus, in this specification, a potential may be rephrased as a voltage and a voltage may be rephrased as a potential unless otherwise specified.

In this specification, in the case where etching treatment is performed after a photolithography process, a mask formed in the photolithography process is removed.

Embodiment 1

In this embodiment, a semiconductor device of one embodiment of the present invention will be described with reference to drawings. Note that in this embodiment, a liquid crystal display device is described as an example of the semiconductor device of one embodiment of the present invention.

<Structure of Semiconductor Device>

FIG. 1A illustrates an example of a semiconductor device. The semiconductor device illustrated in FIG. 1A includes a pixel portion 100, a scan line driver circuit 104, a signal line driver circuit 106, x scan lines 107 which are arranged in parallel or substantially parallel to each other and whose potentials are controlled by the scan line driver circuit 104, and y signal lines 109 which are arranged in parallel or substantially parallel to each other and whose potentials are controlled by the signal line driver circuit 106. Note that x is an integer greater than or equal to 2, and y is an integer greater than or equal to 1.

In the pixel portion 100, pixels 101 including the x scan lines 107 and the y signal lines 109 are arranged in the row direction and the column direction. In other words, the pixel portion 100 includes the pixels 101 arranged in a matrix of x rows and y columns. In this specification, drawings, and the like, the m-th scan line is denoted by a scan line 107_m, the n-th signal line is denoted by a signal line 109_n, and a pixel provided in a region where the scan line 107_m and the signal line 109_n intersect with each other is denoted by a pixel 101(m, n). Note that m is an integer greater than or equal to 2 and less than or equal to x, and n is an integer greater than or equal to 1 and less than or equal to y.

The scan line 107_m is electrically connected to the pixels 101 arranged in the m-th row. The signal line 109_n is electrically connected to the pixels 101 arranged in the n-th column.

Further, each of the pixels 101 arranged in the m-th row is also electrically connected to a scan line included in an adjacent pixel in the row direction. Specifically, a scan line 107_m−1 is electrically connected to the pixels 101 arranged in the (m−1)-th row and the pixels 101 arranged in the m-th row.

Figure 1B:
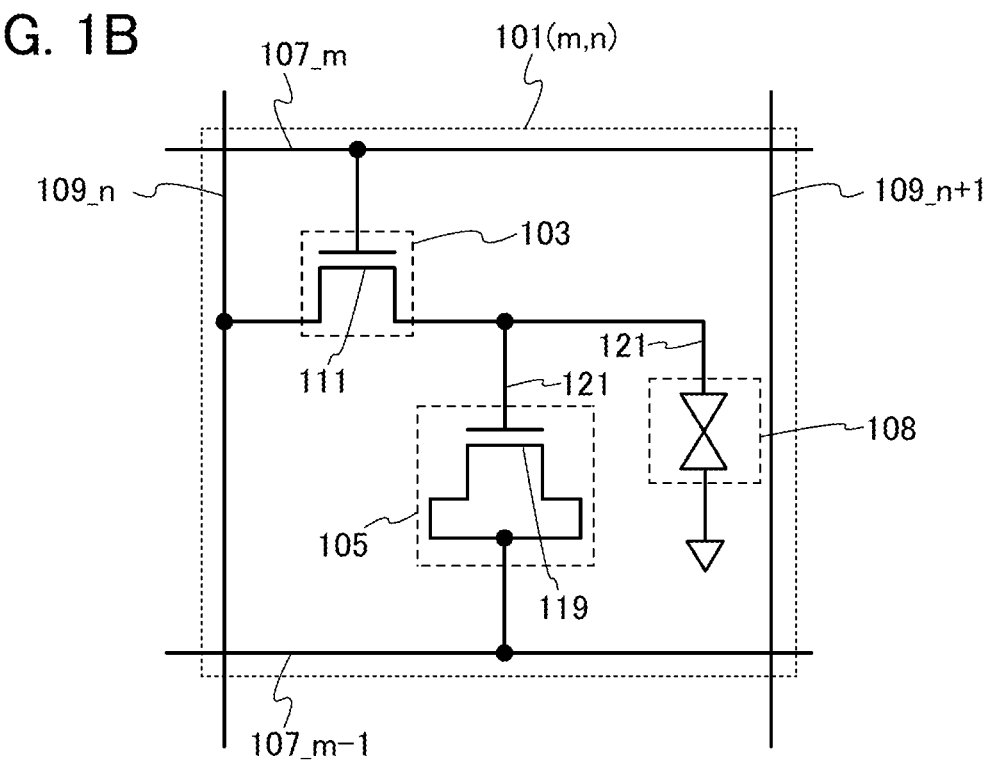

FIG. 1B is an example of a circuit diagram of the pixel 101(m, n) in the semiconductor device illustrated in FIG. 1A. The pixel 101(m, n) illustrated in FIG. 1B includes a transistor 103, a capacitor 105, and a liquid crystal element 108. The transistor 103 is electrically connected to the scan line 107_m and the signal line 109_n. One electrode of the capacitor 105 is electrically connected to the scan line 107_m−1, and the other electrode of the capacitor 105 is a pixel electrode 121 which is electrically connected to the transistor 103. In the liquid crystal element 108, an electrode (counter electrode) which is provided opposite to the pixel electrode 121 is electrically connected to a wiring for supplying a counter potential.

In the pixel 101(m, n), the scan line 107_m−1 also serves as a wiring (capacitor line) for supplying a potential to one electrode of the capacitor 105.

A semiconductor film included in the transistor 103 is an oxide semiconductor film. A transistor which includes an oxide semiconductor film processed under appropriate conditions as a semiconductor film including a channel formation region can have an extremely low off-state current. Accordingly, the transistor 103 is a transistor having an extremely low off-state current.

Figure 2:
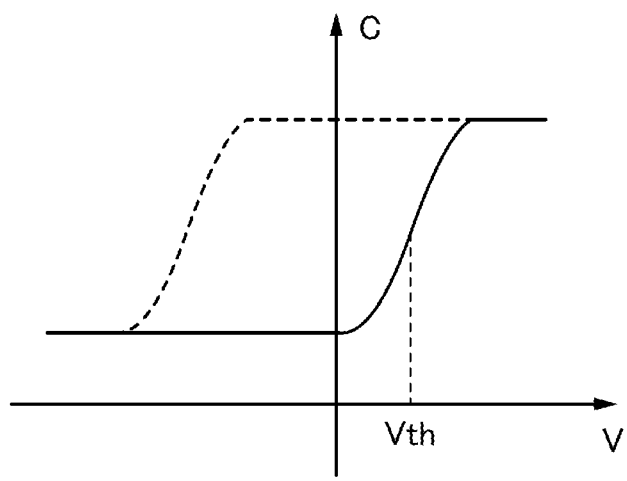
FIG. 2 is a graph showing the relation between voltage and capacitance of a capacitor included in a semiconductor device.

The capacitor 105 includes a dielectric film between the pair of electrodes and has a light-transmitting property. The capacitor 105 can be formed by utilizing a formation process of the transistor 103. One electrode of the capacitor 105 is a semiconductor film having a light-transmitting property, specifically, an oxide semiconductor film 119. The oxide semiconductor film 119 serves as one electrode of the capacitor 105 when the oxide semiconductor film 119 is made to be in a conductive state by controlling a potential supplied thereto. The oxide semiconductor film 119 is an oxide semiconductor film formed by utilizing a formation process of an oxide semiconductor film 111 included in the transistor 103. The dielectric film is an insulating film having a light-transmitting property which is provided over the oxide semiconductor film 111 included in the transistor 103. The pixel electrode 121 serves as the other electrode of the capacitor 105. Thus, the capacitor 105 can be regarded as a metal oxide semiconductor (MOS) capacitor. A MOS capacitor is charged when voltage higher than the threshold voltage (Vth) is applied to one electrode of the MOS capacitor (the pixel electrode 121 in the case of the capacitor 105) as shown in FIG. 2. Note that in FIG. 2, the horizontal axis indicates voltage (V) applied to the pixel electrode and the vertical axis indicates capacitance (C). In the case where the frequency of voltage at the time of the capacitance-voltage measurement (CV measurement) is lower than the frame frequency of the semiconductor device, CV curves as shown in FIG. 2 are obtained. In FIG. 2, a solid line is a CV curve in the case of an i-typed electrode and a dashed line is a CV curve in the case of an n-typed electrode.

The liquid crystal element 108 is an element which controls transmission or non-transmission of light by an optical modulation action of liquid crystal which is sandwiched between a substrate provided with the transistor 103 and the pixel electrode 121 and a substrate provided with the counter electrode. The optical modulation action of the liquid crystal is controlled by an electric field (a vertical electric field or a diagonal electric field) applied to the liquid crystal. In the case where the counter electrode (also referred to as a common electrode) is formed over the substrate over which the pixel electrode is formed, a lateral electric field is applied to the liquid crystal.

The scan line driver circuit 104 and the signal line driver circuit 106 are each roughly divided into a logic circuit portion, and a switch portion or a buffer portion. Although specific structures of the scan line driver circuit 104 and the signal line driver circuit 106 are omitted here, a transistor is included in each of the scan line driver circuit 104 and the signal line driver circuit 106.

Note that the transistor included in one or both of the scan line driver circuit 104 and the signal line driver circuit 106 can be formed utilizing the process for forming the transistor 103. That is, one or both of the scan line driver circuit 104 and the signal line driver circuit 106 can be provided over a substrate over which the transistor 103 and the pixel electrode 121 are provided. In this manner, one or both of the scan line driver circuit 104 and the signal line driver circuit 106 are formed over the same substrate, whereby the number of components of the semiconductor device can be reduced and the manufacturing cost can be reduced.

The capacitor 105 has a light-transmitting property as described above and thus can be formed large (in a large area) in a region of the pixel 101(m, n) where the transistor 103 is not formed. The semiconductor device illustrated in FIGS. 1A and 1B is a semiconductor device whose aperture ratio and capacitance are increased, and the display quality is excellent. Further, in the semiconductor device illustrated in FIGS. 1A and 1B, the scan line 107_m−1 also serves as the capacitor line of the capacitor 105; thus, a capacitor line does not need to be additionally provided. Accordingly, the aperture ratio of the pixel in the semiconductor device illustrated in FIGS. 1A and 1B is made higher than that of a pixel in a conventional semiconductor device. For example, when the pixel density of the semiconductor device in one embodiment of the present invention is about 300 ppi, the aperture ratio of the pixel can be 50% or higher, 55% or higher, or even 60% or higher. In one embodiment of the present invention, a semiconductor device whose aperture ratio of a pixel is made higher than that of the pixel in the conventional semiconductor device can be easily obtained.

Figure 3:
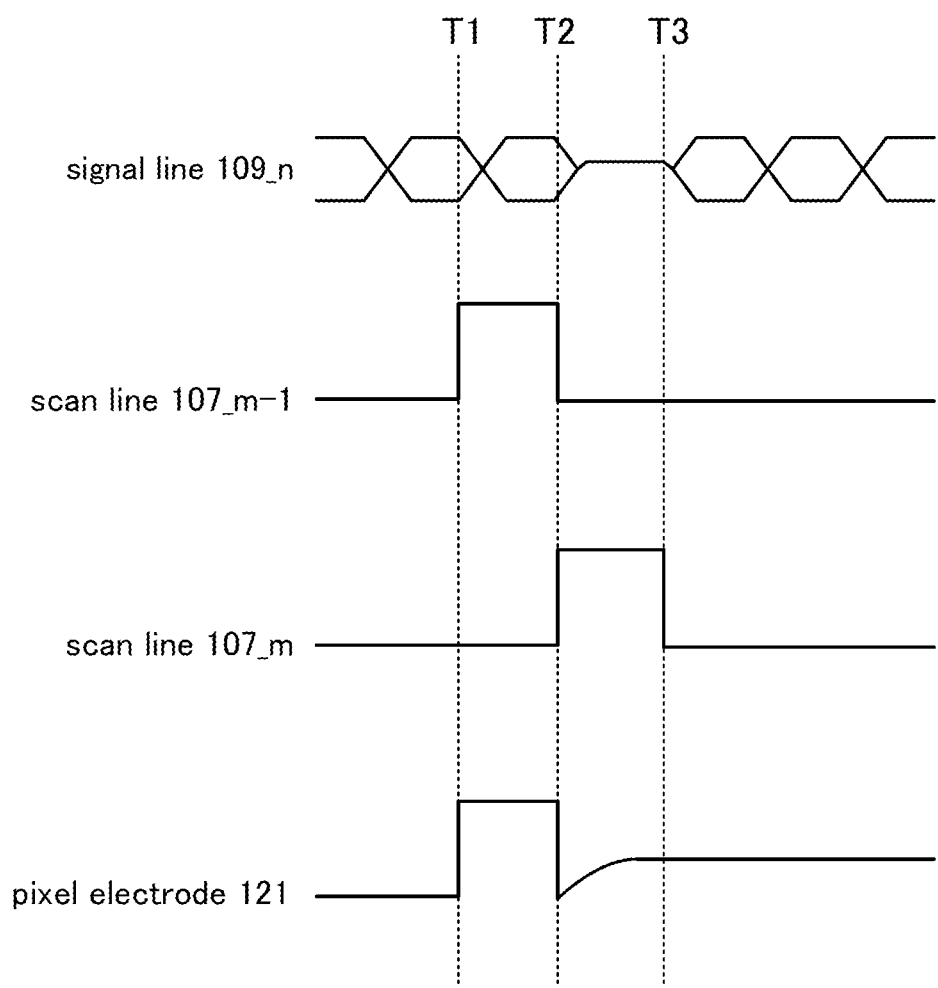
FIG. 3 is a timing chart for illustrating an operation method of a capacitor included in a semiconductor device.

Here, the operation of the capacitor 105 provided in the pixel 101(m, n) is described. FIG. 3 is a timing chart of the signal line 109_n, the scan line 107_m−1, the scan line 107_m, and the pixel electrode 121. The timing chart shows a change in potential of each of the signal line 109_n, the scan line 107_m−1, the scan line 107_m, and the pixel electrode 121. The potential of each of the signal line 109_n, the scan line 107_m−1, the scan line 107_m, and the pixel electrode 121 is changed when a signal is input.

In a period before Time T1, a specific signal (video signal or the like) is input to the signal line 109_n from the signal line driver circuit 106. In this period, a signal for turning on the transistor 103 is not input to the scan line 107_*m*−1 and the scan line 107_*m* from the scan line driver circuit 104. Further, in this period, no signal is input to the pixel electrode 121.

In a period from Time T1 to Time T2 (period T1T2), a specific signal is input to the signal line 109_*n* as in the period before Time T1. In the period T1T2, a signal for turning on a transistor included in a pixel 101(*m*−1, n) is input to the scan line 107_*m*−1, so that the potential of the scan line 107_*m*−1 is increased. A signal for turning on the transistor 103 is not input to the scan line 107_*m* in the period T1T2.

Further, the potential of the pixel electrode 121 is increased in the period T1T2. The potential of the pixel electrode 121 is increased (changed) in the following manner. Since the scan line 107_*m*−1 is electrically connected to the oxide semiconductor film 119 serving as one electrode of the capacitor 105, the potential of the one electrode (the oxide semiconductor film 119) is changed when the potential of the scan line 107_*m*−1 is changed. The pixel electrode 121 serving as the other electrode of the capacitor 105 faces the one electrode with the dielectric film provided therebetween; thus, the potential of the pixel electrode 121 is changed following the potential of the one electrode. Accordingly, the potential of the pixel electrode 121 is increased following the potential of the scan line 107_*m*−1. Note that the potential of the pixel electrode 121 is changed in a manner similar to that of the scan line 107_*m*−1.

In a period from Time T2 to Time T3 (period T2T3), a signal for turning off the transistor included in the pixel 101(*m*−1, n) is input to the scan line 107_*m*−1, so that the potential of the scan line 107_*m*−1 is decreased in Time T2. Since the potential of the pixel electrode 121 is changed following the potential of the scan line 107_*m*−1, the potential of the pixel electrode 121 is decreased in Time T2 as in the scan line 107_*m*−1.

In the period T2T3, a signal for turning on the transistor 103 is input to the scan line 107_*m*, so that the potential of the scan line 107_*m* is increased. A signal for operating the liquid crystal element 108 desirably is input to the signal line 109_*n* in the period T2T3. The transistor 103 is turned on in the period T2T3, so that the signal input to the signal line 109_*n* is input to the pixel electrode 121 electrically connected to the transistor 103. As a result, the potential of the pixel electrode 121 is increased to the same level as the potential of the signal line 109_*n*. The potential of the pixel electrode 121 is changed as described above; thus, the capacitor 105 can operate.

Note that in a period after Time T3, a specific signal is input to the signal line 109_*n* similarly in the period before Time T1. In the period after Time T3, the potential of the pixel electrode 121 is kept at the potential that is increased in the period T2T3. Specifically, the potential is kept until the potential of the scan line 107_*m*−1 is changed again.

Note that the period T1T2 is extremely short. The period T1T2 terminates before liquid crystals in the liquid crystal element 108 respond. Thus, it can be said that an influence of the optical modulation action of the liquid crystal is extremely small and the optical modulation action does not affect the display quality of the semiconductor device even when the potential of the pixel electrode 121 is changed.

Here, the relation among the threshold voltage (Vth) of the capacitor, the potential of the scan line 107_*m*, the potential of the scan line 107_*m*−1, the intermediate potential of a video signal, and the potential of the pixel electrode 121 is described below with reference to FIGS. 4A and 4B.

Figure 4A:
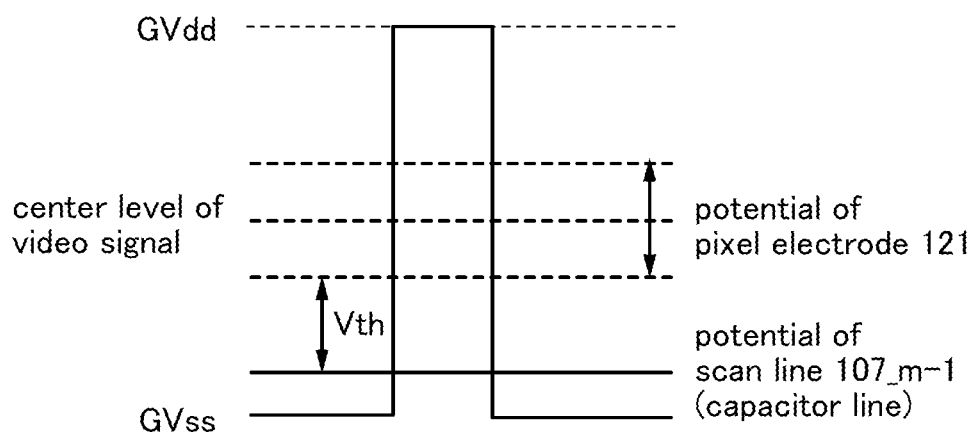
FIGS. 4A and 4B are diagrams for illustrating an operation method of a capacitor included in a semiconductor device.

FIG. 4A illustrates an example where a capacitor having characteristics shown by the solid CV curve in FIG. 2 is used. FIG. 4B illustrates an example where a capacitor having characteristics shown by the dashed CV curve in FIG. 2 is used. Note that the lowest potential supplied to the scan line 107_*m* is denoted by GVss and the highest potential supplied to the scan line 107_*m* is denoted by GVdd in FIGS. 4A and 4B.

The capacitor includes a dielectric film between the pair of electrodes. That is, the operation of the capacitor depends on the potential difference between the pair of electrodes. For example, when the threshold voltage of the capacitor, the potential of the pixel electrode 121, and the potential of the oxide semiconductor film 119 serving as the electrode of the capacitor are represented by Vth, Vd, and Vc, respectively, the relation Vd≥Vc+Vth is required.

Figure 4B:
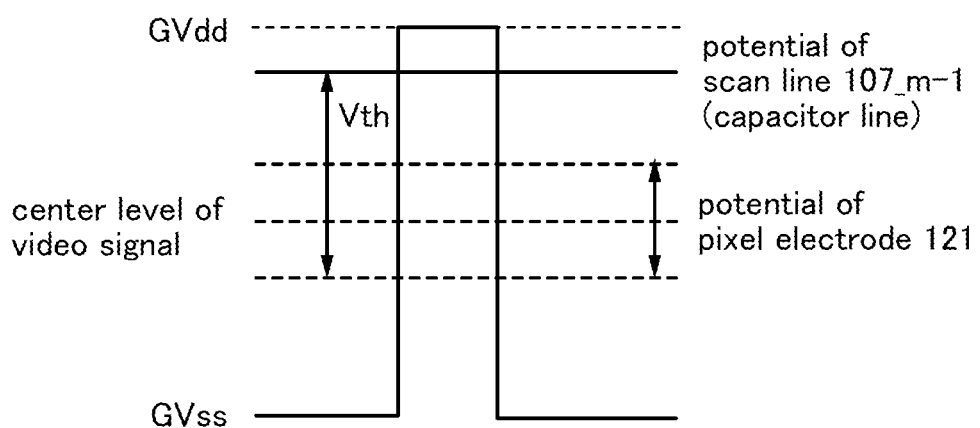

As illustrated in FIGS. 4A and 4B, the potential of the pixel electrode 121, which is the electrode of the capacitor 105, is changed in the positive direction or the negative direction in accordance with a signal input to the signal line 109_*n*. Specifically, the potential of the pixel electrode 121 is changed in the positive direction or the negative direction with the center level of a video signal as a reference.

In the case of FIG. 4A, the potential of the scan line 107_*m*−1 is set to be lower than the lowest potential of the pixel electrode 121 by Vth of the capacitor or more, so that the above relation can be satisfied; thus, the capacitor can be operated (see FIG. 4A). This is because since the electrode of the capacitor having characteristics shown by the solid CV curve in FIG. 2 is i-type and Vth is a positive value, the oxide semiconductor film 119 can be in a conductive state when the potential of the scan line 107_*m*−1 is set to be lower than the lowest potential of the pixel electrode 121 by Vth of the capacitor or more (shifts in the negative direction).

On the other hand, in the case of FIG. 4B, the potential of the scan line 107_*m*−1 is set to be higher than the lowest potential of the pixel electrode 121 by Vth of the capacitor or more, so that the above relation can be satisfied; thus, the capacitor can be operated (see FIG. 4B). This is because since the electrode of the capacitor having characteristics shown by the dashed CV curve in FIG. 2 is n-type and Vth is a negative value, the oxide semiconductor film 119 can be in a conductive state even when the potential of the scan line 107_*m*−1 is set to be higher than the lowest potential of the pixel electrode 121 by Vth of the capacitor or more (shifts in the positive direction).

Figure 5:
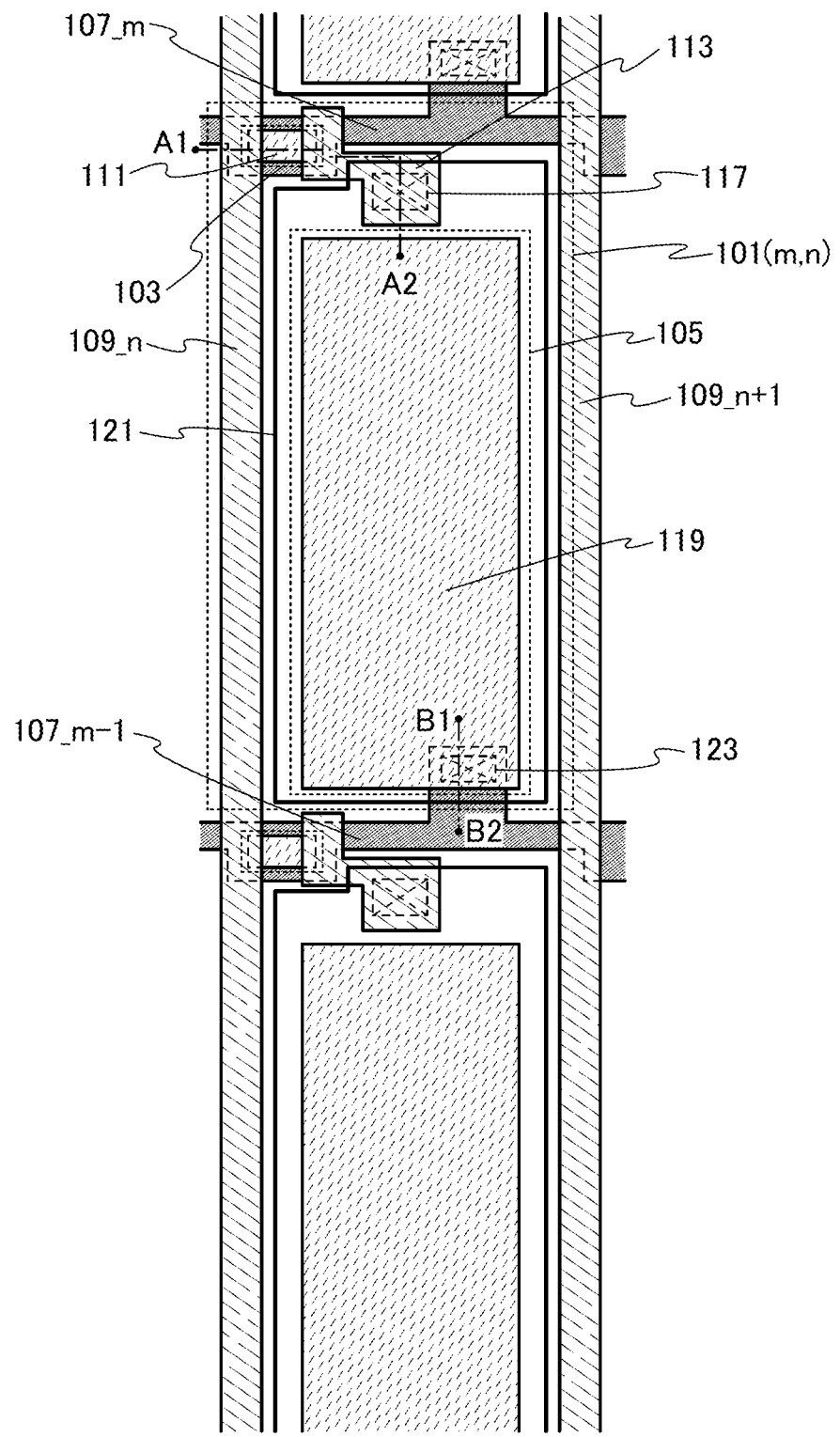
FIG. 5 is a top view illustrating a semiconductor device.

Next, the specific structural example of the pixel 101 is described. Here, the pixel 101(*m*, *n*) is described as an example. Note that FIG. 5 is a top view of the pixel 101(*m*, *n*). In FIG. 5, some components (e.g., the liquid crystal element 108) of the semiconductor device are omitted for clarity.

In FIG. 5, the scan line 107_*m*−1 and the scan line 107_*m* are provided so as to extend in the direction substantially perpendicular to the signal line 109_*n* and a signal line 109_*n*+1 (in the lateral direction in the drawing). The signal line 109_*n* and the signal line 109_*n*+1 are provided so as to extend in the direction substantially perpendicular to the scan line 107_*m*−1 and the scan line 107_*m* (in the longitudinal direction in the drawing). Note that the scan line 107_*m*−1 and the scan line 107_*m* are electrically connected to the scan line driver circuit 104 whereas the signal line 109*n* and the signal line 109_*n*+1 are electrically connected to the signal line driver circuit 106 (see FIG. 1A).

The transistor 103 is provided in a region where the scan line 107_*m* and the signal line 109_*n* intersect with each other. The transistor 103 includes at least the oxide semiconductor film 111 including a channel formation region, a gate electrode, a gate insulating film (not illustrated in FIG. 5), a source electrode, and a drain electrode.

In addition, the scan line 107_m includes a region serving as the gate electrode of the transistor 103, and the signal line 109_n includes a region serving as the source electrode of the transistor 103. A conductive film 113 includes a region serving as the drain electrode of the transistor 103 and is electrically connected to the pixel electrode 121 through an opening 117. In FIG. 5, the hatch pattern of the pixel electrode 121 is not illustrated.

The region in the scan line 107_m, which serves as the gate electrode, overlaps with at least the oxide semiconductor film 111. The region in the signal line 109_n, which serves as the source electrode, overlaps with at least the oxide semiconductor film 111. The region in the conductive film 113, which serves as the drain electrode, overlaps with at least the oxide semiconductor film 111. Note that the scan line 107_m is represented as it is even when it indicates the gate electrode of the transistor 103, the signal line 109_n is represented as it is even when it indicates the source electrode of the transistor 103, and the conductive film 113 is represented as it is even when it indicates the drain electrode of the transistor 103 in the following description.

The capacitor 105 is provided in a region surrounded by the scan line 107_m, the scan line 107_m−1, the signal line 109_n, and the signal line 109n+1. The capacitor 105 includes the oxide semiconductor film 119, the pixel electrode 121 having a light-transmitting property, and the insulating film (not illustrated in FIG. 5) having a light-transmitting property which is included in the transistor 103, and has a light-transmitting property. Further, since the oxide semiconductor film 119 is in contact with the scan line 107_m−1 through an opening 123, the capacitor 105 is electrically connected to the scan line 107_m−1. That is, the scan line 107_m−1 also serves as the capacitor line of the capacitor 105. Accordingly, the capacitor 105 can operate without an additional capacitor line in the pixel 101(m, n).

Capacitance of a capacitor is changed depending on the overlapped area of a pair of electrodes. When the size of a pixel is reduced to increase the resolution, the size of a capacitor is also reduced; thus, capacitance of the capacitor is reduced. As a result, a liquid crystal element might not be operated sufficiently. Since the capacitor 105 transmits light, the capacitor 105 can be formed in the entire operation area of the liquid crystal element 108, and thus the capacitor 105 can be formed large (in a large area) as much as possible in the pixel. As long as the capacitance that is sufficient to operate the liquid crystal element 108 can be ensured, the pixel density can be increased to have a high resolution.

Here, the characteristics of a transistor including an oxide semiconductor are described. Note that the transistor including an oxide semiconductor is an n-channel transistor. Oxygen vacancies in an oxide semiconductor might generate carriers, which might lower the electric characteristics and the reliability of the transistor. For example, in some cases, the threshold voltage of the transistor is shifted in the negative direction, and drain current flows when the gate voltage is 0 V. The characteristics of a transistor in which drain current flows when the gate voltage is 0 V is referred to as a normally-on characteristics, whereas the characteristics of a transistor in which substantially no drain current flows when the gate voltage is 0 V is referred to as a normally-off characteristics.

In view of the above, it is preferable that defects typified by oxygen vacancies in an oxide semiconductor film be reduced as much as possible when the oxide semiconductor film is used. For example, the spin density of the oxide semiconductor film (the density of defects in the oxide semiconductor film) at a g-value of 1.93 measured in electron spin resonance in which a magnetic field is applied in parallel to the film surface is preferably reduced to be lower than or equal to the lower limit of detection of a measurement instrument. When the defects typified by the oxygen vacancies in the oxide semiconductor film are reduced as much as possible, the transistor can be prevented from being normally on, leading to improvement in the electric characteristics and the reliability of a semiconductor device.

The shift of the threshold voltage of a transistor in the negative direction is caused in some cases by hydrogen (including a hydrogen compound such as water) contained in an oxide semiconductor film as well as by oxygen vacancies. Hydrogen contained in the oxide semiconductor film is reacted with oxygen bonded to a metal atom to be water, and in addition, vacancies (also referred to as oxygen vacancies) are formed in a lattice from which oxygen is released (or a portion from which oxygen is released). In addition, part of hydrogen reacts with oxygen, which causes generation of electrons serving as carriers. Thus, a transistor including an oxide semiconductor film which contains hydrogen is likely to have normally-on characteristics.

Accordingly, it is preferable that hydrogen be reduced as much as possible in the oxide semiconductor film 111 of the transistor 103. Specifically, the hydrogen concentration of the oxide semiconductor film 111, which is measured by secondary ion mass spectrometry (SIMS), is lower than $5 \times 10^{18}$ atoms/cm$^3$, preferably lower than or equal to $1 \times 10^{18}$ atoms/cm$^3$, more preferably lower than or equal to $5 \times 10^{17}$ atoms/cm$^3$, further preferably lower than or equal to $1 \times 10^{16}$ atoms/cm$^3$.

Further, the concentration of alkali metals or alkaline earth metals in the oxide semiconductor film 111, which is measured by SIMS, is lower than or equal to $1 \times 10^{18}$ atoms/cm$^3$, preferably lower than or equal to $2 \times 10^{16}$ atoms/cm$^3$. When an alkali metal and an alkaline earth metal are bonded to an oxide semiconductor, a carrier might be generated, which might cause an increase in the off-state current of the transistor 103.

Further, when nitrogen is contained in the oxide semiconductor film, electrons serving as carriers are generated and the carrier density increases, so that the oxide semiconductor film easily becomes n-type. As a result, a transistor including the oxide semiconductor film which contains nitrogen is likely to have normally-on characteristics. For this reason, nitrogen in the oxide semiconductor film 111 is preferably reduced as much as possible; the nitrogen concentration is preferably lower than or equal to $5 \times 10^{18}$ atoms/cm$^3$, for example.

Further, when a Group 14 element such as silicon and carbon is contained in the oxide semiconductor film, electrons serving as carriers are generated and the carrier density increases, so that the oxide semiconductor film easily becomes n-type. Thus, in the transistor 103 including the oxide semiconductor film 111, in particular, at the interface between a gate insulating film 127 (not illustrated in FIG. 5) and the oxide semiconductor film 111, the silicon concentration which is measured by SIMS is lower than or equal to $3 \times 10^{18}$ atoms/cm$^3$, preferably lower than or equal to $3 \times 10^{17}$ atoms/cm$^3$. Note that at the interface, the carbon concentration measured by SIMS is lower than or equal to $3 \times 10^{18}$ atoms/cm$^3$, preferably lower than or equal to $3 \times 10^{17}$ atoms/cm$^3$.

As described above, when the highly purified oxide semiconductor film 111 in which impurities (such as hydrogen, nitrogen, silicon, carbon, an alkali metal, or an alkaline earth metal) are reduced as much as possible is used, the transistor 103 can be prevented from being normally on, so that the off-state current of the transistor 103 can be significantly reduced. Thus, one embodiment of the present invention is a semiconductor device having favorable electric characteristics and high reliability. Note that the highly purified oxide semiconductor can be regarded as an intrinsic semiconductor or a substantially intrinsic semiconductor.

Note that various experiments can prove low off-state current of a transistor including a highly purified oxide semiconductor film. For example, even when an element has a channel width W of $1\times10^6$ µm and a channel length L of 10 µm, the off-state current can be lower than or equal to the measurement limit of a semiconductor parameter analyzer, i.e., lower than or equal to $1\times10^{-13}$ A, at voltages (drain voltages) between a source and a drain of 1 V to 10 V. In that case, it is found that the off-state current corresponding to a value obtained by dividing the off-state current by the channel width of the transistor is lower than or equal to 100 zA/µm. Further, the off-state current was measured with the use of a circuit in which a capacitor and a transistor are connected to each other and charge that flows in or out from the capacitor is controlled by the transistor. In the measurement, a purified oxide semiconductor film has been used for a channel formation region of the transistor, and the off-state current of the transistor has been measured from change in the amount of charge of the capacitor per unit time. As a result, it is found that in the case where the voltage between the source electrode and the drain electrode of the transistor is 3 V, lower off-state current of several tens of yoctoamperes per micrometer (yA/µm) can be obtained. Accordingly, the transistor including a highly purified oxide semiconductor film has extremely low off-state current.

Figure 6:
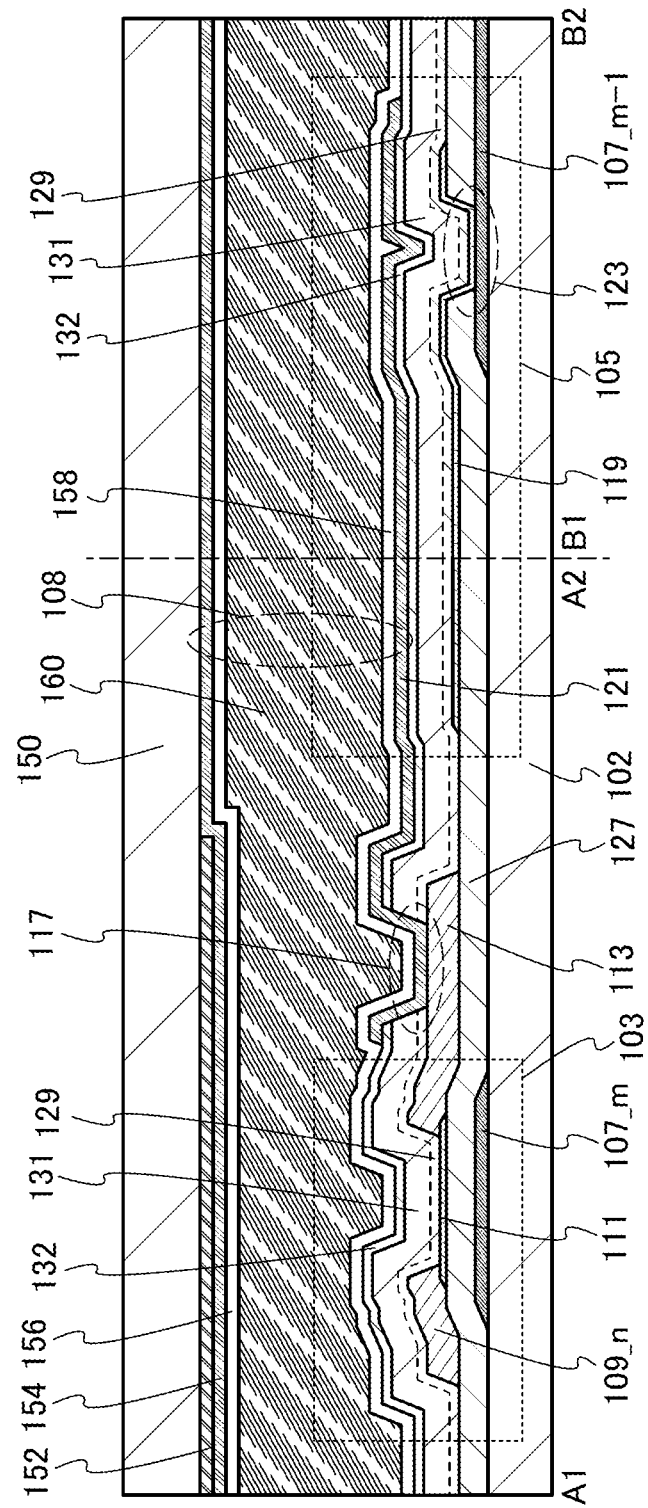
FIG. 6 is a cross-sectional view illustrating a semiconductor device.

A cross-sectional view taken along dashed-dotted line A1-A2 and dashed-dotted line B1-B2 in FIG. 5 is illustrated in FIG. 6.

A cross-sectional structure along dashed-dotted line A1-A2 and dashed-dotted line B1-B2 is as follows. Over a substrate 102, the scan line 107_m and the scan line 107_m−1 each including a region serving as the gate electrode are provided. The gate insulating film 127 is provided over the scan line 107_m−1 and the scan line 107_m. The oxide semiconductor film 111 is provided over the gate insulating film 127 to overlap with the scan line 107_m. The opening 123 which reaches the scan line 107_m−1 is provided in a portion of the gate insulating film 127, which is in contact with the scan line 107_m−1. The oxide semiconductor film 119 is provided over the gate insulating film 127 and in the opening 123. The signal line 109_n including a region serving as the source electrode and the conductive film 113 including a region serving as the drain electrode are each provided over the oxide semiconductor film 111 and the gate insulating film 127. An insulating film 129, an insulating film 131, and an insulating film 132 serving as protective insulating films of the transistor 103 are provided over the gate insulating film 127, the signal line 109_n, the oxide semiconductor film 111, the conductive film 113, and the oxide semiconductor film 119. The opening 117 which reaches the conductive film 113 is provided in the insulating film 129, the insulating film 131, and the insulating film 132, and the pixel electrode 121 is provided in the opening 117. Note that a base insulating film may be provided between the substrate 102, and the scan lines 107_m−1 and 107_m and the gate insulating film 127.

The cross-sectional structure of the liquid crystal element 108 is as follows. A light-shielding film 152 is provided on a surface of a substrate 150, which faces the substrate 102 to overlap with at least the transistor 103. A counter electrode 154 which is a conductive film having a light-transmitting property is provided to cover the light-shielding film 152. An alignment film 156 is provided to cover the counter electrode. On the substrate 102 side, an alignment film 158 is provided over the insulating film 132 and the pixel electrode 121. A liquid crystal 160 is provided in contact with the alignment film 156 and the alignment film 158, and is sandwiched between the substrate 102 and the substrate 150.

Note that in the case where the semiconductor device of one embodiment of the present invention is a liquid crystal display device, a light source such as a backlight; an optical member (an optical substrate) such as a polarizing plate, which is provided on the substrate 102 side and the substrate 150 side; a sealant for fixing the substrate 102 and the substrate 150; and the like are needed. These components will be described later.

As described above, in the capacitor 105 described in this embodiment, the oxide semiconductor film 119 serves as one of a pair of electrodes, the pixel electrode 121 serves as the other of the pair of electrodes, and the insulating films 129, 131, and 132 serve as a dielectric film provided between the pair of electrodes.

The details of the components of the above structure will be described below.

There is no particular limitation on the property of a material and the like of the substrate 102 as long as the material has heat resistance enough to withstand at least heat treatment performed in a formation process of the semiconductor device. Examples of the substrate are a glass substrate, a ceramic substrate, and a plastic substrate, and as the glass substrate, an alkali-free glass substrate such as a barium borosilicate glass substrate, an aluminoborosilicate glass substrate, or an aluminosilicate glass substrate is preferably used. Alternatively, a non-light-transmitting substrate such as a stainless alloy substrate may be used, in which case a surface of the substrate is preferably provided with an insulating film. As the substrate 102, any of the following may alternatively be used: a quartz substrate, a sapphire substrate, a single crystal semiconductor substrate, a polycrystalline semiconductor substrate, a compound semiconductor substrate, and a silicon on insulator (SOI) substrate. In the case where the semiconductor device of one embodiment of the present invention is a transmissive liquid crystal display device, a substrate having a light-transmitting property is used as the substrate 102.

The scan lines 107_m−1 and 107_m, through which a large amount of current flows, are preferably formed to have a single-layer structure or a stacked-layer structure using a metal film typified by any of metal materials such as molybdenum (Mo), titanium (Ti), tungsten (W), tantalum (Ta), aluminum (Al), copper (Cu), chromium (Cr), neodymium (Nd), or scandium (Sc), or an alloy material which contains any of these materials as its main component.

Examples of the scan lines 107_m−1 and 107_m are a single-layer structure using aluminum containing silicon, a two-layer structure in which titanium is stacked over aluminum, a two-layer structure in which titanium is stacked over a titanium nitride, a two-layer structure in which tungsten is stacked over a titanium nitride, a two-layer structure in which tungsten is stacked over a tantalum nitride, a two-layer structure in which copper is stacked over a copper-magnesium-aluminum alloy, and a three-layer structure in which titanium nitride, copper, and tungsten are stacked in this order.

As a material of the scan lines 107_m−1 and 107_m, a light-transmitting conductive material that can be used for the pixel electrode 121 can be used. Note that in the case where the semiconductor device of one embodiment of the present invention is a reflective display device, a non-light-transmitting conductive material (e.g., a metal material) can be used for the pixel electrode 121. In that case, similarly, a non-light-transmitting substrate can be used as the substrate 102.

Further, as the material of the scan lines 107_m−1 and 107_m, a metal oxide containing nitrogen, specifically, an In—Ga—Zn-based oxide containing nitrogen, an In—Sn-based oxide containing nitrogen, an In—Ga-based oxide containing nitrogen, an In—Zn-based oxide containing nitrogen, a Sn-based oxide containing nitrogen, an In-based oxide containing nitrogen, or a metal nitride (InN, SnN, or the like) can be used. These materials each have a work function higher than or equal to 5 eV (electron volts). The use of a metal oxide containing nitrogen for the scan line (the gate electrode) allows the threshold voltage of the transistor 103 to be shifted in the positive direction, i.e., the transistor can have normally-off characteristics. For example, in the case where an In—Ga—Zn-based oxide containing nitrogen is used, an In—Ga—Zn-based oxide having at least a higher nitrogen concentration than the oxide semiconductor film 111, specifically an In—Ga—Zn-based oxide having a nitrogen concentration of 7 at. % or higher can be used.

It is preferable to use aluminum or copper which is a low-resistant material for the scan lines 107_m−1 and 107_m. When aluminum or copper is used, signal delay is reduced, so that the display quality can be improved. Note that aluminum has low heat resistance; therefore, defects due to a hillock, a whisker, or migration tend to be caused. To prevent migration of aluminum, a stacked-layer structure including aluminum and a metal material having a higher melting point than aluminum, such as molybdenum, titanium, or tungsten, is preferably used. When copper is used, in order to prevent a defect due to migration and diffusion of copper elements, a stacked-layer structure including copper and a metal material having a higher melting point than copper, such as molybdenum, titanium, or tungsten, is preferably used.

As illustrated in FIG. 5 and FIG. 6, the scan line 107_m (the scan line 107_m−1) is preferably provided so that the oxide semiconductor film 111 can be provided in a region overlapping with the scan line 107_m. It is preferable that the scan line 107_m protrude to a region where the oxide semiconductor film 111 is provided and that the oxide semiconductor film 111 be provided in the region overlapping with the scan line 107_m, as illustrated in FIG. 5. In this manner, light entering from a surface (the rear surface) of the substrate 102, which is opposite to a surface provided with the scan line 107_m, (in a liquid crystal display device, such light corresponds to light from a light source such as a backlight) is shielded by the scan line 107_m; thus, variation or degradation of the electric characteristics of the transistor 103 (e.g., threshold voltage) can be suppressed.

The gate insulating film 127 is provided to have a single-layer structure or a stacked-layer structure using, for example, one or more of insulating materials such as silicon oxide, silicon oxynitride, silicon nitride oxide, silicon nitride, aluminum oxide, hafnium oxide, gallium oxide, or Ga—Zn-based metal oxide. Note that in order to improve the characteristics of the interface between the gate insulating film 127 and the oxide semiconductor film 111, a region in the gate insulating film 127, which is in contact with at least the oxide semiconductor film 111, preferably includes an oxide insulating film.

It is possible to prevent outward diffusion of oxygen contained in the oxide semiconductor film 111 and entry of hydrogen, water, or the like into the oxide semiconductor film 111 from the outside by providing an insulating film having a barrier property against oxygen, hydrogen, water, and the like as the gate insulating film 127. As for the insulating film having a barrier property against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and a silicon nitride film can be given as examples.

The gate insulating film 127 may be formed using a high-k material such as hafnium silicate (HfSiO$_x$), hafnium silicate containing nitrogen (HfSi$_x$O$_y$N$_z$), hafnium aluminate containing nitrogen (HfAl$_x$O$_y$N$_z$), hafnium oxide, or yttrium oxide, so that gate leakage current of the transistor 103 can be reduced.

The gate insulating film 127 preferably has the following stacked-layer structure. In the structure, a silicon nitride film having fewer defects is provided as a first silicon nitride film, a silicon nitride film from which small amounts of hydrogen and ammonia are released is provided as a second silicon nitride film over the first silicon nitride film, and any of oxide insulating films applicable to the gate insulating film 127 is provided over the second silicon nitride film.

In the second silicon nitride film, in thermal desorption spectrometry, the number of released hydrogen molecules is preferably less than $5 \times 10^{21}$ molecules/cm$^3$, more preferably less than or equal to $3 \times 10^{21}$ molecules/cm$^3$, further preferably less than or equal to $1 \times 10^{21}$ molecules/cm$^3$, and the number of released ammonia molecules is preferably less than $1 \times 10^{22}$ molecules/cm$^3$, more preferably less than or equal to $5 \times 10^{21}$ molecules/cm$^3$, further preferably less than or equal to $1 \times 10^{21}$ molecules/cm$^3$. The first silicon nitride film and the second silicon nitride film are used as part of the gate insulating film 127, so that a gate insulating film with a small number of defects and small amounts of released hydrogen and released ammonia can be formed as the gate insulating film 127. Accordingly, it is possible to reduce the amount of hydrogen and nitrogen in the gate insulating film 127, which are transferred to the oxide semiconductor film 111.

In the case where the trap level (also referred to as interface state) is present at the interface between an oxide semiconductor film and a gate insulating film or in the gate insulating film in a transistor including an oxide semiconductor, change of the threshold voltage typified by change of the threshold voltage in the negative direction in the transistor and an increase in the subthreshold swing (S value) showing a gate voltage needed for changing the drain current by one digit when the transistor is turned on are caused. Thus, there is a problem in that electric characteristics vary among the transistors. For this reason, when, as the gate insulating film 127, the silicon nitride film with a small number of defects is used, and the oxide insulating film is provided in a region of the gate insulating film 127, which is in contact with the oxide semiconductor film 111, a negative shift of the threshold voltage and an increase of an S value can be suppressed.

The thickness of the gate insulating film 127 is greater than or equal to 5 nm and less than or equal to 400 nm, preferably greater than or equal to 10 nm and less than or equal to 300 nm, more preferably greater than or equal to 50 nm and less than or equal to 250 nm.

The oxide semiconductor film 111 can have an amorphous crystal structure, a single crystal structure, or a polycrystalline structure. The thickness of the oxide semiconductor film 111 is greater than or equal to 1 nm and less than or equal to 100 nm, preferably greater than or equal to 1 nm and less than or equal to 50 nm, more preferably greater than or equal to 1 nm and less than or equal to 30 nm, further preferably greater than or equal to 3 nm and less than or equal to 20 nm.

Further, an oxide semiconductor that can be used for the oxide semiconductor film 111 has an energy gap of greater than or equal to 2 eV, preferably greater than or equal to 2.5 eV, more preferably greater than or equal to 3 eV. The off-state current of the transistor 103 can be reduced by using an oxide semiconductor with a wide energy gap in this manner.

An oxide semiconductor containing at least indium (In) or zinc (Zn) is preferably used for the oxide semiconductor film 111. Alternatively, both In and Zn are preferably contained. To reduce variations in electric characteristics of the transistors including the oxide semiconductor, the oxide semiconductor preferably contains one or more of stabilizers in addition to In and Zn.

As for stabilizers, gallium (Ga), tin (Sn), hafnium (Hf), aluminum (Al), and zirconium (Zr) can be given as examples. As another stabilizer, lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) can be given as examples.

As the oxide semiconductor that can be used for the oxide semiconductor film 111, for example, the following can be used: indium oxide, tin oxide, or zinc oxide; an oxide containing two kinds of metals such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; an oxide containing three kinds of metals such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or an oxide containing four kinds of metals such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-metal oxide, or an In—Hf—Al—Zn-based oxide.

Here, an In—Ga—Zn-based oxide means an oxide containing In, Ga, and Zn as its main components and there is no particular limitation on the ratio of In, Ga, and Zn. The In—Ga—Zn-based oxide may contain a metal element other than In, Ga, and Zn.

Alternatively, a material represented by $InMO_3(ZnO)_m$ ($m>0$ is satisfied) may be used as the oxide semiconductor. Note that M represents one or more metal elements selected from Ga, Fe, Mn, and Co, or the above element as a stabilizer.

For example, it is possible to use an In—Ga—Zn-based metal oxide containing In, Ga, and Zn at an atomic ratio of 1:1:1 ($=1/3:1/3:1/3$), 2:2:1 ($=2/5:2/5:1/5$), or 3:1:2 ($=1/2:1/6:1/3$). Alternatively, an In—Sn—Zn-based metal oxide containing In, Sn, and Zn at an atomic ratio of 1:1:1 ($=1/3:1/3:1/3$), 2:1:3 ($=1/3:1/6:1/2$), or 2:1:5 ($=1/4:1/8:5/8$) may be used. Note that a proportion of each atom in the atomic ratio of the metal elements varies within a range of ±20% as an error.

However, the atomic ratio is not limited to those described above, and a material having the appropriate atomic ratio may be used depending on needed semiconductor characteristics and electric characteristics (e.g., field-effect mobility and threshold voltage). To obtain needed semiconductor characteristics, it is preferable that the carrier density, the impurity concentration, the defect density, the atomic ratio of a metal element and oxygen, the interatomic distance, the density, and the like be set to be appropriate. For example, high field-effect mobility can be obtained relatively easily in the case where the In—Sn—Zn-based metal oxide is used. However, the field-effect mobility can be increased by reducing the defect density in the bulk also in the case where the In—Ga—Zn-based metal oxide is used.

For the oxide semiconductor film 119, an oxide semiconductor that can be used for the oxide semiconductor film 111 can be used. The oxide semiconductor film 119 can be formed concurrently with the oxide semiconductor film 111 and thus contains a metal element of an oxide semiconductor included in the oxide semiconductor film 111.

The insulating film 129, the insulating film 131, and the insulating film 132 serving as the protective insulating films of the transistor 103 and as the dielectric films of the capacitor 105 are insulating films each formed using a material that can be used for the gate insulating film 127. It is particularly preferable that the insulating films 129 and 131 be oxide insulating films and the insulating film 132 be a nitride insulating film. Further, the use of a nitride insulating film as the insulating film 132 can suppress entry of impurities such as hydrogen and water into the transistor 103 (in particular, the oxide semiconductor film 111) from the outside. Note that the insulating film 129 is not necessarily provided.

In addition, one or both of the insulating film 129 and the insulating film 131 are each preferably an oxide insulating film containing oxygen at a higher proportion than oxygen in the stoichiometric composition. In that case, oxygen can be prevented from being released from the oxide semiconductor film 111, and the oxygen contained in an oxygen excess region can be transferred to the oxide semiconductor film 111 to compensate oxygen vacancies. For example, when an oxide insulating film having the following feature is used, the oxygen vacancies in the oxide semiconductor film 111 can be compensated. The feature of the oxide insulating film is that the number of oxygen molecules released from the oxide insulating film is greater than or equal to $1.0\times10^{18}$ molecules/cm$^3$ when measured by thermal desorption spectroscopy (hereinafter referred to as TDS spectroscopy). Note that an oxide insulating film partly including a region which contains oxygen at a higher proportion than oxygen in the stoichiometric composition (oxygen excess region) may be used as one or both of the insulating film 129 and the insulating film 131. When such an oxygen excess region is present in a region overlapping with at least the oxide semiconductor film 111, oxygen is prevented from being released from the oxide semiconductor film 111 and the oxygen contained in the oxygen excess region can be transferred to the oxide semiconductor film 111 to compensate oxygen vacancies.

In the case where the insulating film 131 is an oxide insulating film containing oxygen at a higher proportion than oxygen in the stoichiometric composition, the insulating film 129 is preferably an oxide insulating film which transmits oxygen. Oxygen which enters the insulating film 129 from the outside does not completely transmit the insulating film 129 and transfer and part thereof remains in the insulating film 129. Further, there is oxygen which is contained in the insulating film 129 from the first and is transferred from the insulating film 129 to the outside. Thus, the insulating film 129 is preferably an oxide insulating film having a high diffusion coefficient of oxygen.

Since the insulating film 129 is in contact with the oxide semiconductor film 111, the insulating film 129 is preferably an oxide insulating film through which oxygen is transmitted and which is capable of reducing the interface state density at the interface with the oxide semiconductor film 111. For example, the insulating film 129 is preferably an oxide insulating film having a lower defect density than the insulating film 131. Specifically, the spin density of the insulating film 129 at a g-value of 2.001 (E'-center), which is measured by electron spin resonance, is lower than or equal to $3.0\times10^{17}$ spins/cm$^3$, preferably lower than or equal to $5.0\times10^{16}$ spins/cm$^3$. Note that the spin density at a g-value of 2.001, which is measured by electron spin resonance, corresponds to the number of dangling bonds contained in the insulating film 129.

The thickness of the insulating film 129 can be greater than or equal to 5 nm and less than or equal to 150 nm, preferably greater than or equal to 5 nm and less than or equal to 50 nm, more preferably greater than or equal to 10 nm and less than or equal to 30 nm. The thickness of the insulating film 131 can be greater than or equal to 30 nm and less than or equal to 500 nm, preferably greater than or equal to 150 nm and less than or equal to 400 nm.

When an oxide insulating film which transmits oxygen and which is capable of reducing the interface state density between the oxide semiconductor film 111 and the oxide insulating film is used as the insulating film 129 provided over the oxide semiconductor film 111, and an oxide insulating film which includes an oxygen excess region or an oxide insulating film containing oxygen at a higher proportion than oxygen in the stoichiometric composition is used as the insulating film 131, oxygen can be easily supplied to the oxide semiconductor film 111, the release of oxygen from the oxide semiconductor film 111 can be prevented, and the oxygen contained in the insulating film 131 can be transferred to the oxide semiconductor film 111 to compensate the oxygen vacancies in the oxide semiconductor film 111. Thus, the transistor 103 can be prevented from being normally on.

In the case where a nitrogen-containing oxide insulating film, such as a silicon oxynitride film or a silicon nitride oxide film, is used as one or both of the insulating film 129 and the insulating film 131, the nitrogen concentration measured by SIMS is greater than or equal to the lower limit of detection by SIMS and less than $3\times10^{20}$ atoms/cm$^3$, preferably greater than or equal to $1\times10^{18}$ atoms/cm$^3$ and less than or equal to $1\times10^{20}$ atoms/cm$^3$. In that case, the amount of nitrogen which is transferred to the oxide semiconductor film 111 included in the transistor 103 can be reduced and the number of defects in the nitrogen-containing oxide insulating film itself can be reduced.

In the case where a nitride insulating film is used as the insulating film 132, an insulating film having a barrier property against nitrogen is preferably used as one or both of the insulating film 129 and the insulating film 131. For example, a dense oxide insulating film can have a barrier property against nitrogen. Specifically, it is preferable to use an oxide insulating film which can be etched at a rate of less than or equal to 10 nm per minute when the temperature is 25° C. and 0.5 wt % of fluoric acid is used.

As the insulating film 132, a nitride insulating film with a low hydrogen content can be provided. The nitride insulating film is as follows, for example: the number of hydrogen molecules released from the nitride insulating film is less than $5.0\times10^{21}$/cm$^3$, preferably less than $3.0\times10^{21}$/cm$^3$, more preferably less than $1.0\times10^{21}$/cm$^3$ when measured by TDS spectroscopy.

Further, the nitride insulating film has excellent step coverage and thus can be advantageously used as a protective insulating film of the transistor 103.

The insulating film 132 has a thickness with which entry of impurities such as hydrogen and water from the outside can be suppressed. For example, the thickness can be greater than or equal to 50 nm and less than or equal to 200 nm, preferably greater than or equal to 50 nm and less than or equal to 150 nm, and more preferably greater than or equal to 50 nm and less than or equal to 100 nm.

The use of a nitride insulating film as the insulating film 132 provided over the insulating film 131 can suppress entry of impurities such as hydrogen and water into the oxide semiconductor film 111 and the oxide semiconductor film 119 from the outside. Moreover, the use of a nitride insulating film with a low hydrogen content as the insulating film 132 can suppress variations in electric characteristics of the transistor 103.

When a silicon oxide film is provided between the insulating film 131 and the insulating film 132 and the nitride insulating film is used as the insulating film 132, entry of impurities such as hydrogen and water into the oxide semiconductor film 111 and the oxide semiconductor film 119 from the outside can be further suppressed.

Alternatively, a silicon oxide film formed by a CVD method using an organosilane gas may be provided between the insulating film 131 and the insulating film 132. The silicon oxide film has excellent step coverage and thus can be advantageously used as a protective insulating film of the transistor 103. The silicon oxide film can be formed to a thickness of 300 nm to 600 nm inclusive. As the organosilane gas, any of the following silicon-containing compound can be used: tetraethyl orthosilicate (TEOS) (chemical formula: $Si(OC_2H_5)_4$); tetramethylsilane (TMS) (chemical formula: $Si(CH_3)_4$); tetramethylcyclotetrasiloxane (TMCTS); octamethylcyclotetrasiloxane (OMCTS); hexamethyldisilazane (HMDS); triethoxysilane ($SiH(OC_2H_5)_3$); trisdimethylaminosilane ($SiH(N(CH_3)_2)_3$); or the like.

The pixel electrode 121 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

For the substrate 150, a material that can be used for the substrate 102 can be used.

The light-shielding film 152 is also referred to as a black matrix and is provided in a liquid crystal display device to suppress leakage of light of a light source such as a backlight or suppress contrast reduction due to mixing of colors when color display is performed using a color filter, for example. A light-shielding film which is generally used can be used as the light-shielding film 152. A metal and an organic resin including a pigment can be given as examples of a light-shielding material. Alternatively, the light-shielding film 152 may be provided in a region outside the pixel portion 100, such as over the scan line driver circuit 104 and over the signal line driver circuit 106 (see FIG. 1A), as well as in a region which overlaps with the transistor 103.

Further, a coloring film which transmits light with a predetermined wavelength may be provided between light-shielding films provided in each pixel in the pixel portion 100. In addition, an overcoat film may be provided between the counter electrode, and the light-shielding films and the coloring film.

For the counter electrode 154, materials that can be used for the pixel electrode 121 can be used as appropriate.

The alignment films 156 and 158 can be formed using a general-purpose material such as polyamide.

For the liquid crystal 160, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on a condition.

Alternatively, a liquid crystal exhibiting a blue phase for which an alignment film is unnecessary may be used for the liquid crystal 160. A blue phase is one of liquid crystal phases, which is generated just before a cholesteric phase changes into an isotropic phase while temperature of cholesteric liquid crystal is raised. Since the blue phase appears only in a narrow temperature range, a liquid crystal composition in which a chiral material is mixed is used in order to improve the temperature range. Note that the alignment film is formed using an organic resin containing hydrogen, water, or the like, which might degrade the electric characteristics of the transistor in the semiconductor device of one embodiment of the present invention. In view of the above, the use of liquid crystal which exhibits a blue phase for the liquid crystal 160 enables manufacture of the semiconductor device of one embodiment of the present invention without an organic resin, so that the semiconductor device can be highly reliable.

Note that the structure of the liquid crystal element 108 can be changed as appropriate, as follows, in accordance with the display mode of the liquid crystal element 108: the shapes of the pixel electrode 121 and the counter electrode 154 are changed, or a protrusion referred to as a rib is formed.

Further, in the semiconductor device of one embodiment of the present invention, a region of the pixel 101, in which the light-shielding film 152 is provided, can be reduced or eliminated in the following manner: a polarization axis of a polarizing member (a polarizing substrate) is provided to be in parallel to the light-shielding film 152, and the display mode of the semiconductor device is set to a normally-black mode in which the liquid crystal element 108 does not transmit light from a light source such as a backlight with no voltage applied. As a result, the aperture ratio of the pixel 101 can be improved even in the case where the size of one pixel is small as in a display device having high pixel density. Note that the aperture ratio can be further increased by using a light-transmitting capacitor.

<Method for Manufacturing Semiconductor Device>

A method for manufacturing the above semiconductor device is described with reference to FIGS. 7A and 7B and FIGS. 8A and 8B.

First, the scan line 107_$m$–1 and the scan line 107_$m$ are formed over the substrate 102. An insulating film which is to be processed into the gate insulating film 127 is formed so as to cover the scan line 107_$m$–1 and the scan line 107_$m$. The opening 123 is formed in a region of the insulating film, which is in contact with the scan line 107_$m$–1, so that the gate insulating film 127 is formed. The oxide semiconductor film 111 is formed so as to overlap with the scan line 107_$m$. The oxide semiconductor film 119 is formed over the gate insulating film 127 and in the opening 123 so as to overlap with a region on which the pixel electrode 121 to be formed (see FIG. 7A).

The scan lines 107_$m$–1 and 107_$m$ can be formed in such a manner that a conductive film is formed using any of the materials given above, a mask is formed over the conductive film, and the conductive film is processed using the mask. The conductive film can be formed by any of a variety of film formation methods such as an evaporation method, a CVD method, a sputtering method, and a spin coating method. Nota that there is no particular limitation on the thickness of the conductive film, and the thickness of the conductive film can be determined in consideration of time needed for the formation, desired resistivity, or the like. As the mask, a resist mask formed through a photolithography process can be used. The conductive film can be processed by one or both of dry etching and wet etching.

The insulating film which is to be processed into the gate insulating film 127 can be formed using a material that can be used for the gate insulating film 127 by any of a variety of film formation methods such as a CVD method and a sputtering method. In the case where gallium oxide is used for the gate insulating film 127, the insulating film can be formed by a metal organic chemical vapor deposition (MOCVD) method.

The opening 123 can be formed as follows: a mask is formed over the insulating film, and the insulating film is processed using the mask. Note that the mask can be formed and the processing can be performed with reference to the formation process of the scan line 107_$m$–1 and the scan line 107_$m$.

The oxide semiconductor film 111 and the oxide semiconductor film 119 can be formed in such a manner that any of the oxide semiconductor films given above is formed, a mask is formed over the formed oxide semiconductor film, and the oxide semiconductor film is processed using the mask. The oxide semiconductor film can be formed by a sputtering method, a coating method, a pulsed laser deposition method, a laser ablation method, or the like. By employing a printing method, the oxide semiconductor film 111 and the oxide semiconductor film 119 subjected to element isolation can be formed directly on the gate insulating film 127. As a power supply device for generating plasma in the case of forming the oxide semiconductor film by a sputtering method, an RF power supply device, an AC power supply device, a DC power supply device, or the like can be used as appropriate. As a sputtering gas, an atmosphere of a rare gas (argon as a typical example), oxygen, or a mixed gas of a rare gas and oxygen is used as appropriate. In the case of the mixed atmosphere of a rare gas and oxygen, the proportion of oxygen is preferably higher than that of a rare gas. Note that the target may be selected as appropriate depending on the composition of the oxide semiconductor film to be formed. As the mask, a resist mask formed through a photolithography process can be used. The oxide semiconductor film can be processed by one or both of dry etching and wet etching. The etching conditions (e.g., an etching gas or an etching solution, etching time, and temperature) are set as appropriate depending on the material so that the oxide semiconductor film 111 and the oxide semiconductor film 119 can be etched to have desired shapes.

Heat treatment is preferably performed after formation of the oxide semiconductor films 111 and 119 to dehydrate or dehydrogenate the oxide semiconductor films 111 and 119. The heat treatment is performed typically at a temperature higher than or equal to 150° C. and lower than the strain point of the substrate, preferably higher than or equal to 200° C. and lower than or equal to 450° C., more preferably higher than or equal to 300° C. and lower than or equal to 450° C. Note that the heat treatment may be performed on the oxide semiconductor film which has not been processed into the oxide semiconductor films 111 and 119.

In the heat treatment, a heat treatment apparatus is not limited to an electric furnace; the heat treatment apparatus can be an apparatus that heats an object using thermal conduction or thermal radiation given by a medium such as a heated gas or the like. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

The heat treatment may be performed under an atmosphere of nitrogen, oxygen, ultra-dry air (air in which a water content is less than or equal to 20 ppm, preferably less than or equal to 1 ppm, more preferably less than or equal to 10 ppb), or a rare gas (e.g., argon or helium). The atmosphere of nitrogen, oxygen, ultra-dry air, or a rare gas preferably does not contain hydrogen, water, and the like. Alternatively, the heat treatment may be performed first under an inert gas atmosphere, and then under an oxygen atmosphere. Note that the treatment time is 3 minutes to 24 hours.

In the case where a base insulating film is provided between the substrate 102, and the scan line 107_$m$–1, the scan line 107_$m$, and the gate insulating film 127, the base insulating film can be formed using a film of any of the following: silicon oxide, silicon oxynitride, silicon nitride, silicon nitride oxide, gallium oxide, hafnium oxide, yttrium oxide, aluminum oxide, aluminum oxynitride, and the like. Note that when the base insulating film is formed using silicon nitride, gallium oxide, hafnium oxide, yttrium oxide, or aluminum oxide, it is possible to suppress diffusion of impurities, typified by an alkali metal, water, and hydrogen into the oxide semiconductor film 111 from the substrate 102. The base insulating film can be formed by a sputtering method or a CVD method.

Figure 7A:
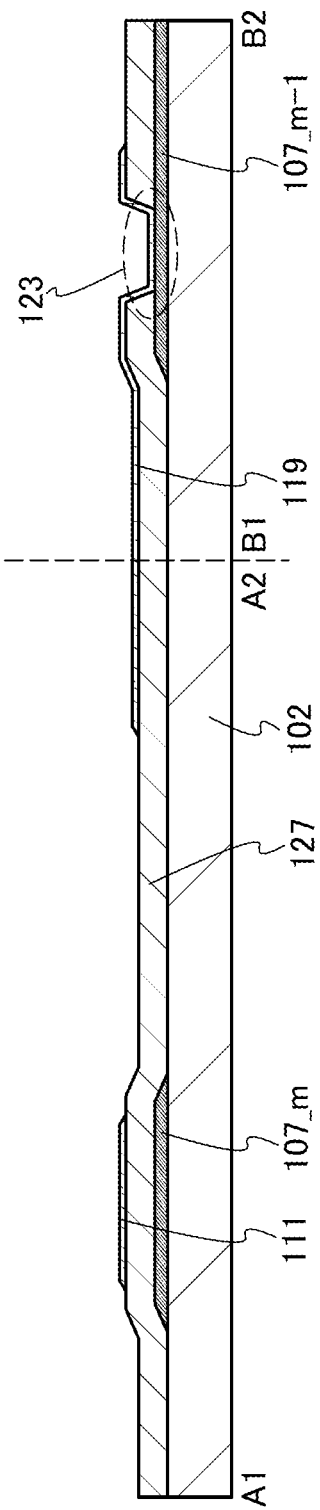
FIGS. 7A and 7B are cross-sectional views illustrating a method for manufacturing a semiconductor device.
Figure 7B:
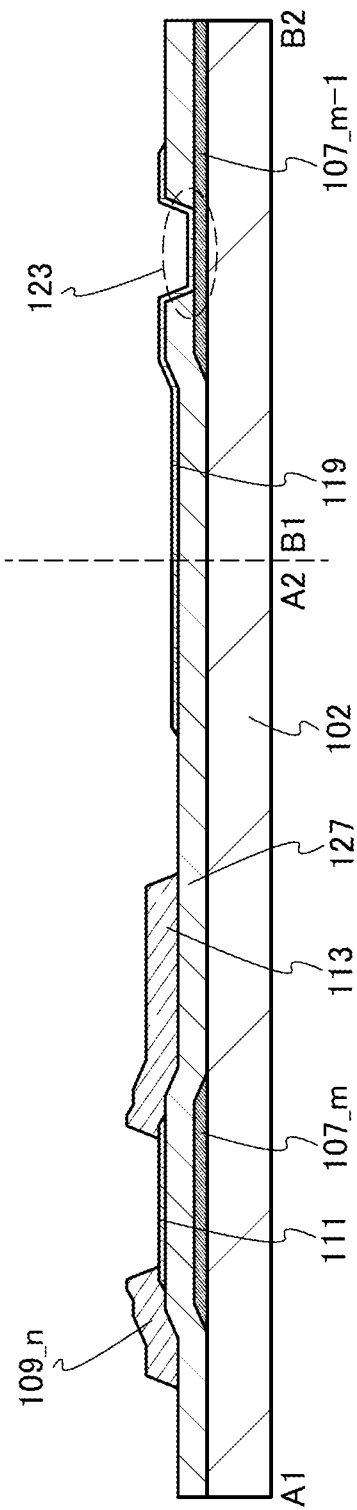

Next, the signal line 109_$n$ including a region serving as the source electrode and the conductive film 113 including a region serving as the drain electrode are formed over the gate insulating film 127 (see FIG. 7B).

The signal line 109_$n$ and the conductive film 113 can be formed as follows: a conductive film is formed using a material applicable to the signal line 109_$n$ and the conductive film 113, a mask is formed over the conductive film, and the conductive film is processed using the mask. The mask can be formed and the processing can be performed with reference to the formation process of the scan line 107_$m$–1 and the scan line 107$m$. Note that a surface of the oxide semiconductor film 111 is cleaned after the signal line 109_$n$ and the conductive film 113 are formed, so that variations in electric characteristics of the transistor 103 can be reduced. For the cleaning, for example, a diluted phosphoric acid solution can be used; specifically, a phosphoric acid solution in which 85% phosphoric acid is diluted by 100 times can be used.

Next, an insulating film 128 is formed over the oxide semiconductor film 111, the oxide semiconductor film 119, the signal line 109_$n$, the conductive film 113, and the gate insulating film 127, an insulating film 130 is formed over the insulating film 128, and an insulating film 133 is formed over the insulating film 130 (see FIG. 8A). The insulating films 128, 130, and 133 are preferably formed successively, in which case entry of impurities into each interface can be suppressed.

The insulating film 128 can be formed using a material that can be used for the insulating film 129 by any of a variety of film formation methods such as a CVD method and a sputtering method. The insulating film 130 can be formed using a material that can be used for the insulating film 131. The insulating film 133 can be formed using a material that can be used for the insulating film 132.

In the case where an oxide insulating film which is capable of reducing the interface state density between the oxide semiconductor film 111 and the oxide insulating film is used as the insulating film 129, the insulating film 128 can be formed under the following formation conditions. Here, as the oxide insulating film, a silicon oxide film or a silicon oxynitride film is formed. As for the formation conditions, the substrate placed in a treatment chamber of a plasma CVD apparatus, which is vacuum-evacuated, is held at a temperature higher than or equal to 180° C. and lower than or equal to 400° C., preferably higher than or equal to 200° C. and lower than or equal to 370° C., the pressure in the treatment chamber is greater than or equal to 20 Pa and less than or equal to 250 Pa, preferably greater than or equal to 40 Pa and less than or equal to 200 Pa with introduction of a source gas such as a deposition gas containing silicon and an oxidizing gas into the treatment chamber, and high-frequency power is supplied to an electrode provided in the treatment chamber.

Typical examples of the deposition gas containing silicon include silane, disilane, trisilane, and silane fluoride. Examples of the oxidizing gas include oxygen, ozone, dinitrogen monoxide, and nitrogen dioxide.

By setting the ratio of the amount of the oxidizing gas to the amount of the deposition gas containing silicon 100 or higher, the amount of hydrogen contained in the insulating film 128 (the insulating film 129) can be reduced and the number of dangling bonds in the insulating film 128 (the insulating film 129) can be reduced. Oxygen transferred from the insulating film 130 (the insulating film 131) is trapped by the dangling bonds in the insulating film 128 (the insulating film 129) in some cases; thus, in the case where the dangling bonds in the insulating film 128 (the insulating film 129) are reduced, oxygen in the insulating film 130 (the insulating film 131) can be transferred to the oxide semiconductor film 111 efficiently to compensate the oxygen vacancies in the oxide semiconductor film 111. As a result, the amount of hydrogen entering the oxide semiconductor film 111 can be reduced and the oxygen vacancies in the oxide semiconductor film 111 can be reduced.

In the case where the above oxide insulating film which includes an oxygen excess region or the above oxide insulating film containing oxygen at a higher proportion than oxygen in the stoichiometric composition is used as the insulating film 131, the insulating film 130 can be formed under the following formation conditions. Here, as the oxide insulating film, a silicon oxide film or a silicon oxynitride film is formed. As for the formation conditions, the substrate placed in a treatment chamber of a plasma CVD apparatus, which is vacuum-evacuated, is held at a temperature higher than or equal to 180° C. and lower than or equal to 260° C., preferably higher than or equal to 180° C. and lower than or equal to 230° C., the pressure in the treatment chamber is greater than or equal to 100 Pa and less than or equal to 250 Pa, preferably greater than or equal to 100 Pa and less than or equal to 200 Pa with introduction of a source gas into the treatment chamber, and high-frequency power that is higher than or equal to 0.17 W/cm$^2$ and lower than or equal to 0.5 W/cm$^2$, preferably higher than or equal to 0.25 W/cm$^2$ and lower than or equal to 0.35 W/cm$^2$ is supplied to an electrode provided in the treatment chamber.

As the source gas of the insulating film 130, the source gas that can be used to form the insulating film 128 can be used.

As the formation conditions of the insulating film 130, the high-frequency power having the above power density is supplied to the treatment chamber having the above pressure, whereby the degradation efficiency of the source gas in plasma is increased, oxygen radicals are increased, and oxidation of the source gas is promoted; therefore, the oxygen content of the insulating film 130 becomes higher than that in the stoichiometric composition. In addition, in the film formed at a substrate temperature within the above temperature range, the bond between silicon and oxygen is weak, and accordingly, part of oxygen in the film can be released by heat treatment in the later step. Thus, it is possible to form an oxide insulating film containing oxygen at a higher proportion than the stoichiometric composition and from which part of oxygen is released by heating. Moreover, the insulating film 128 is provided over the oxide semiconductor film 111. Therefore, in the process for forming the insulating film 130, the insulating film 128 serves as a protective film of the oxide semiconductor film 111. Thus, even when the insulating film 130 is formed using the high-frequency power having a high power density, damage to the oxide semiconductor film 111 can be suppressed.

By increasing the thickness of the insulating film 130, the amount of oxygen released by heating can be increased; thus, the insulating film 130 is preferably provided thicker than the insulating film 128. Since the insulating film 128 is provided, favorable coverage can be achieved even when the insulating film 130 is formed thick.

The insulating film 132 can be formed by a sputtering method, a CVD method, or the like. In the case where a nitride insulating film with a low hydrogen content is used as the insulating film 132, the insulating film 133 can be formed under the following formation conditions. Here, as the nitride insulating film, a silicon nitride film is formed. As for the formation conditions, the substrate placed in a treatment chamber of the plasma CVD apparatus, which is vacuum-evacuated, is held at a temperature higher than or equal to 80° C. and lower than or equal to 400° C., preferably higher than or equal to 200° C. and lower than or equal to 370° C., the pressure in the treatment chamber is greater than or equal to 100 Pa and less than or equal to 250 Pa, preferably greater than or equal to 100 Pa and less than or equal to 200 Pa with introduction of a source gas into the treatment chamber, and high-frequency power is supplied to an electrode provided in the treatment chamber.

As the source gas of the insulating film 133, a deposition gas containing silicon, nitrogen, and ammonia are preferably used. Typical examples of the deposition gas containing silicon include silane, disilane, trisilane, and silane fluoride. Further, the flow rate of nitrogen is preferably 5 times to 50 times that of ammonia, further preferably 10 times to 50 times that of ammonia. The use of ammonia as the source gas can promote decomposition of the deposition gas containing silicon and nitrogen. This is because ammonia is dissociated by plasma energy or heat energy, and energy generated by the dissociation contributes to decomposition of a bond of the deposition gas molecules containing silicon and a bond of nitrogen molecules. Under the above conditions, a silicon nitride film which has a low hydrogen content and can suppress entry of impurities such as hydrogen and water from the outside can be formed.

In the case where a silicon oxide film formed using an organosilane gas by a CVD method is formed between the insulating film 131 and the insulating film 132, the silicon oxide film is formed using any of the above-described organosilane gases by a CVD method over the insulating film 130.

It is preferable that heat treatment be performed at least after formation of the insulating film 130 so that oxygen contained in the insulating film 128 or the insulating film 130 is transferred to at least the oxide semiconductor film 111 to compensate oxygen vacancies in the oxide semiconductor film 111. The heat treatment can be performed as appropriate with reference to the details of heat treatment for dehydration or dehydrogenation of the oxide semiconductor film 111 and the oxide semiconductor film 119.

One of preferable formation processes of the transistor 103 is as follows: an oxide insulating film in which the oxygen content is higher than that in the stoichiometric composition and from which part of oxygen is released by heating is formed as the insulating film 130, the insulating film 130 is heated at 350° C., a silicon oxide film is formed using any of the above-described organosilane gases by a CVD method with the substrate temperature kept at 350° C., and a nitride insulating film in which the hydrogen content is low is formed as the insulating film 132 at a substrate temperature of 350° C.

Next, the opening 117 reaching the conductive film 113 is formed in a region of the insulating films 128, 130, and 133, which overlaps with the conductive film 113, so that the insulating films 129, 131, and 132 are formed (see FIG. 8B); and then the pixel electrode 121 is formed over the insulating film 132 and in the opening 117 (see FIG. 6).

The opening 117 can be formed in a manner similar to that of the opening 123. The pixel electrode 121 is formed in such a manner that a conductive film is formed using any of the materials given above in contact with the conductive film 113 through the opening 117, a mask is formed over the conductive film, and the conductive film is processed using the mask. The mask can be formed and the processing can be performed with reference to the formation process of the scan line 107_m–1 and the scan line 107_m.

Next, the alignment film 158 is formed over the insulating film 132 and the pixel electrode 121. Then, the light-shielding film 152 is formed on the substrate 150, the counter electrode 154 is formed so as to cover the light-shielding film 152, and the alignment film 156 is formed on the counter electrode 154. The liquid crystal 160 is provided over the alignment film 158, the substrate 150 is provided above the substrate 102 so that the alignment film 156 is in contact with the liquid crystal 160, and the substrate 102 and the substrate 150 are fixed to each other with a sealant (not illustrated).

The alignment films 156 and 158 can be formed using the above material by any of a variety of film formation methods such as a spin coating method and a printing method.

The light-shielding film 152 can be formed by a sputtering method using a metal such as titanium or chromium and can be processed using a mask, for example.

The counter electrode 154 can be formed using the material that can be used for the pixel electrode 121 by any of a variety of film formation methods such as a CVD method and a sputtering method.

The liquid crystal 160 can be directly provided on the alignment film 158 by a dispenser method (a dropping method). Alternatively, the liquid crystal 160 may be injected by using capillary action or the like after the substrate 102 and the substrate 150 are attached to each other. Further, the alignment films 156 and 158 are preferably subjected to rubbing treatment so that alignment of the liquid crystal 160 is easily performed.

Through the above process, the semiconductor device of one embodiment of the present invention can be manufactured (see FIG. 6).

Modification Example 1

In the semiconductor device of one embodiment of the present invention, a connection between the semiconductor film (specifically, the oxide semiconductor film) serving as one electrode of the capacitor and the scan line serving as the capacitor line can be changed as appropriate. For example, to increase the conductivity of the semiconductor film, a conductive film can be provided in contact with part of the semiconductor film, so that the semiconductor film and the scan line can be electrically connected to each other through the conductive film.

Note that in the drawings illustrating modification examples, the substrate 150, the light-shielding film 152, the counter electrode 154, the alignment film 156, the alignment film 158, and the liquid crystal 160 are not illustrated for clarity. Further, in the drawings illustrating the modification examples, the reference numerals used in FIG. 5 or FIG. 6 are used as appropriate.

A specific example of the structure is described with reference to FIG. 9 and FIGS. 10A and 10B. Here, portions different from those in the structure illustrated in FIG. 5 and FIG. 6 are only described. Note that FIG. 9 is a top view of the pixel 101(m, n), FIG. 10A is a cross-sectional view taken along dashed-dotted line A1-A2 and dashed-dotted line B1-B2 in FIG. 9, and FIG. 10B is a cross-sectional view taken along dashed-dotted line C1-C2 in FIG. 9.

Figure 9:
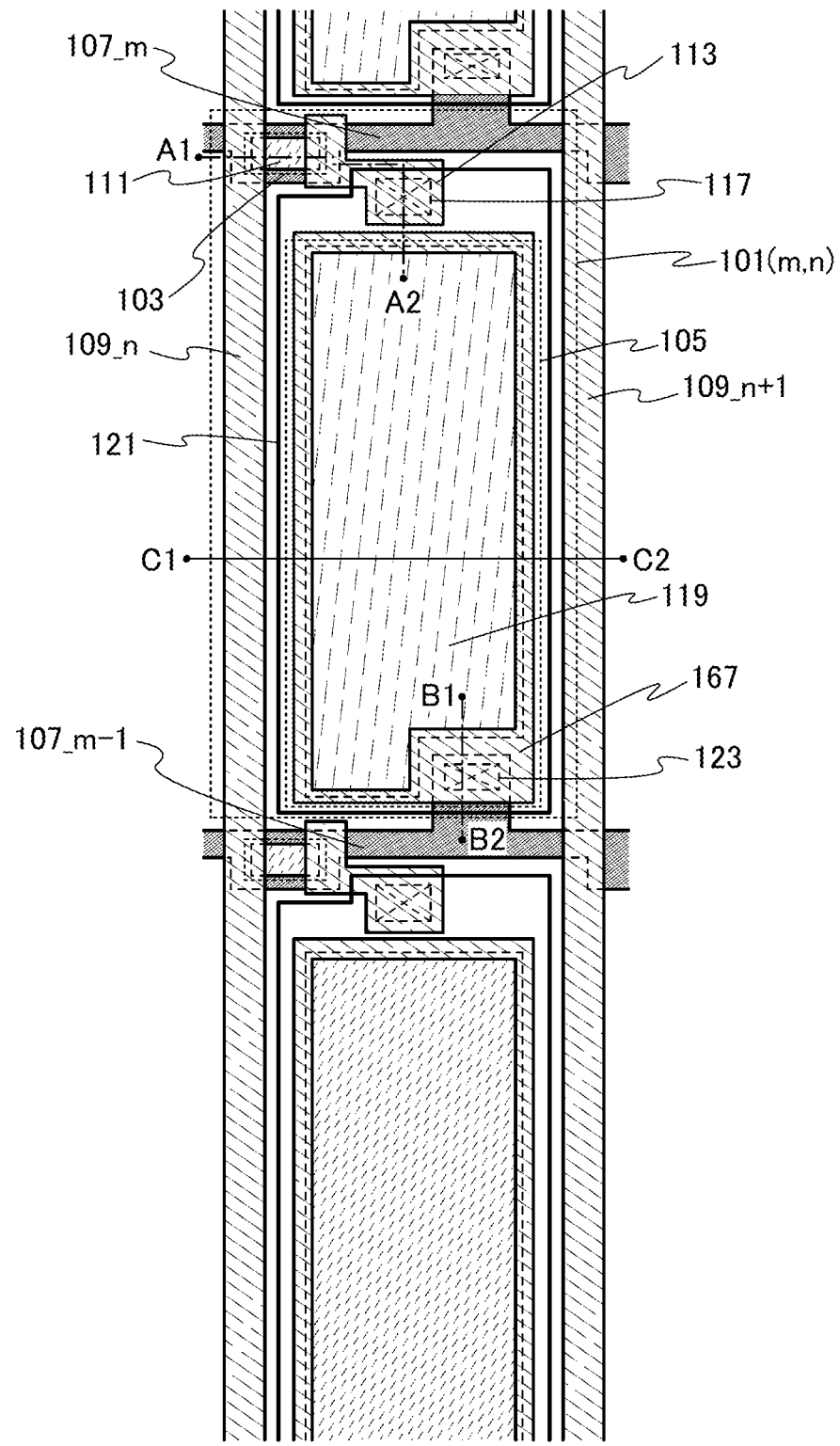
FIG. 9 is a top view illustrating a semiconductor device.

In the pixel 101(m, n) illustrated in FIG. 9, a conductive film 167 is in contact with the oxide semiconductor film 119 along the outer periphery thereof and is in contact with the scan line 107_m-1 through the opening 123. The conductive film 167 can be formed by utilizing the formation process of the signal line 109_n and the conductive film 113. This means that the conductive film 167 has a light-shielding property in some cases and thus preferably has a loop shape. Note that a larger contact area between the conductive film 167 and the oxide semiconductor film 119 enables the oxide semiconductor film 119 to serve as one electrode of the capacitor 105 easily.

Further, in the pixel 101(m, n) illustrated in FIG. 9, the shape of the oxide semiconductor film 119 is preferably changed as appropriate so that the oxide semiconductor film 119 and the scan line 107_m-1 are in contact with the conductive film 167.

Figure 10A:
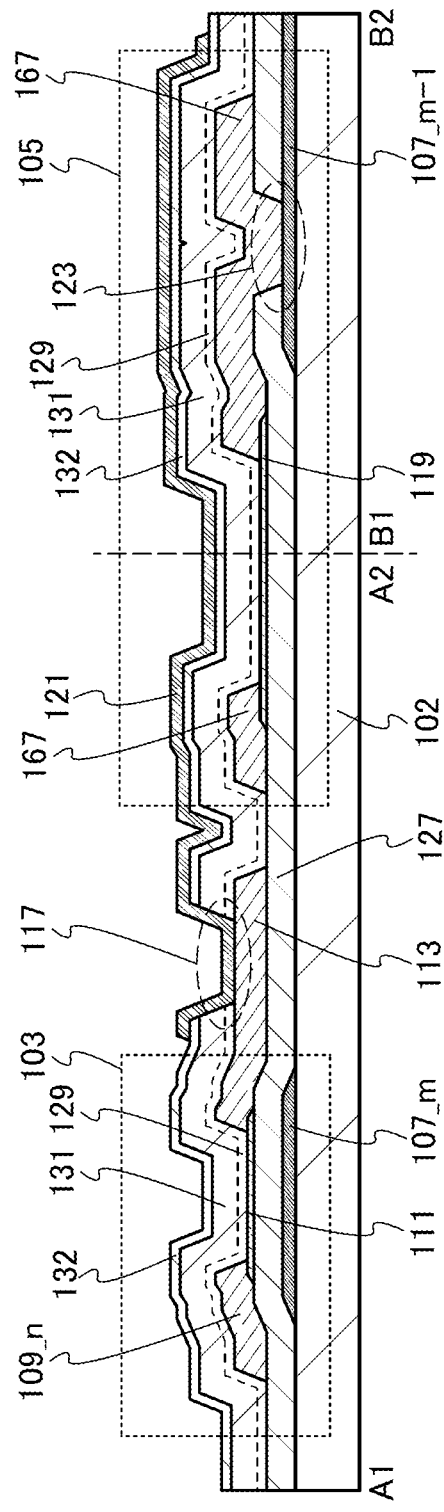
FIGS. 10A and 10B are cross-sectional views illustrating a semiconductor device.
Figure 10B:
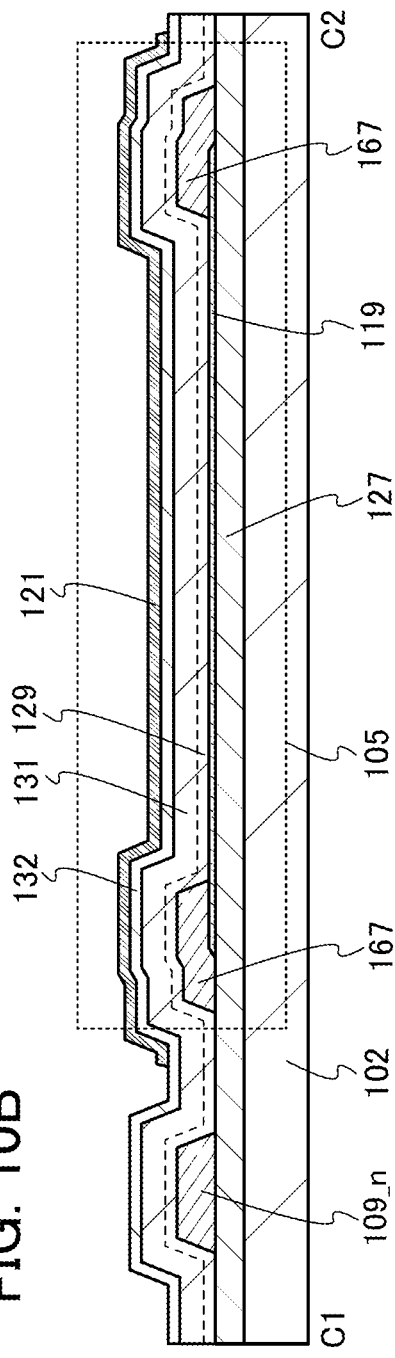

As illustrated in FIGS. 10A and 10B, the conductive film 167 is provided so as to cover an edge portion of the oxide semiconductor film 119 of the capacitor 105.

Alternatively, the conductive film 167 may be provided in contact with the oxide semiconductor film 119 in a loop shape with a gap.

Figure 11:
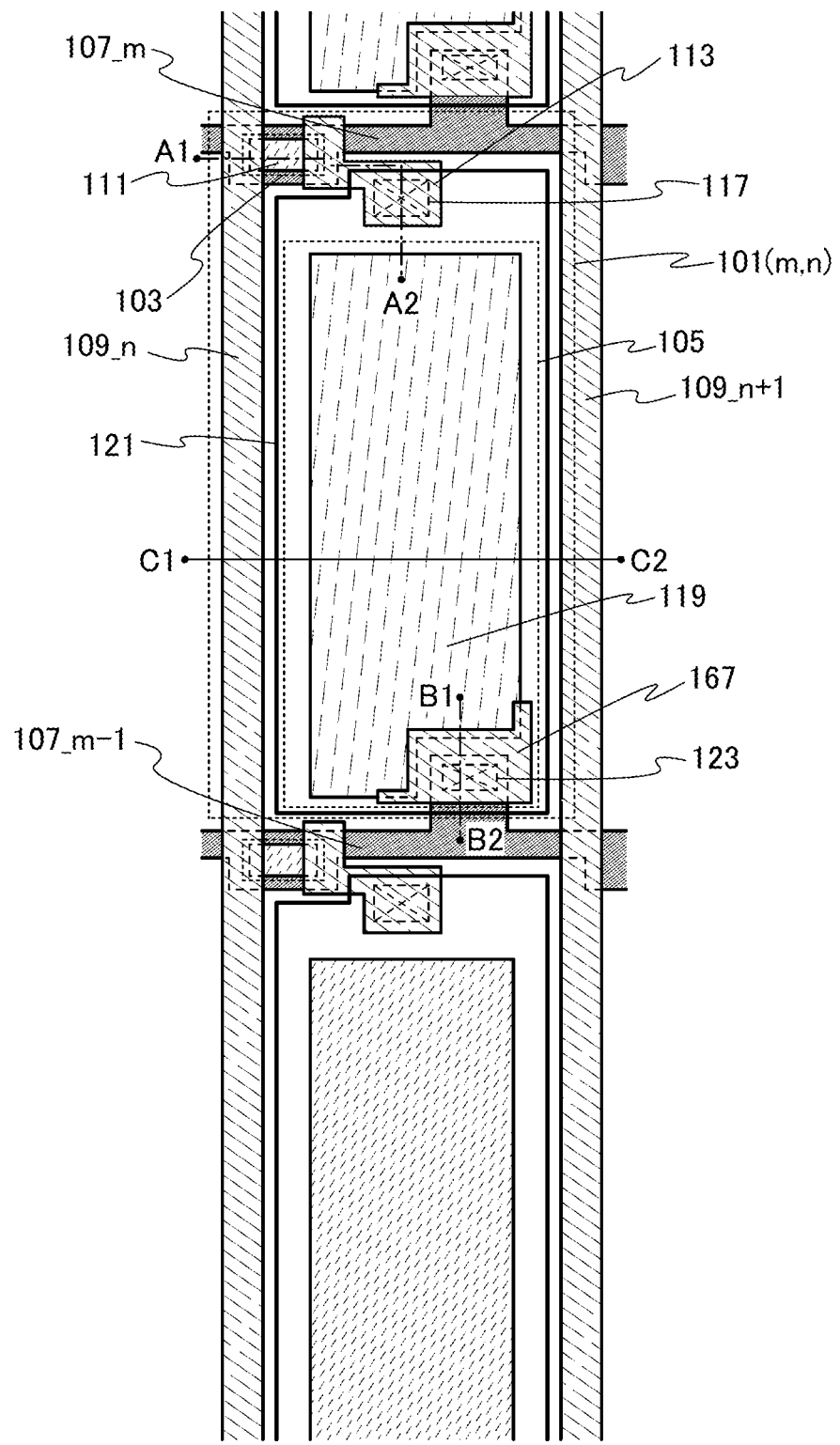
FIG. 11 is a top view illustrating a semiconductor device.

Although the conductive film 167 is formed in a loop shape in the pixel 101(m, n) illustrated in FIG. 9 and FIGS. 10A and 10B, the conductive film 167 may be provided in contact with only part of the outer periphery of the oxide semiconductor film 119 (see FIG. 11). Note that also in the pixel 101(m, n) illustrated in FIG. 11, the oxide semiconductor film 119 and the scan line 107_m-1 are electrically connected to each other through the conductive film 167.

Figure 12:
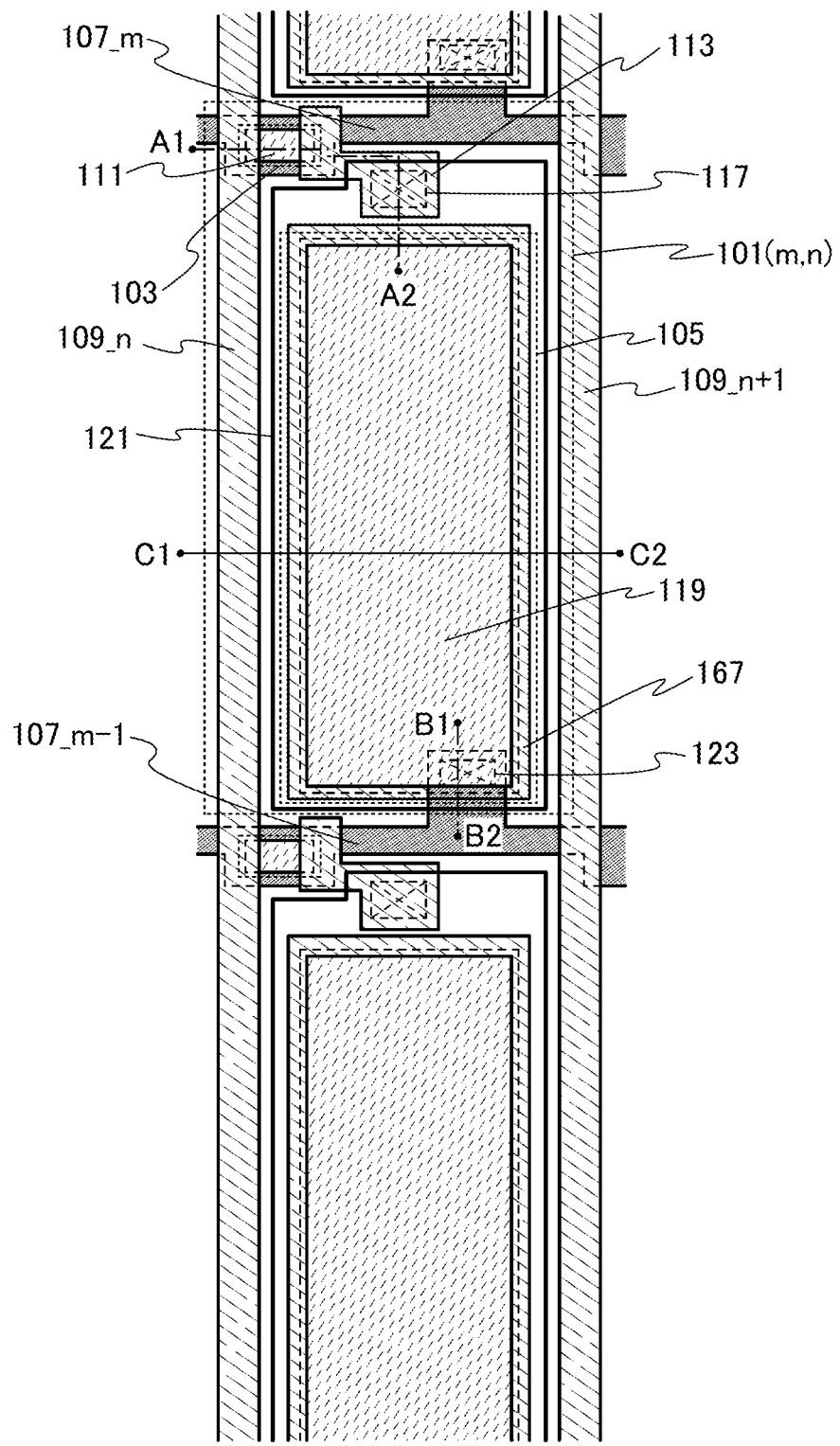
FIG. 12 is a top view illustrating a semiconductor device.
Figure 13A:
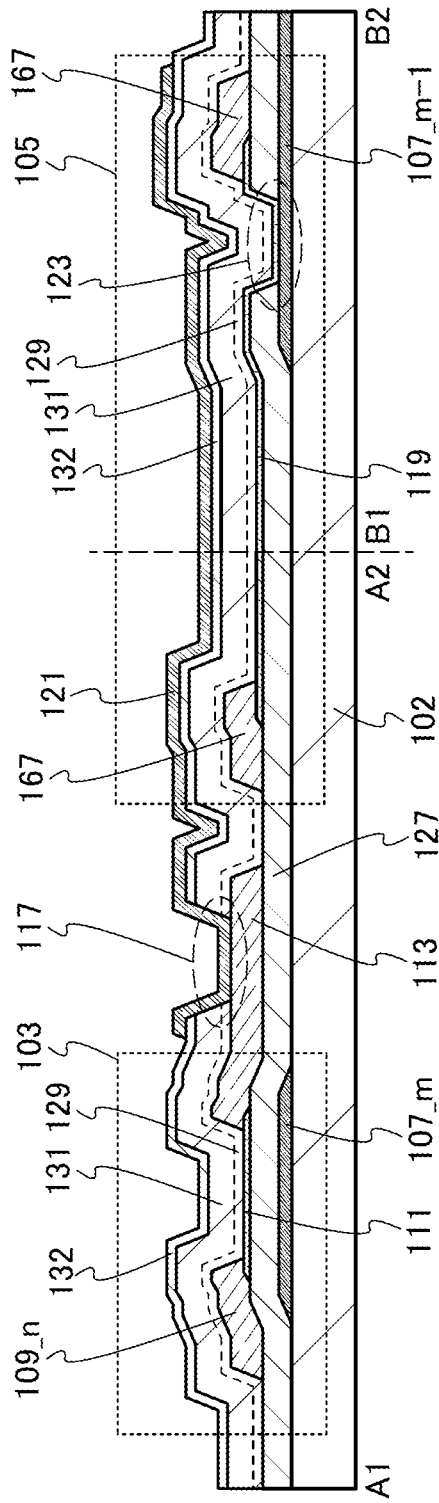
FIGS. 13A and 13B are cross-sectional views illustrating a semiconductor device.
Figure 13B:
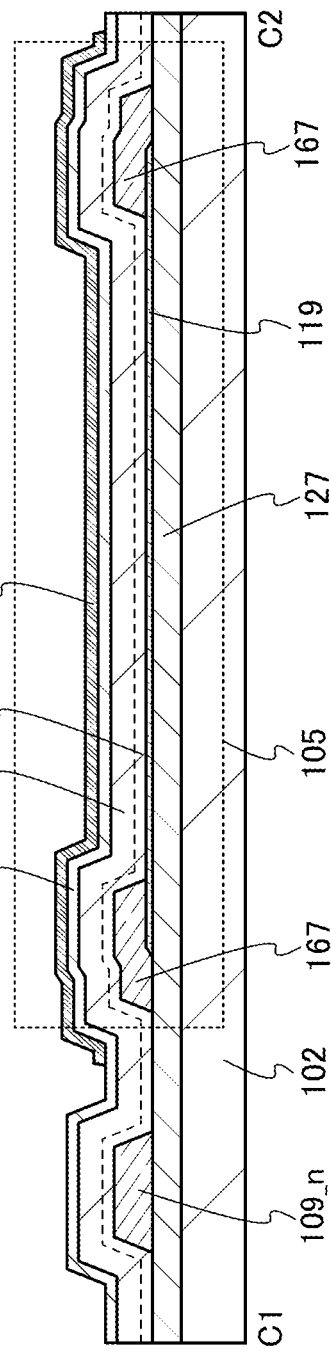

In the structure in which the oxide semiconductor film 119 is in direct contact with the scan line 107_m-1, the conductive film 167 may be provided in contact with part of the oxide semiconductor film 119 to increase the conductivity of the oxide semiconductor film 119. In other words, the conductive film 167 may be in contact with the oxide semiconductor film 119 and not with the scan line 107_m-1. For example, the conductive film 167 may be formed in a loop shape that is not in contact with the scan line 107_m-1 as illustrated in FIG. 12 and FIGS. 13A and 13B. Note that FIG. 12 is a top view of the pixel 101(m, n) having the above structure, FIG. 13A is a cross-sectional view taken along dashed-dotted line A1-A2 and dashed-dotted line B1-B2 in FIG. 12, and FIG. 13B is a cross-sectional view taken along dashed-dotted line C1-C2 in FIG. 12.

Modification Example 2

In the pixel 101(m, n) illustrated in FIG. 5 and FIG. 6 or the pixels 101(m, n) illustrated in FIG. 9, FIGS. 10A and 10B, FIG. 11, FIG. 12, and FIGS. 13A and 13B, an organic insulating film can be provided to reduce parasitic capacitance generated between the pixel electrode 121 and the conductive film 113 or parasitic capacitance generated between the pixel electrode 121 and the conductive film 167. The organic insulating film can be provided in a region where parasitic capacitance is generated. In other words, the organic insulating film is provided partly in the pixel 101(m, n).

For the organic insulating film, a photosensitive organic resin or a non-photosensitive organic resin can be used; for example, an acrylic resin, a benzocyclobutene-based resin, an epoxy resin, a siloxane-based resin, or the like can be used. Alternatively, polyamide can be used for the organic insulating film.

To provide the organic insulating film partly in the pixel 101(m, n), an insulating film is formed using any of the above-described materials and then the insulating film needs to be processed in some cases. The method for forming the organic insulating film is not particularly limited, and can be selected as appropriate in accordance with a material which is used. For example, spin coating, dipping, spray coating, a droplet discharge method (an ink-jet method), screen printing, offset printing, or the like can be employed. When a photosensitive organic resin is used for the organic insulating film, a resist mask is unnecessary in formation of the organic insulating film; thus, a process can be simplified.

In general, an organic resin contains much hydrogen and water; thus, when an organic resin is provided over the transistor 103 (in particular, the oxide semiconductor film 111), hydrogen and water contained in the organic resin diffuses into the transistor 103 (in particular, the oxide semiconductor film 111) and might degrade the electric characteristics of the transistor 103. For this reason, it is preferable that the organic resin be not provided at least in a region which overlaps with the oxide semiconductor film 111.

Modification Example 3

Figure 14:
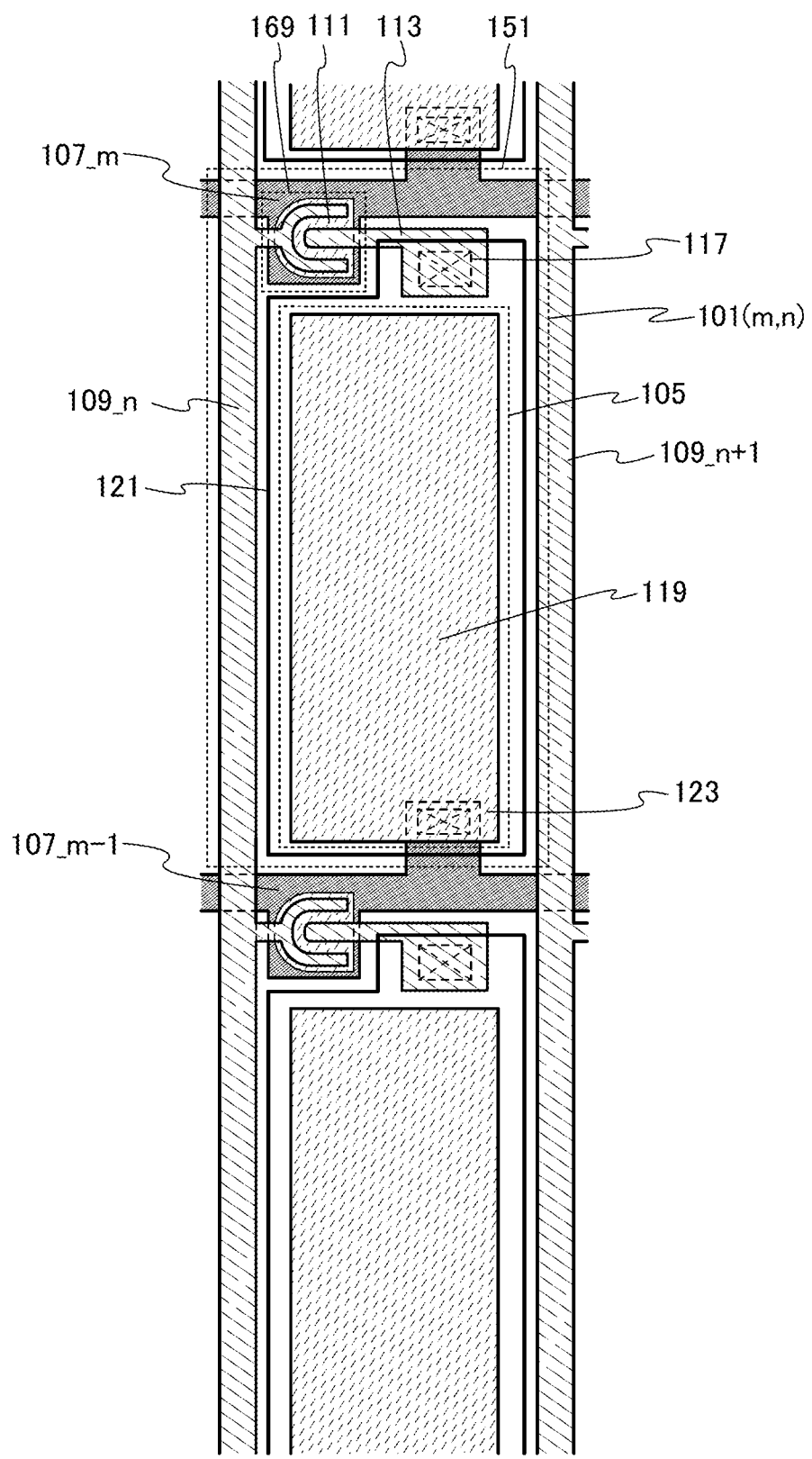
FIG. 14 is a top view illustrating a semiconductor device.

In each of the pixel 101(m, n) illustrated in FIG. 5 and FIG. 6 and the pixels 101(m, n) illustrated in FIG. 9, FIGS. 10A and 10B, FIG. 11, FIG. 12, and FIGS. 13A and 13B, the shape of the transistor 103 is not limited to the shapes of the transistors illustrated in the above drawings and can be changed as appropriate. For example, the transistor 103 may be a transistor 169 in which a region in the signal line 109_n which serves as the source electrode has a U shape (or a C shape, a square bracket shape, or a horseshoe shape) to surround a region in the conductive film 113 which serves as the drain electrode as in the pixel 101(m, n) illustrated in FIG. 14. With such a shape, an enough channel width can be ensured even in a transistor with a small area, and accordingly, the amount of on-state current of the transistor can be increased. Note that other components of the pixel 101(m, n) illustrated in FIG. 14 are similar to those in FIG. 5.

Modification Example 4

In each of the pixel 101(m, n) illustrated in FIG. 5 and FIG. 6 and the pixels 101(m, n) illustrated in FIG. 9, FIGS. 10A and 10B, FIG. 11, FIG. 12, and FIGS. 13A and 13B, a channel-etched transistor is used as the transistor 103. The transistor 103 can be a channel-protective type transistor 183 illustrated in FIG. 15. The structure of the transistor 183 in FIG. 15 is the same as that of the transistor 103 in FIG. 6 except that a channel protective film 182 is provided between the oxide semiconductor film 111 and the signal line 109_n including a region serving as the source electrode and the conductive film 113 including a region serving as the drain electrode.

Figure 15:
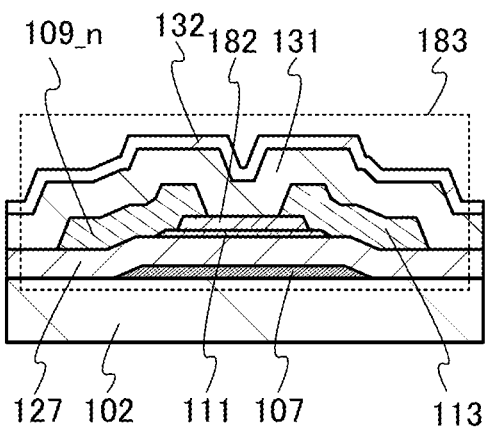
FIG. 15 is a cross-sectional view illustrating a transistor applicable to a semiconductor device.

To form the transistor 183 illustrated in FIG. 15, the channel protective film 182 is formed over the oxide semiconductor film 111 and then the signal line 109_n and the conductive film 113 are formed. The channel protective film 182 can be formed using a material for the insulating film 129 of the transistor 103. With such a structure, an insulating film corresponding to the insulating film 129 of the transistor 103 does not need to be additionally provided in the transistor 183. With the channel protective film 182, the surface of the oxide semiconductor film 111 is not exposed to an etchant or an etching gas used in the formation process of the signal line 109_n and the conductive film 113, so that impurities between the oxide semiconductor film 111 and the channel protective film 182 can be reduced. As a result, leakage current which flows between the signal line 109_n and the conductive film 113 of the transistor 183 can be reduced. In addition, with the channel protective film 182, the oxide semiconductor film 111 (in particular, a channel formation region) can be prevented from being damaged when the processing for forming the signal line 109 and the conductive film 113 is performed.

Modification Example 5

Figure 16:
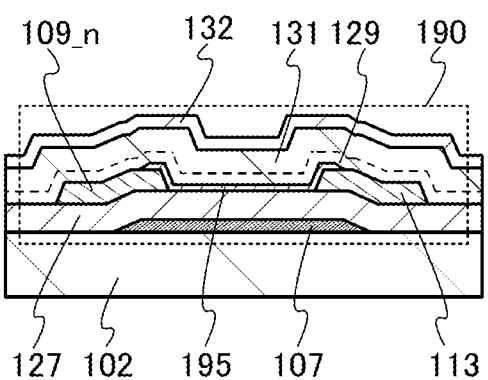
FIG. 16 is a cross-sectional view illustrating a transistor applicable to a semiconductor device.

In each of the pixel 101(m, n) illustrated in FIG. 5 and FIG. 6 and the pixels 101(m, n) illustrated in FIG. 9, FIGS. 10A and 10B, FIG. 11, FIG. 12, and FIGS. 13A and 13B, the oxide semiconductor film 111 of the transistor 103 is located between the gate insulating film 127 and the signal line 109_n including a region serving as the source electrode and the conductive film 113 including a region serving as the drain electrode. A transistor 190 in which an oxide semiconductor film 195 is located between the insulating film 129, and the signal line 109_n including a region serving as the source electrode and the conductive film 113 including a region serving as the drain electrode as illustrated in FIG. 16 can be used as the transistor 103. The structure of the transistor 190 in FIG. 16 is the same as that of the transistor 103 in FIG. 6 except for the position of the oxide semiconductor film 195.

To form the transistor 190 illustrated in FIG. 16, the signal line 109_n and the conductive film 113 are formed and then the oxide semiconductor film 195 is formed. Thus, a surface of the oxide semiconductor film 195 is not exposed to an etchant or an etching gas used in the formation process of the signal line 109_n and the conductive film 113, so that impurities between the oxide semiconductor film 195 and the insulating film 129 can be reduced. As a result, leakage current which flows between the signal line 109_n and the conductive film 113 of the transistor 190 can be reduced.

Modification Example 6

Figure 17:
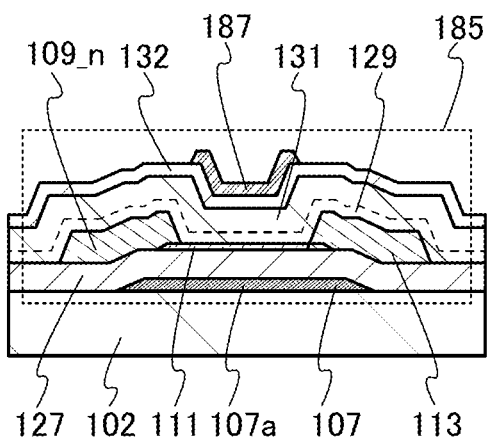
FIG. 17 is a cross-sectional view illustrating a transistor applicable to a semiconductor device.

In each of the pixel 101(m, n) illustrated in FIG. 5 and FIG. 6 and the pixels 101(m, n) illustrated in FIG. 9, FIGS. 10A and 10B, FIG. 11, FIG. 12, and FIGS. 13A and 13B, a transistor 185 including two gate electrodes facing each other with the oxide semiconductor film 111 provided therebetween as illustrated in FIG. 17 can be used instead of the transistor 103 having one gate electrode.

In the transistor 185, a conductive film 187 is provided over the insulating film 132 of any of the transistor 103, the transistor 169, the transistor 183, and the transistor 190 described in this embodiment. The conductive film 187 overlaps with at least the channel formation region of the oxide semiconductor film 111. The width of the conductive film 187 in the channel length direction can be shorter than the distance between the signal line 109_n including a region serving as a source electrode of the transistor and the conductive film 113 serving as a drain electrode, for example. The conductive film 187 is preferably provided so as to overlap with the channel formation region of the oxide semiconductor film 111, and the potential of the conductive film 187 is preferably the lowest potential of the video signal input to the signal line 109_n. As a result, current which flows in a region on the conductive film 187 side of the oxide semiconductor film 111 and between the source electrode and the drain electrode can be controlled. Thus, variations in electric characteristics among transistors provided in the pixel portion 100 can be reduced. In addition, the conductive film 187 reduces an influence of a change in ambient electric field on the oxide semiconductor film 111, which enables the reliability of the transistor to be improved.

Accordingly, a semiconductor film is formed as one electrode of a capacitor in the same process as a semiconductor film of a transistor, whereby a semiconductor device in which the aperture ratio is increased and the capacitance of the capacitor is increased can be manufactured. Further, an increase in aperture ratio can result in a semiconductor device with excellent display quality.

Further, oxygen vacancies and impurities such as hydrogen and nitrogen in the semiconductor film (specifically, the oxide semiconductor film) of the transistor are reduced, so that the semiconductor device of one embodiment of the present invention has favorable electric characteristics.

Note that the structure and the like described in this embodiment can be used as appropriate in combination with any of the structures in the other embodiments.

Embodiment 2

In this embodiment, a semiconductor device of one embodiment of the present invention, which has a structure different from those described in the above embodiment, will be described with reference to drawings. In the semiconductor device described in this embodiment, the structure of a capacitor is different from that of the capacitor in the above embodiment. The above embodiment can be referred to for components in the semiconductor device in this embodiment, which are similar to those of the semiconductor device in the above embodiment.

<Structure of Semiconductor Device>

Figure 18:
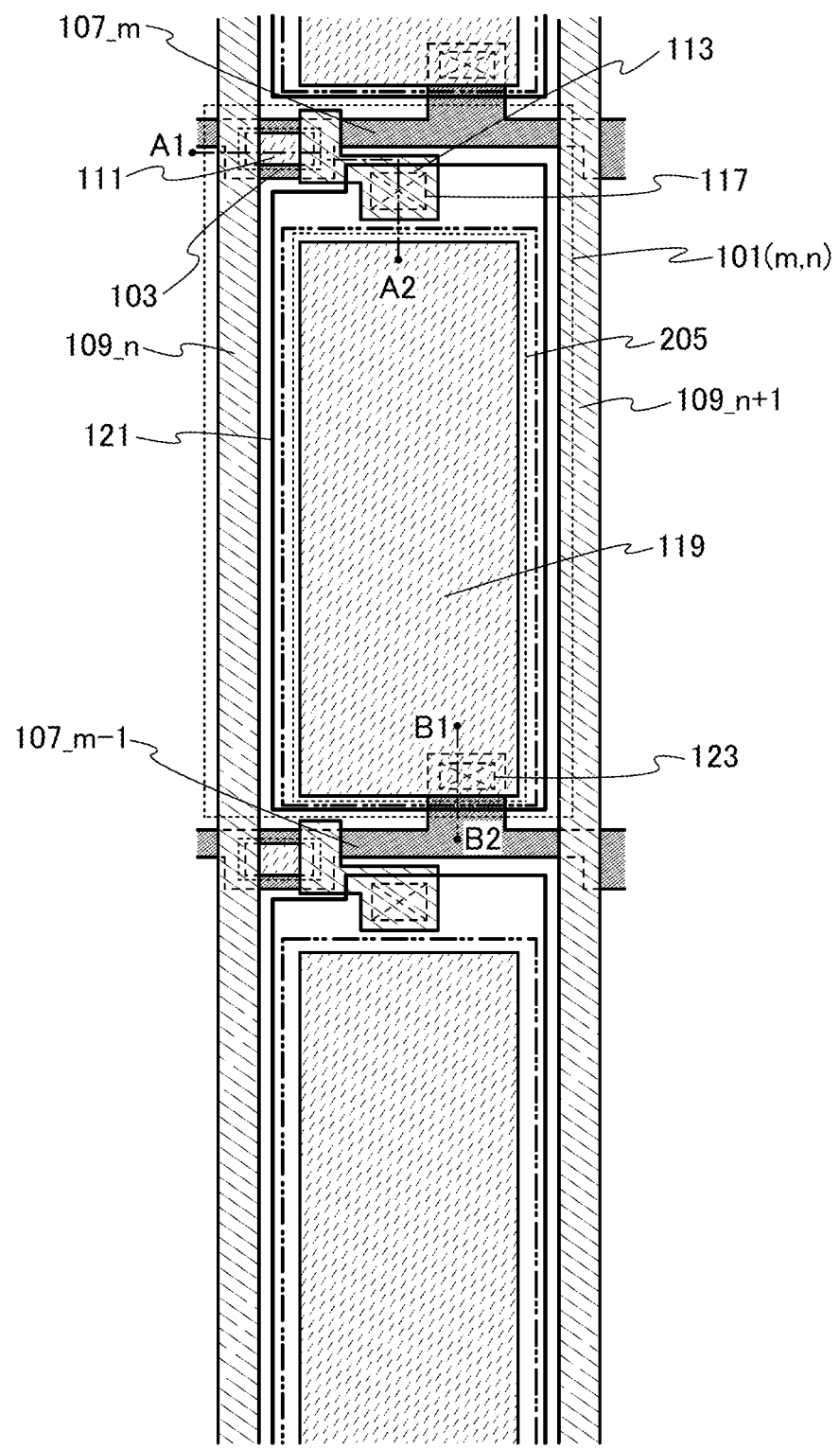
FIG. 18 is a top view illustrating a semiconductor device.

FIG. 18 is a top view of a pixel described in this embodiment. The pixel 101(m, n) illustrated in FIG. 18 has a structure in which a capacitor 205 is provided instead of the capacitor 105 in the pixel 101(m, n) illustrated in FIG. 5. In the pixel 101(m, n) illustrated in FIG. 18, an insulating film 232 (not illustrated) is provided in contact with the oxide semiconductor film 119 in a region indicated by dashed-two dotted lines unlike in the pixel 101(m, n) illustrated in FIG. 5. That is, an insulating film 229 (not illustrated) and an insulating film 231 (not illustrated) are removed in the region indicated by dashed-two dotted lines in the pixel 101(m, n) illustrated in FIG. 18. This means that the capacitor 205 includes the oxide semiconductor film 119 serving as one electrode, the pixel electrode 121 serving as the other electrode, and the insulating film 232 (not illustrated) serving as a dielectric film.

Figure 19:
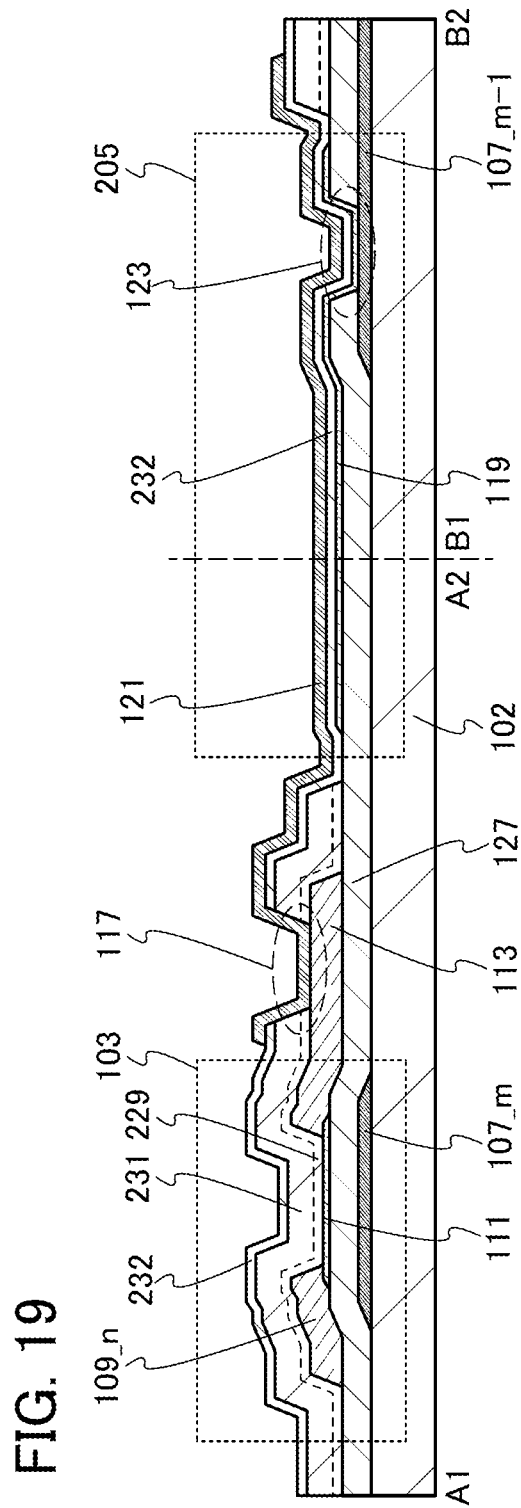
FIG. 19 is a cross-sectional view illustrating a semiconductor device.

A cross-sectional view taken along dashed-dotted line A1-A2 and dashed-dotted line B1-B2 in FIG. 18 is illustrated in FIG. 19.

The cross-sectional structure of the pixel 101(m, n) illustrated in FIG. 18 is as follows. Over the substrate 102, the scan line 107_m including a region serving as the gate electrode and the scan line 107_m−1 are provided. The gate insulating film 127 is provided over the scan line 107_m−1 and the scan line 107_m. The oxide semiconductor film 111 is provided over the gate insulating film 127 to overlap with the scan line 107_m. The opening 123 which reaches the scan line 107_m−1 is provided in a part of the gate insulating film 127 which is in contact with the scan line 107_m−1. The oxide semiconductor film 119 is provided over the gate insulating film 127 and in the opening 123. The signal line 109_n including a region serving as the source electrode and the conductive film 113 including a region serving as the drain electrode are each provided over the oxide semiconductor film 111 and the gate insulating film 127. At least in a region which is to be the transistor 103, the insulating film 229, the insulating film 231, and the insulating film 232 serving as protective insulating films of the transistor 103 are provided over the gate insulating film 127, the signal line 109_n, the oxide semiconductor film 111, and the conductive film 113. Further, at least in a region which is to be the capacitor 205, the insulating film 232 is provided over the oxide semiconductor film 119. The opening 117 which reaches the conductive film 113 is provided in the insulating film 229, the insulating film 231, and the insulating film 232, and the pixel electrode 121 is provided over the insulating film 232 and in the opening 117. Note that a base insulating film may be provided between the substrate 102, and the scan lines 107_m−1 and 107_m and the gate insulating film 127.

The insulating film 229 is similar to the insulating film 129 described in Embodiment 1. The insulating film 231 is similar to the insulating film 131 described in Embodiment 1. The insulating film 232 is similar to the insulating film 132 described in Embodiment 1.

When the insulating film 232 serves as a dielectric film between the oxide semiconductor film 119 serving as one electrode and the pixel electrode 121 serving as the other electrode as in the capacitor 205 in this embodiment, the thickness of the dielectric film can be thinner than that of the dielectric film of the capacitor 105 in Embodiment 1. Thus, the capacitor 205 in this embodiment can have larger capacitance per unit area than the capacitor 105 in Embodiment 1.

Since the capacitor 205 has larger capacitance per unit area than the capacitor 105, the area of the oxide semiconductor film 119 which is necessary to obtain the capacitance equivalent to that of the capacitor 105 can be small. Accordingly, a region on which the oxide semiconductor film 119 is not formed can be obtained in the pixel 101(m, n). Thus, light extraction efficiency (transmittance) of a light source such as a backlight can be improved in the semiconductor device of one embodiment of the present invention and as a result, the display quality can be improved.

The insulating film 232 is preferably a nitride insulating film similarly to the insulating film 132 in Embodiment 1. When a nitride insulating film is formed by a plasma CVD method or a sputtering method as the insulating film 232, the oxide semiconductor film 119 is exposed to plasma; thus, oxygen vacancies are generated in the oxide semiconductor film 119. Further, since the insulating film 232 is in contact with the oxide semiconductor film 119, nitrogen and/or hydrogen contained in the nitride insulating film move/moves to the oxide semiconductor film 119. When hydrogen contained in the insulating film 232 enters the oxygen vacancies, electrons serving as carriers are generated. Alternatively, a nitride insulating film is formed as the insulating film 232 and heat treatment is performed while the insulating film 232 is in contact with the oxide semiconductor film 119; thus, nitrogen and/or hydrogen contained in the nitride insulating film move/moves to the oxide semiconductor film 119. When hydrogen contained in the insulating film 232 enters the oxygen vacancies, electrons serving as carriers are generated. As a result of these, the electrical conductivity of the oxide semiconductor film 119 is increased, and the oxide semiconductor film 119 has n-type conductivity. Further, the oxide semiconductor film 119 becomes a conductive film having a light-transmitting property which includes a metal oxide film having conductor properties. The oxide semiconductor film 119 has higher electrical conductivity than the oxide semiconductor film 111.

As described above, in the semiconductor device of this embodiment, the oxide semiconductor film 119 includes a region having a higher conductivity than the oxide semiconductor film 111. At least a region of the oxide semiconductor film 119, which is in contact with the insulating film 232, has n-type conductivity and has a higher conductivity than a region of the oxide semiconductor film 111, which is in contact with the insulating film 229.

Note that it is preferable that the oxide semiconductor film 119 have a higher hydrogen concentration than the oxide semiconductor film 111. In the oxide semiconductor film 119, the hydrogen concentration measured by secondary ion mass spectrometry (SIMS) is greater than or equal to $8\times10^{19}$ atoms/cm$^3$, preferably greater than or equal to $1\times10^{20}$ atoms/ cm$^3$, more preferably greater than or equal to 5×10$^{20}$ atoms/cm$^3$. In the oxide semiconductor film 111, the hydrogen concentration measured by SIMS is less than 5×10$^{19}$ atoms/cm$^3$, preferably less than 5×10$^{18}$ atoms/cm$^3$, more preferably less than or equal to 1×10$^{18}$ atoms/cm$^3$, still more preferably less than or equal to 5×10$^{17}$ atoms/cm$^3$, further preferably less than or equal to 1×10$^{16}$ atoms/cm$^3$.

The resistivity of the oxide semiconductor film 119 is lower than that of the oxide semiconductor film 111. The resistivity of the oxide semiconductor film 119 is preferably greater than or equal to 1×10$^{-8}$ times and less than or equal to 1×10$^{-1}$ times as low as the resistivity of the oxide semiconductor film 111. The resistivity of the oxide semiconductor film 119 is typically greater than or equal to 1×10$^{-3}$ Ωcm and less than 1×10$^4$ Ωcm, preferably greater than or equal to 1×10$^{-3}$ Ωcm and less than 1×10$^{-1}$ Ωcm.

In an operation method of the capacitor 205 in the semiconductor device of this embodiment, the potential of the oxide semiconductor film 119 (in other words, the potential of the scan line 107_m−1) is lower than the potential of the pixel electrode 121 by greater than or equal to the threshold voltage (Vth) of the capacitor 205 (MOS capacitor) in an operation period of the capacitor 205, as in the operation method of the capacitor 105 in Embodiment 1. However, in the capacitor 205, the oxide semiconductor film 119 serving as one electrode has n-type conductivity and has high conductivity, so that the threshold voltage (Vth) is shifted in the negative direction as shown by a dashed line in FIG. 2. The potential of the oxide semiconductor film 119 (in other words, the potential of the scan line 107_m−1) can be raised in accordance with the shift amount of the threshold voltage (Vth) of the capacitor 205 in the negative direction, from the lowest potential of the pixel electrode 121. Thus, in the case where the threshold voltage of the capacitor 205 is a larger negative value, the potential of the scan line 107_m−1 can be higher than the potential of the pixel electrode 121 as in FIG. 4B.

The oxide semiconductor film 119 serving as one electrode of the capacitor 205 is made to have n-type conductivity and the electrical conductivity thereof is increased as in this embodiment, so that the threshold voltage shifts in the negative direction. Thus, the range of the potential needed for operating the capacitor 205 can be larger than the range of the potential needed for operating the capacitor 105 in Embodiment 1. Accordingly, this embodiment is preferable because the capacitor 205 can be constantly operated with stability in an operation period of the capacitor 205.

<Method for Manufacturing Semiconductor Device>

Next, a method for manufacturing a semiconductor device of this embodiment is described with reference to FIGS. 20A and 20B and FIG. 21.

First, the scan line 107_m−1 and the scan line 107_m each including a region serving as the gate electrode are formed over the substrate 102. An insulating film which is processed into the gate insulating film 127 is formed so as to cover the substrate 102, the scan line 107_m−1, and the scan line 107_m. The opening 123 is formed in a region of the insulating film, which is in contact with the scan line 107_m−1, so that the gate insulating film 127 is formed. The oxide semiconductor film 111 is formed so as to overlap with the scan line 107_m. The oxide semiconductor film 119 is formed over the gate insulating film 127 and in the opening 123 so as to overlap with a region on which the pixel electrode 121 to be formed. The signal line 109_n including a region serving as the source electrode and the conductive film 113 including a region serving as the drain electrode are formed. The insulating film 128 is formed over the gate insulating film 127, the signal line 109_n, the oxide semiconductor film 111, the conductive film 113, and the oxide semiconductor film 119. The insulating film 130 is formed over the insulating film 128 (see FIG. 20A). Note that the above steps can be performed with reference to Embodiment 1.

Next, a mask is formed over a region of the insulating film 130, which overlaps with at least the oxide semiconductor film 111. Processing is performed to form an insulating film 228 and an insulating film 230 with the use of the mask and expose the oxide semiconductor film 119. An insulating film 233 is formed over the exposed region and the insulating film 230 (see FIG. 20B). As the mask, a resist mask formed through a photolithography process can be used, and the processing can be performed by one or both of dry etching and wet etching. The insulating film 233 is similar to the insulating film 133 described in Embodiment 1. Note that heat treatment is preferably performed while the insulating film 233 is in contact with the oxide semiconductor film 119, for example, after formation of the insulating film 233. The above steps can be performed with reference to Embodiment 1.

When a nitride insulating film is formed by a plasma CVD method or a sputtering method as the insulating film 233, the oxide semiconductor film 119 is exposed to plasma; thus, oxygen vacancies are generated in the oxide semiconductor film 119. Further, since the insulating film 233 formed using a nitride insulating film is in contact with the oxide semiconductor film 119, nitrogen and/or hydrogen move/moves from the insulating film 233 to the oxide semiconductor film 119. When hydrogen contained in the insulating film 233 enters the oxygen vacancies, electrons serving as carriers are generated. Alternatively, a nitride insulating film is formed as the insulating film 232 and heat treatment is performed while the insulating film 232 is in contact with the oxide semiconductor film 119; thus, nitrogen and/or hydrogen contained in the nitride insulating film move/moves to the oxide semiconductor film 119. As a result of these, the electrical conductivity of the oxide semiconductor film 119 is increased, and the oxide semiconductor film 119 has n-type conductivity. Further, the oxide semiconductor film 119 becomes a conductive film having a light-transmitting property which includes a metal oxide film having conductor properties. The oxide semiconductor film 119 has higher electrical conductivity than the oxide semiconductor film 111.

Next, the opening 117 reaching the conductive film 113 is formed in the insulating films 228, 230, and 233 to form the insulating films 229, 231, and 232 (see FIG. 21). Then, the pixel electrode 121 in contact with the conductive film 113 through the opening 117 is formed (see FIG. 19). The above steps can be performed with reference to Embodiment 1.

Through the above process, the semiconductor device in this embodiment can be manufactured.

Modification Example

In the semiconductor device described in this embodiment, the structure of a region where a capacitor is provided can be changed as appropriate. A specific example is described with reference to FIG. 22. The pixel 101(*m, n*) illustrated in FIG. 22 has a capacitor 245 including the gate insulating film 127 the structure of which is different from that in the capacitor 105 of the pixel 101(*m, n*) illustrated in FIG. 5 and FIG. 6 in a region where the capacitor is provided.

Figure 22:
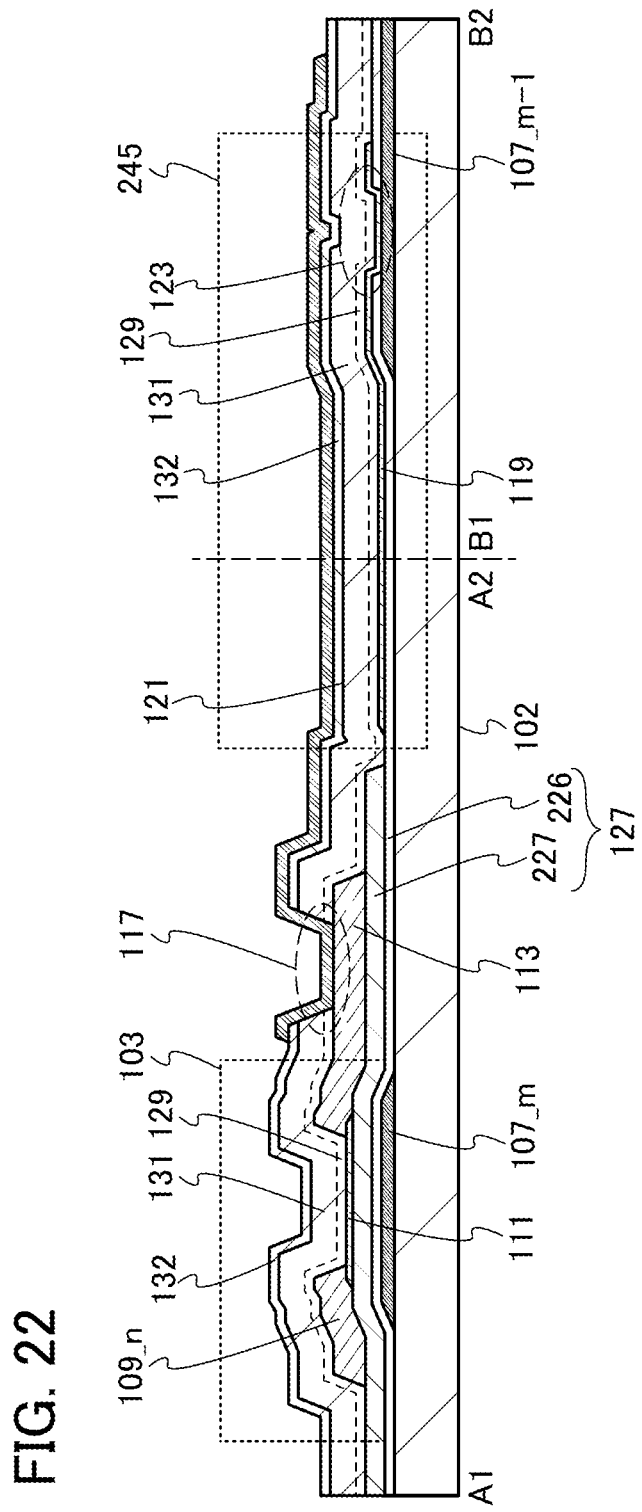
FIG. 22 is a cross-sectional view illustrating a semiconductor device.

The cross-sectional structure of the pixel 101(m, n) illustrated in FIG. 22 is as follows. The gate insulating film 127 is a stack of an insulating film 226 formed using a nitride insulating film and an insulating film 227 formed using an oxide insulating film and only the insulating film 226 is provided in a region where at least the oxide semiconductor film 119 is provided. With such a structure, the nitride insulating film for forming the insulating film 226 is in contact with the bottom surface of the oxide semiconductor film 119, so that the oxide semiconductor film 119 can have n-type conductivity and a higher conductivity. FIG. 5 can be referred to for the top view corresponding to FIG. 22. In this case, a dielectric film of the capacitor 245 is the insulating films 129, 131, and 132. As the insulating films 226 and 227, the insulating films which can be used as the gate insulating film 127 can be used as appropriate, and the insulating film 227 may be formed using an insulating film similar to the insulating film 132. Further, to obtain this structure, the insulating film 227 is processed as appropriate with reference to Embodiment 1.

In the structure illustrated in FIG. 22, the top surface of the oxide semiconductor film 119 may be in contact with the insulating film 132. That is, regions of the insulating films 129 and 131 in FIG. 22, which are in contact with the oxide semiconductor film 119, may be removed. In that case, a dielectric film of the capacitor is the insulating film 132. When the top and bottom surfaces of the oxide semiconductor film 119 are in contact with the nitride insulating film, the oxide semiconductor film 119 can be made to have n-type conductivity and a higher conductivity more efficiently and sufficiently than the oxide semiconductor film 119, only one of the surfaces of which is in contact with the nitride insulating film.

With the structure illustrated in FIG. 22, a reduction in thickness of the oxide semiconductor film 119 due to etching of the insulating film 129 and the insulating film 131 can be prevented; thus, the yield of the semiconductor device is improved as compared with the semiconductor device illustrated in FIG. 18 and FIG. 19.

Accordingly, a semiconductor film is formed as one electrode of a capacitor in the same process as a semiconductor film of a transistor, whereby a semiconductor device in which the aperture ratio is increased and the capacitance of the capacitor is increased can be manufactured. For example, when the pixel density of the semiconductor device is also about 300 ppi, the aperture ratio of the pixel can be 50% or higher, 55% or higher, or even 60% or higher in this embodiment. Further, an increase in aperture ratio can result in a semiconductor device with excellent display quality.

Further, oxygen vacancies and impurities such as hydrogen and nitrogen in the semiconductor film (specifically, the oxide semiconductor film) of the transistor are reduced, so that the semiconductor device of one embodiment of the present invention has favorable electric characteristics.

Note that the structure and the like described in this embodiment can be used as appropriate in combination with any of the structures and the modification examples in the other embodiments.

Embodiment 3

In this embodiment, a semiconductor device of one embodiment of the present invention, which has a structure different from those described in the above embodiment, will be described with reference to drawings. Note that in this embodiment, a liquid crystal display device is described as an example of the semiconductor device of one embodiment of the present invention. In the semiconductor device described in this embodiment, a semiconductor film (specifically, an oxide semiconductor film) serving as one electrode of a capacitor is different from that in the above embodiment. The above embodiment can be referred to for components in the semiconductor device in this embodiment, which are similar to those of the semiconductor device in the above embodiment.

<Structure of Semiconductor Device>

Figure 23:
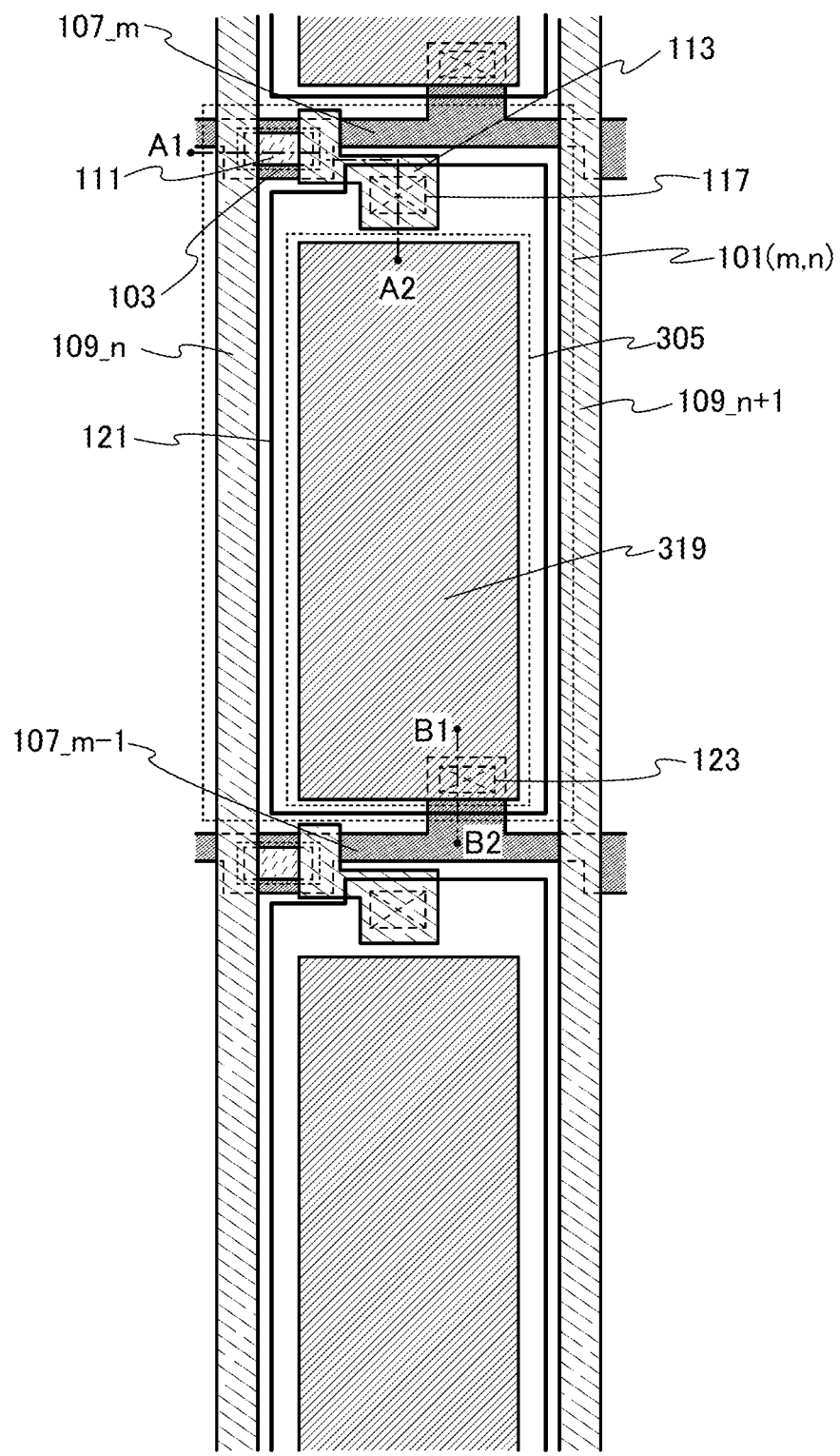
FIG. 23 is a top view illustrating a semiconductor device.

FIG. 23 illustrates a top view of a pixel illustrated in this embodiment. The pixel 101(m, n) illustrated in FIG. 23 includes a capacitor 305. The capacitor 305 is provided in a region surrounded by the scan line 107_m, the scan line 107_m−1, the signal line 109_n, and the signal line 109n+1. The capacitor 305 includes an oxide semiconductor film 319 having higher electrical conductivity than the oxide semiconductor film 111 and a light-transmitting property, the pixel electrode 121 having a light-transmitting property, and an insulating film having a light-transmitting property (not illustrated in FIG. 23) which is included in the transistor 103 as a dielectric film. That is, the capacitor 305 has a light-transmitting property. Further, since the oxide semiconductor film 319 is in contact with the scan line 107_m−1 through the opening 123, the capacitor 305 is electrically connected to the scan line 107_m−1.

The conductivity of the oxide semiconductor film 319 is higher than or equal to 10 S/cm and lower than or equal to 1000 S/cm, preferably higher than or equal to 100 S/cm and lower than or equal to 1000 S/cm. The oxide semiconductor film 319 has such a high conductivity and thus can sufficiently serve as the electrode of the capacitor.

Since the capacitor 305 transmits light, the capacitor can be formed in the entire operation area of the liquid crystal element, and thus the capacitor can be formed large (in a large area) as much as possible in the pixel. As long as the capacitance that can sufficiently operate the liquid crystal element can be ensured, the pixel density can be increased to have a high resolution.

Since the capacitor 305 has larger capacitance per unit area than the capacitor 105 described in Embodiment 1, the area of the oxide semiconductor film which is necessary to obtain the capacitance equivalent to that of the capacitor 105 can be small. Accordingly, a region on which the oxide semiconductor film 319 is not formed can be obtained in the pixel 101(m, n) illustrated in FIG. 23. Thus, light extraction efficiency (transmittance) of a light source such as a backlight can be improved in the semiconductor device of one embodiment of the present invention and as a result, the display quality can be improved.

Figure 24:
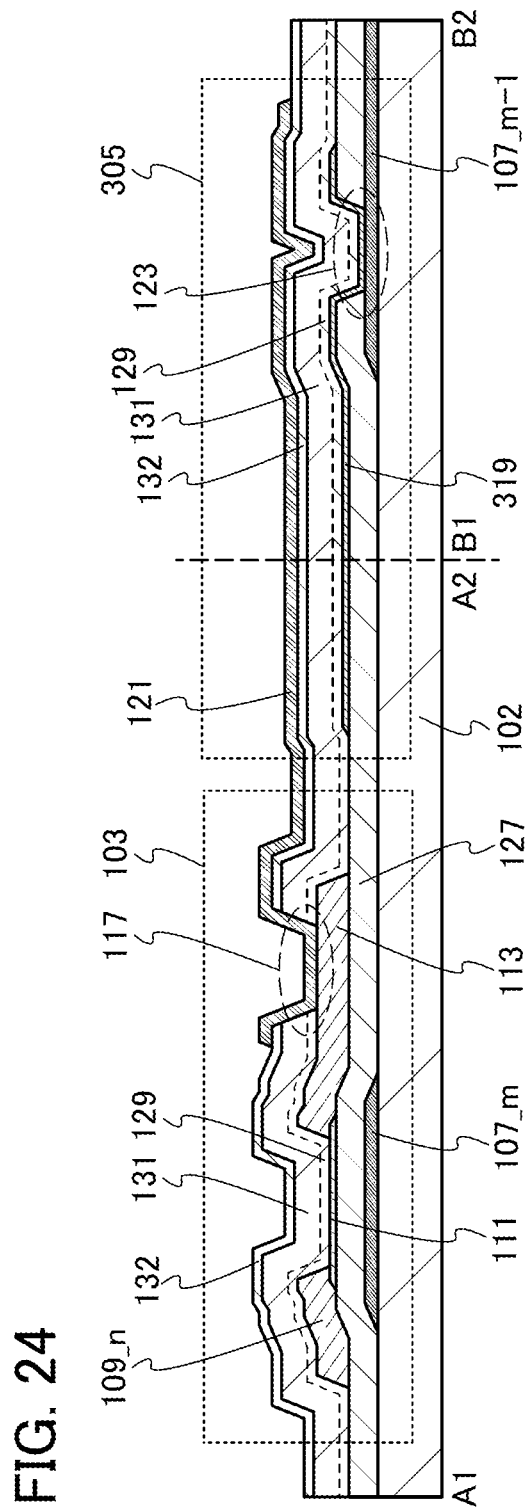
FIG. 24 is a cross-sectional view illustrating a semiconductor device.

A cross-sectional view taken along dashed-dotted line A1-A2 and dashed-dotted line B1-B2 in FIG. 23 is illustrated in FIG. 24.

A cross-sectional structure of the pixel 101(m, n) illustrated in FIG. 23 is as follows. Over a substrate 102, the scan line 107_m and the scan line 107m−1 each including a region serving as the gate electrode are provided. The gate insulating film 127 is provided over the scan line 107_m−1 and the scan line 107_m. The oxide semiconductor film 111 is provided over the gate insulating film 127 to overlap with the scan line 107_m. The opening 123 which reaches the scan line 107_m−1 is provided in a part of the gate insulating film 127, which is in contact with the scan line 107_m−1. The oxide semiconductor film 319 is provided over the gate insulating film 127 and in the opening 123. The signal line 109_n including a region serving as the source electrode and the conductive film 113 including a region serving as the drain electrode are each provided over the oxide semiconductor film 111 and the gate insulating film 127. An insulating film 129, an insulating film 131, and an insulating film 132 serving as protective insulating films of the transistor 103 are provided over the gate insulating film 127, the signal line 109_n, the oxide semiconductor film 111, the conductive film 113, and the oxide semiconductor film 319. The opening 117 which reaches the conductive film 113 is provided in the insulating film 129, the insulating film 131, and the insulating film 132, and the pixel electrode 121 is provided in the opening 117 and over the insulating film 132. Note that a base insulating film may be provided between the substrate 102, and the scan lines 107 and the gate insulating film 127.

In the capacitor 305, the oxide semiconductor film 319 which has n-type conductivity and includes a region having higher electrical conductivity than the oxide semiconductor film 111 serves as one electrode of a pair of electrodes, the pixel electrode 121 serves as the other of the pair of electrodes, and the insulating film 129, the insulating film 131, and the insulating film 132 collectively serve as the dielectric film provided between the pair of electrodes.

For the oxide semiconductor film 319, an oxide semiconductor that can be used for the oxide semiconductor film 111 can be used. Since the oxide semiconductor film 319 can be formed by utilizing the formation process of the oxide semiconductor film 111, the oxide semiconductor film 319 contains a metal element of an oxide semiconductor included in the oxide semiconductor film 111. Further, the oxide semiconductor film 319 includes a region having higher electrical conductivity than the oxide semiconductor film 111 which means that the oxide semiconductor film 319 contains an element (dopant) which increases the electrical conductivity. Specifically, the oxide semiconductor film 319 contains one or more selected from boron, nitrogen, fluorine, aluminum, phosphorus, arsenic, indium, tin, antimony, and a rare gas element as the dopant. The concentration of a dopant contained in the oxide semiconductor film 319 is preferably greater than or equal to $1 \times 10^{19}$ atoms/cm$^3$ and less than or equal to $1 \times 10^{22}$ atoms/cm$^3$, in which case the conductivity of the oxide semiconductor film 319 can be greater than or equal to 10 S/cm and less than or equal to 1000 S/cm, preferably greater than or equal to 100 S/cm and less than or equal to 1000 S/cm, so that the oxide semiconductor film 319 can sufficiently serve as one electrode of the capacitor 305. Note that the oxide semiconductor film 319 has n-type conductivity and has a high conductivity because of including the above element (dopant); thus, the oxide semiconductor film 319 can be called a conductive film.

Further, in the semiconductor device of this embodiment, the oxide semiconductor film 319 serving as one electrode of the capacitor 305 has n-type conductivity and high electrical conductivity as in Embodiment 2; thus, the threshold voltage (Vth) shifts in the negative direction. Accordingly, the operation method of the capacitor 305 is similar to that in Embodiment 2.

<Method for Manufacturing Semiconductor Device>

Next, a method for manufacturing a semiconductor device of this embodiment is described with reference to FIGS. 25A and 25B and FIGS. 26A and 26B.

The scan lines 107_m−1 and 107_m each serving as a gate electrode are formed over the substrate 102. An insulating film which is to be processed into the gate insulating film 127 is formed so as to cover the substrate 102, the scan line 107_m−1, and the scan line 107_m. The opening 123 is formed in a region of the insulating film, which is in contact with the scan line 107_m−1, so that the gate insulating film 127 is formed. The oxide semiconductor film 111 is formed so as to overlap with the scan line 107_m. The oxide semiconductor film 119 is formed over the gate insulating film 127 and in the opening 123 so as to overlap with a region on which the pixel electrode 121 to be formed (see FIG. 25A). Note that the above steps can be performed with reference to Embodiment 1.

Next, a dopant is added to the oxide semiconductor film 119 to form the oxide semiconductor film 319, and then the signal line 109_n including a region serving as the source electrode and the conductive film 113 including a region serving as the drain electrode are formed (see FIG. 25B).

A method of adding a dopant to the oxide semiconductor film 119 is as follows: a mask is provided in a region except the oxide semiconductor film 119 and one or more dopants selected from boron, nitrogen, fluorine, aluminum, phosphorus, arsenic, indium, tin, antimony, and a rare gas element is added to the oxide semiconductor film 119 by an ion implantation method, an ion doping method, or the like. Alternatively, the oxide semiconductor film 119 may be exposed to plasma containing the dopant to add the dopant to the oxide semiconductor film 119, instead of employing an ion implantation method or an ion doping method. Note that heat treatment may be performed after the dopant is added to the oxide semiconductor film 119. The heat treatment can be performed as appropriate with reference to the details of the heat treatment for dehydration or dehydrogenation of the oxide semiconductor film 111 and the oxide semiconductor film 119 in Embodiment 1.

The step of adding the dopant may be performed after formation of the signal line 109_n and the conductive film 113.

Next, the insulating film 128 is formed over the gate insulating film 127, the signal line 109_n, the oxide semiconductor film 111, the conductive film 113, and the oxide semiconductor film 319. The insulating film 130 is formed over the insulating film 128, and the insulating film 133 is formed over the insulating film 130 (see FIG. 26A). The above steps can be performed with reference to Embodiment 1.

Next, the opening 117 reaching the conductive film 113 is formed in the insulating films 128, 130, and 133 to form the insulating films 129, 131, and 132 (see FIG. 26B). The pixel electrode 121 in contact with the conductive film 113 through the opening 117 is formed (see FIG. 24). The above steps can be performed with reference to Embodiment 1.

Through the above process, the semiconductor device in this embodiment can be manufactured.

Accordingly, a semiconductor film is formed as one electrode of a capacitor in the same process as a semiconductor film of a transistor, whereby a semiconductor device in which the aperture ratio is increased and the capacitance of the capacitor is increased can be manufactured. For example, when the pixel density of the semiconductor device is also about 300 ppi, the aperture ratio of the pixel can be 50% or higher, 55% or higher, or even 60% or higher in this embodiment. Further, an increase in aperture ratio can result in a semiconductor device with excellent display quality.

Further, oxygen vacancies and impurities such as hydrogen and nitrogen in the semiconductor film (specifically, the oxide semiconductor film) of the transistor are reduced, so that the semiconductor device of one embodiment of the present invention has favorable electric characteristics.

Note that the structure and the like described in this embodiment can be used as appropriate in combination with any of the structures in the other embodiments.

Embodiment 4

In this embodiment, one embodiment applicable to an oxide semiconductor film, which is a semiconductor film, in the transistor and the capacitor included in the semiconductor device described in the above embodiment will be described.

The oxide semiconductor film is preferably formed using any of an amorphous oxide semiconductor, a single crystal oxide semiconductor, a polycrystalline oxide semiconductor, and an oxide semiconductor including a crystalline portion (a c-axis aligned crystalline oxide semiconductor (CAAC-OS)).

A crystal part included in the CAAC-OS fits inside a cube whose one side is less than 100 nm. In an observation image obtained with a transmission electron microscope (TEM), a boundary between crystal parts in the CAAC-OS is not clear. Further, with the TEM, a grain boundary in the CAAC-OS is not found. Thus, in the CAAC-OS, a reduction in electron mobility, due to the grain boundary, is suppressed.

In each of the crystal parts included in the CAAC-OS, a c-axis is aligned in a direction parallel to a normal vector of a surface where the CAAC-OS is formed or a normal vector of a surface of the CAAC-OS, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°. Nitrogen may be substituted for part of constituent oxygen of the oxide semiconductor.

In the CAAC-OS, distribution of crystal parts is not necessarily uniform. For example, in the formation process of the CAAC-OS, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS, crystallinity of the crystal part in a region to which the impurity is added is lowered in some cases. Accordingly, when the concentration of impurities (silicon or carbon as a typical example) in the CAAC-OS is less than or equal to 1 atomic %, preferably less than or equal to 0.6 atomic %, a CAAC-OS having high crystallinity can be formed.

Since the c-axes of the crystalline portions included in the CAAC-OS are aligned in the direction parallel to a normal vector of a surface where the CAAC-OS is formed or a normal vector of a surface of the CAAC-OS, the directions of the c-axes may be different from each other depending on the shape of the CAAC-OS (the cross-sectional shape of the surface where the CAAC-OS is formed or the cross-sectional shape of the surface of the CAAC-OS). Note that when the CAAC-OS is formed, the direction of c-axis of the crystal part is the direction parallel to a normal vector of the surface where the CAAC-OS is formed or a normal vector of the surface of the CAAC-OS. The crystal part is formed by film formation or by performing treatment for crystallization such as heat treatment after film formation.

There are three methods for forming a CAAC-OS.

The first method is to form an oxide semiconductor film at a temperature higher than or equal to 100° C. and lower than or equal to 450° C., whereby crystal parts in which the c-axes are aligned in the direction parallel to a normal vector of a surface on which the oxide semiconductor film is formed or a normal vector of a surface of the oxide semiconductor film are formed in the oxide semiconductor film.

The second method is to form an oxide semiconductor film with a small thickness and then heat it at a temperature higher than or equal to 200° C. and lower than or equal to 700° C., whereby crystal parts in which the c-axes are aligned in the direction parallel to a normal vector of a surface on which the oxide semiconductor film is formed or a normal vector of a surface of the oxide semiconductor film are formed in the oxide semiconductor film.

The third method is to form a first oxide semiconductor film with a small thickness, then heat it at a temperature higher than or equal to 200° C. and lower than or equal to 700° C., and form a second oxide semiconductor film, whereby crystal parts in which the c-axes are aligned in the direction parallel to a normal vector of a surface on which the oxide semiconductor film is formed or a normal vector of a surface of the oxide semiconductor film are formed in the oxide semiconductor film.

In a transistor using the CAAC-OS for an oxide semiconductor film, variations in electric characteristics of the transistor due to irradiation with visible light or ultraviolet light is small. Thus, the transistor using the CAAC-OS for the oxide semiconductor film has high reliability.

For example, it is preferable that the CAAC-OS is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle or the pellet-like sputtered particle reaches a surface on which the CAAC-OS is formed while maintaining its crystal state, whereby the CAAC-OS can be deposited.

For the deposition of the CAAC-OS, the following conditions are preferably employed.

By reducing the amount of impurities entering the CAAC-OS during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is lower than or equal to −80° C., preferably lower than or equal to −100° C. is used.

By increasing the heating temperature of the surface on which the CAAC-OS is formed (e.g., the substrate heating temperature) during the deposition, migration of a sputtered particle is likely to occur after the sputtered particle reaches the surface on which the CAAC-OS is formed. Specifically, the temperature of the surface on which the CAAC-OS is formed during the deposition is higher than or equal to 100° C. and lower than or equal to 740° C., preferably higher than or equal to 150° C. and lower than or equal to 500° C. By increasing the temperature of the surface on which the CAAC-OS is formed during the deposition, when the flat-plate-like or pellet-like sputtered particle reaches the surface on which the CAAC-OS is formed, migration occurs on the surface on which the CAAC-OS is formed, so that a flat plane of the sputtered particle is attached to the surface on which the CAAC-OS is formed.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the sputtering target, an In—Ga—Zn—O compound target is described below.

The polycrystalline In—Ga—Zn-based metal oxide target is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. This pressure treatment may be performed while cooling is performed or may be performed while heating is performed. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Further, the oxide semiconductor film may have a structure in which a plurality of oxide semiconductor films are stacked. For example, the oxide semiconductor film may have a stacked-layer structure of a first oxide semiconductor film and a second oxide semiconductor film which are formed using metal oxides with different compositions. For example, the first oxide semiconductor film may be formed using one of an oxide containing two kinds of metals, an oxide containing three kinds of metals, and an oxide containing four kinds of metals, and the second oxide semiconductor film may be formed using one of the above which is different from the one used for the first oxide semiconductor film.

Alternatively, the oxide semiconductor film may have a two-layer structure of the first oxide semiconductor film and the second oxide semiconductor film, in which the constituent elements thereof are made the same and the atomic ratios of the constituent elements of the first oxide semiconductor film and the second oxide semiconductor film are made different. For example, the first oxide semiconductor film may contain In, Ga, and Zn at an atomic ratio of 3:1:2, and the second oxide semiconductor film may contain In, Ga, and Zn at an atomic ratio of 1:1:1. Alternatively, the first oxide semiconductor film may contain In, Ga, and Zn at an atomic ratio of 2:1:3, and the second oxide semiconductor film may contain In, Ga, and Zn at an atomic ratio of 1:3:2. Note that a proportion of each atom in the atomic ratio of the oxide semiconductor film varies within a range of ±20% as an error.

At this time, in one of the first oxide semiconductor film and the second oxide semiconductor film, which is closer to the gate electrode (on the channel side), the atomic ratio of In to Ga preferably satisfies the relation In≥Ga. In the other oxide semiconductor film, which is farther from the gate electrode (on the back channel side), the atomic ratio of In to Ga preferably satisfies the relation In≤Ga. With a stacked-layer structure of these oxide semiconductor films, a transistor having high field-effect mobility can be formed. On the other hand, the atomic ratio of In to Ga in the oxide semiconductor film closer to the gate electrode (the oxide semiconductor film on the channel side) satisfies the relation In<Ga and the atomic ratio of In to Ga in the oxide semiconductor film on the back channel side satisfies the relation In≥Ga, whereby the amount of change of the threshold voltage of a transistor due to change over time or a reliability test can be reduced.

The first oxide semiconductor film containing In, Ga, and Zn at an atomic ratio of 1:3:2 can be formed by a sputtering method using an oxide target with an atomic ratio of 1:3:2 under the conditions where the substrate temperature is room temperature and a sputtering gas is argon or a mixed gas of argon and oxygen. The second oxide semiconductor film containing In, Ga, and Zn at an atomic ratio of 3:1:2 can be formed by a sputtering method using an oxide target with an atomic ratio of 3:1:2 in a manner similar to that of the first oxide semiconductor film.

Further, the oxide semiconductor film may have a three-layer structure of a first oxide semiconductor film, a second oxide semiconductor film, and a third oxide semiconductor film, in which the constituent elements thereof are made the same and the atomic ratios of the constituent elements of the first oxide semiconductor film, the second oxide semiconductor film, and the third oxide semiconductor film are made different. The case where the oxide semiconductor film has a three-layer structure is described with reference to FIG. 27.

Figure 27:
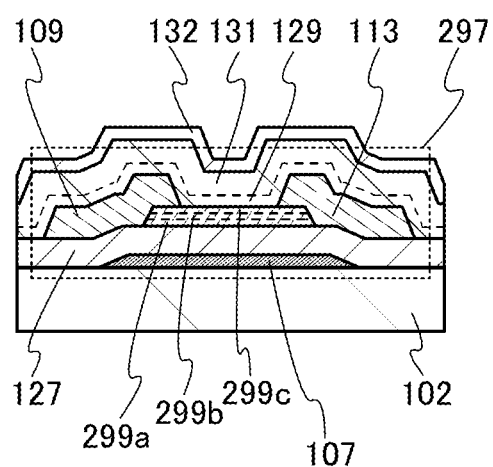
FIG. 27 is a cross-sectional view illustrating a transistor applicable to a semiconductor device.

In a transistor 297 illustrated in FIG. 27, a first oxide semiconductor film 299a, a second oxide semiconductor film 299b, and a third oxide semiconductor film 299c are stacked in this order from the gate insulating film 127 side. As a material of the first oxide semiconductor film 299a and the third oxide semiconductor film 299c, a material represented by $InM1_xZn_yO_z$ (x≥1, y>1, z>0, M1 is Ga, Hf, or the like) is used. Note that in the case where a material of each of the first oxide semiconductor film 299a and the third oxide semiconductor film 299c contains Ga, a material containing a high proportion of Ga, specifically, a material which can be represented by $InM1_xZn_yO_z$ where x is larger than 10 is unsuitable because powder might be generated in deposition. Note that the structure of the transistor 297 is the same as those of the transistors described in the above embodiments (e.g., the transistor 103 in Embodiment 1) except that the first oxide semiconductor film 299a, the second oxide semiconductor film 299b, and the third oxide semiconductor film 299c are included.

As a material of the second oxide semiconductor film 299b, a material which can be represented by $InM2_xZn_yO_z$ (x≥1, y≥x, z>0, M2 is Ga, Sn, or the like) is used.

Materials of the first oxide semiconductor film 299a, the second oxide semiconductor film 299b, and the third oxide semiconductor film 299c are selected as appropriate so that a well structure is formed in which the conduction band of the second oxide semiconductor film 299b is deeper from the vacuum level than the conduction bands of the first oxide semiconductor film 299a and the third oxide semiconductor film 299c.

As described in Embodiment 1, in the oxide semiconductor film, silicon or carbon, which belongs to Group 14, causes generation of electrons serving as carriers, leading to an increase in carrier density. Therefore, silicon or carbon contained in an oxide semiconductor film makes it n-type. Thus, the concentration of silicon contained in oxide semiconductor films and the concentration of carbon contained in oxide semiconductor films are each less than or equal to $3\times10^{18}/cm^3$, preferably less than or equal to $3\times10^{17}/cm^3$. It is particularly preferable to employ a structure where the first oxide semiconductor film 299a and the third oxide semiconductor film 299c sandwich or surround the second oxide semiconductor film 299b serving as a carrier path so that a large number of Group 14 elements do not enter the second oxide semiconductor film 299b. That is, the first oxide semiconductor film 299a and the third oxide semiconductor film 299c can also be called barrier films which prevent Group 14 elements such as silicon and carbon from entering the second oxide semiconductor film 299b.

For example, the first oxide semiconductor film 299a may contain In, Ga, and Zn at an atomic ratio of 1:3:2, the second oxide semiconductor film 299b may contain In, Ga, and Zn at an atomic ratio of 3:1:2, and the third oxide semiconductor film 299c may contain In, Ga, and Zn at an atomic ratio of 1:1:1. Note that the third oxide semiconductor film 299c can be formed by a sputtering method using an oxide target containing In, Ga, and Zn at an atomic ratio of 1:1:1.

Alternatively, a three-layer structure may be employed in which the first oxide semiconductor film 299a contains In, Ga, and Zn at an atomic ratio of 1:3:2, the second oxide semiconductor film 299b contains In, Ga, and Zn at an atomic ratio of 1:1:1 or 1:3:2, and the third oxide semiconductor film 299c contains In, Ga, and Zn at an atomic ratio of 1:3:2.

Since the constituent elements of the first oxide semiconductor film 299a, the second oxide semiconductor film 299b, and the third oxide semiconductor film 299c are the same, the second oxide semiconductor film 299b has fewer defect states (trap levels) at the interface with the first oxide semiconductor film 299a. Specifically, the defect states (trap levels) are fewer than defect states at the interface between the gate insulating film 127 and the first oxide semiconductor film 299a. For this reason, when the oxide semiconductor films are stacked in the above manner, the amount of change of the threshold voltage of a transistor due to change over time or a reliability test can be reduced.

Further, when materials of the first oxide semiconductor film 299a, the second oxide semiconductor film 299b, and the third oxide semiconductor film 299c are selected as appropriate so that a well structure is formed in which the conduction band of the second oxide semiconductor film 299b is deeper from the vacuum level than the conduction bands of the first oxide semiconductor film 299a and the third oxide semiconductor film 299c, the field-effect mobility of the transistor can be increased and the amount of change of the threshold voltage of the transistor due to change over time or a reliability test can be reduced.

Further, the first oxide semiconductor film 299a, the second oxide semiconductor film 299b, and the third oxide semiconductor film 299c may be formed using oxide semiconductors having different crystallinity. That is, the oxide semiconductor film may be formed using a combination of any of a single crystal oxide semiconductor, a polycrystalline oxide semiconductor, an amorphous oxide semiconductor, and a CAAC-OS, as appropriate. When an amorphous oxide semiconductor is applied to any one of the first oxide semiconductor film 299a, the second oxide semiconductor film 299b, and the third oxide semiconductor film 299c, internal stress or external stress of the oxide semiconductor film can be relieved, variations in electric characteristics of the transistors can be reduced, and the amount of change of the threshold voltage of the transistor due to change over time or a reliability test can be reduced.

At least the second oxide semiconductor film 299b, which can serve as a channel formation region, is preferably a CAAC-OS film. An oxide semiconductor film on the back channel side, in this embodiment, the third oxide semiconductor film 299c is preferably an amorphous oxide semiconductor film or a CAAC-OS film. With such a structure, the amount of change of the threshold voltage of a transistor due to change over time or a reliability test can be reduced.

Note that the structure and the like described in this embodiment can be used as appropriate in combination with any of the structures in the other embodiments.

Embodiment 5

A semiconductor device (also referred to as a display device) having a display function can be manufactured using the transistor and the capacitor examples of which are shown in the above embodiments. Moreover, some or all of driver circuits which include the transistor can be formed over a substrate where a pixel portion is formed, whereby a system-on-panel can be obtained. In this embodiment, an example of a display device using the transistor examples of which are shown in the above embodiments is described with reference to the drawings. FIG. 29 is a cross-sectional view illustrating a cross-sectional structure taken along dashed-dotted line X1-X2 in FIG. 28B. Note that in FIG. 29, only part of the structure of a pixel portion is illustrated.

Figure 28A:
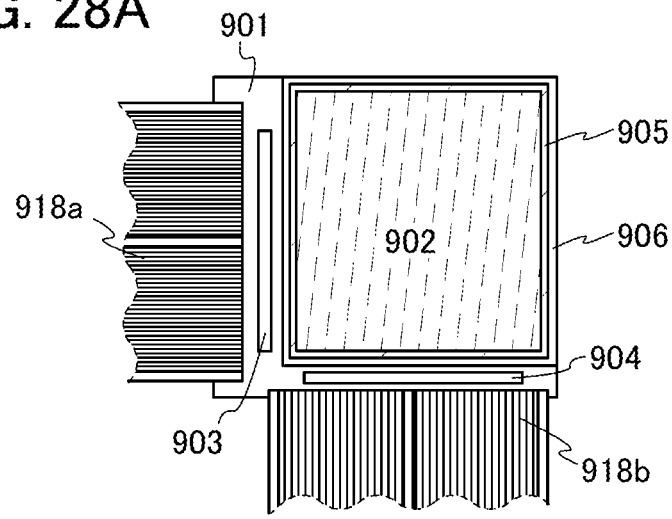
FIGS. 28A to 28C are top views each illustrating a semiconductor device.

In FIG. 28A, a sealant 905 is provided so as to surround a pixel portion 902 provided over a first substrate 901, and the pixel portion 902 is sealed with a second substrate 906. In FIG. 28A, a signal line driver circuit 903 and a scan line driver circuit 904 are each formed using a single crystal semiconductor or a polycrystalline semiconductor over a substrate prepared separately, and mounted in a region different from the region surrounded by the sealant 905 over the first substrate 901. Further, various signals and potentials are supplied to the signal line driver circuit 903, the scan line driver circuit 904, and the pixel portion 902 from a flexible printed circuit (FPC) 918.

Figure 28B:
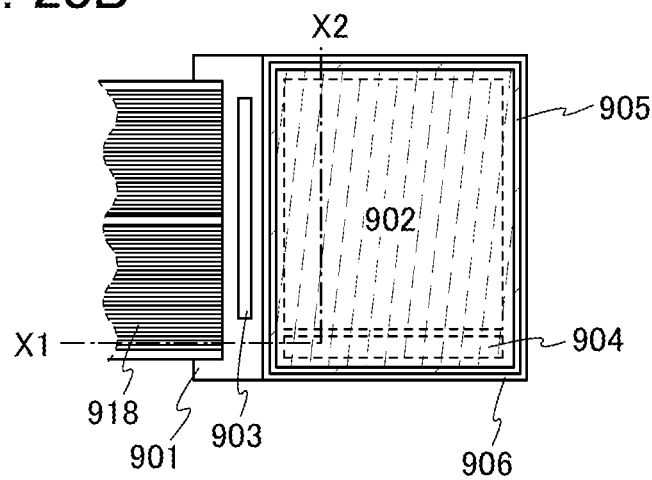
Figure 28C:
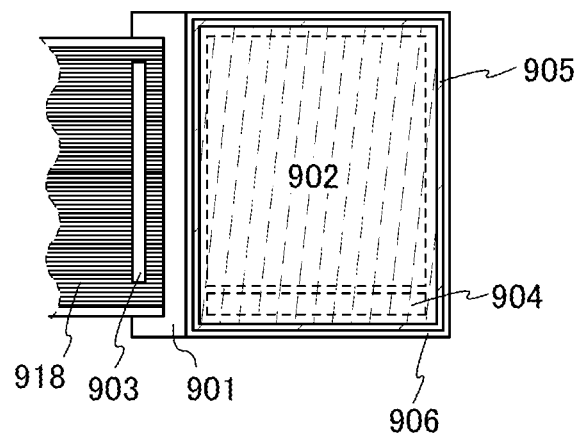
Figure 29:
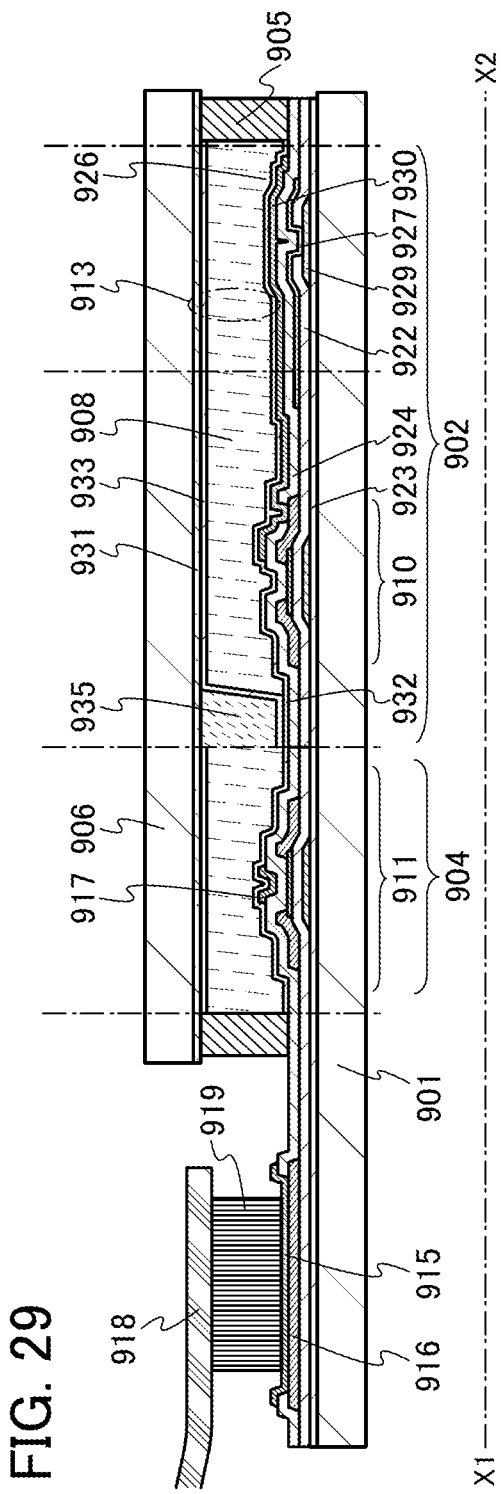
FIG. 29 is a cross-sectional view illustrating a semiconductor device.

In FIGS. 28B and 28C, the sealant 905 is provided so as to surround the pixel portion 902 and the scan line driver circuit 904 which are provided over the first substrate 901. The second substrate 906 is provided over the pixel portion 902 and the scan line driver circuit 904. Thus, the pixel portion 902 and the scan line driver circuit 904 are sealed together with a display element by the first substrate 901, the sealant 905, and the second substrate 906. In FIGS. 28B and 28C, a signal line driver circuit 903 which is formed using a single crystal semiconductor or a polycrystalline semiconductor over a substrate separately prepared is mounted in a region different from the region surrounded by the sealant 905 over the first substrate 901. In FIGS. 28B and 28C, various signals and potentials are supplied to the signal line driver circuit 903, the scan line driver circuit 904, and the pixel portion 902 from an FPC 918.

Although FIGS. 28B and 28C each illustrate an example in which the signal line driver circuit 903 is formed separately and mounted on the first substrate 901, one embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be employed. FIG. 28A illustrates an example in which the signal line driver circuit 903 and the scan line driver circuit 904 are mounted by a COG method. FIG. 28B illustrates an example in which the signal line driver circuit 903 is mounted by a COG method. FIG. 28C illustrates an example in which the signal line driver circuit 903 is mounted by a TAB method.

The display device includes in its category a panel in which a display element is sealed and a module in which an IC including a controller or the like is mounted on the panel.

A display device in this specification refers to an image display device, a display device, or a light source (including a lighting device). Further, the display device also includes the following modules in its category: a module to which a connector such as an FPC or a TCP is attached; a module having a TCP at the tip of which a printed wiring board is provided; and a module in which an integrated circuit (IC) is directly mounted on a display element by a COG method.

The pixel portion 902 and the scan line driver circuit 904 provided over the first substrate 901 include a plurality of transistors and any of the transistors which are described in the above embodiments can be applied.

As the display element provided in the display device, a liquid crystal element (also referred to as a liquid crystal display element) or a light-emitting element (also referred to as a light-emitting display element) can be used. A light-emitting element includes, in its scope, an element whose luminance is controlled by current or voltage, and specifically includes an organic electroluminescent (EL) element, an inorganic EL element, and the like. Further, a display medium whose contrast is changed by an electric effect, such as electronic ink, can be used. An example of a liquid crystal display device using a liquid crystal element as the display element is illustrated in FIG. 29.

The liquid crystal display device illustrated in FIG. 29 is a display device of a vertical electric field mode. A liquid crystal display device includes a connection terminal electrode 915 and a terminal electrode 916. The connection terminal electrode 915 and the terminal electrode 916 are electrically connected to a terminal included in the FPC 918 through an anisotropic conductive agent 919.

The connection terminal electrode 915 is formed using the same conductive film as a first electrode 930, and the terminal electrode 916 is formed using the same conductive film as a source electrode and a drain electrode of each of a transistor 910 and a transistor 911.

Each of the pixel portion 902 and the scan line driver circuit 904 which are provided over the first substrate 901 includes a plurality of transistors. The transistor 910 included in the pixel portion 902 and the transistor 911 included in the scan line driver circuit 904. An insulating film 924 corresponding to the insulating films 129, 131, and 132 described in Embodiment 1 is provided over oxide semiconductor films of the transistors 910 and 911. Note that an insulating film 923 is an insulating film serving as a base film.

In this embodiment, any of the transistors described in the above embodiments can be used as the transistors 910 and 911. A capacitor 926 is formed using an oxide semiconductor film 927, the insulating film 924, and the first electrode 930. Note that the oxide semiconductor film 927 is electrically connected to a scan line 929 serving as a capacitor line through an opening formed in a gate insulating film 922. The scan line 929 is formed using the same conductive film as scan lines including regions serving as gate electrodes of the transistors 910 and 911. Although a capacitor having the structure described in Embodiment 1 is illustrated in the drawing as the capacitor 926 here, a capacitor having the structure described in any of other embodiments can be used as appropriate.

Further, an example in which a conductive film 917 is provided in a region of the insulating film 924 in the transistor 911 included in the scan line driver circuit 904 so as to overlap with a channel formation region of the oxide semiconductor film is illustrated. The conductive film 917 can supply a potential and can serve as the gate electrode of the transistor 911. This means that the transistor 911 is a dual-gate transistor. Note that the conductive film 917 can be formed using the same conductive film as the first electrode 930. In addition, the width of the conductive film 917 in the channel length direction can be shorter than the distance between the source electrode and the drain electrode of the transistor 911.

Owing to the conductive film 917, a variation in gate voltage (rising gate voltage) at which on-current starts flowing at different drain voltages can be reduced in the transistor 911 included in the scan line driver circuit 904. Further, with the conductive film 917, current which flows in a region of the oxide semiconductor film on the conductive film 917 side and between the source electrode and the drain electrode of the transistor 911 can be controlled. Accordingly, variations in electric characteristics between a plurality of transistors included in the scan line driver circuit 904 can be reduced. In addition, when the potential of the conductive film 917 is the same or substantially the same as the minimum potential of the scan line driver circuit 904 of the transistor 911, a variation in threshold voltage of the transistor 911 can be reduced; thus, the reliability of the transistor 911 can be improved. Note that the minimum potential of the scan line driver circuit 904 is the lowest potential among potentials supplied for operating the scan line driver circuit 904. In the case where the potential of the source electrode of the transistor 911 is used as a reference of the potential supplied for operating the scan line driver circuit 904, for example, the potential of the source electrode (Vss) is the minimum potential.

In addition, the conductive film 917 has a function of blocking an external electric field. In other words, the conductive film 917 has a function of preventing an external electric field (particularly, a function of preventing static electricity) from affecting the inside (a circuit portion including the transistor). The function of preventing static electricity of the conductive film 917 can suppress variations in electric characteristics of the transistor 911 due to the influence of an external electric field such as static electricity; thus, the reliability of the transistor 911 can be improved. Although the transistor included in the scan line driver circuit is illustrated in FIG. 29, a transistor included in a signal line driver circuit can also be a dual-gate transistor similarly to the transistor 911. In the case where a dual-gate transistor is used as the transistor included in the signal line driver circuit, the transistor has an effect similar to that of the transistor 911.

Accordingly, the semiconductor device (display device) of one embodiment of the present invention has high reliability.

Figure 30A:
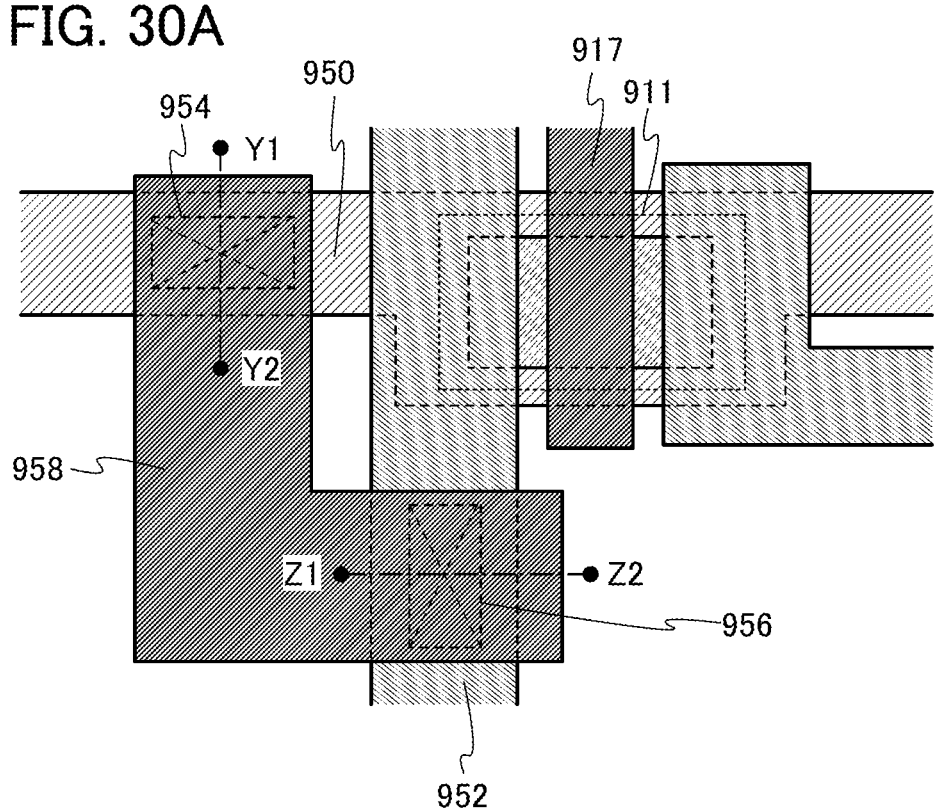
FIGS. 30A and 30B are a top view and a cross-sectional view illustrating part of a scan line driver circuit of a semiconductor device.

Here, a structure of a transistor included in the semiconductor device (display device) of one embodiment of the present invention, for example, a plurality of transistors included in the scan line driver circuit 904, in which a wiring including a gate electrode and a wiring including a source electrode or a drain electrode are electrically connected to each other through a conductive film is described. FIG. 30A illustrates a top view of the structure and FIG. 30B illustrates a cross-sectional view taken along dashed-dotted line Y1-Y2 and dashed-dotted line Z1-Z2 in FIG. 30A.

As illustrated in FIG. 30A, a wiring 950 including the gate electrode of the transistor 911 and a wiring 952 including the source electrode or the drain electrode of the transistor 911 are in contact with a conductive film 958 provided in an opening 954 and an opening 956.

Figure 30B:
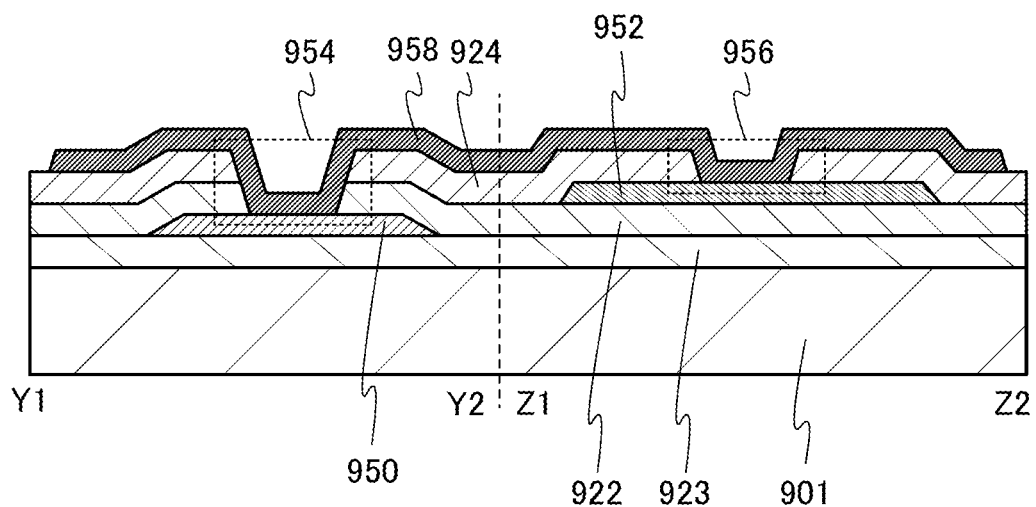

As shown in the cross-sectional structure in FIG. 30B, the insulating film 923 is provided over the first substrate 901, the gate insulating film 922 is provided over the wiring 950 and the insulating film 923, the wiring 952 is provided over the gate insulating film 922, and the insulating film 924 is provided over the gate insulating film 922 and the wiring 952. Further, in a region along dashed-dotted line Y1-Y2, the opening 954 which reaches the wiring 950 is provided in the gate insulating film 922 and the insulating film 924. In a region along dashed-dotted line Z1-Z2, the opening 956 which reaches the wiring 952 is provided in the insulating film 924. Furthermore, the conductive film 958 is provided over the insulating film 924 and in the opening 954 and the opening 956.

According to the above, the wiring 950 including the gate electrode and the wiring 952 including the source electrode or the drain electrode are electrically connected to each other through the conductive film 958.

The conductive film 958 can be formed by utilizing the formation process of the conductive film 917 of the transistor 911.

The opening 954 and the opening 956 can be formed at the same time. The details are as follows. An insulating film which is to be processed into the gate insulating film 922 is formed over the wiring 950, the wiring 952 is formed over the insulating film, and an insulating film which is to be processed into the insulating film 924 is formed over the wiring 952. After that, a mask is formed over the insulating film 924, and the insulating films are processed using the mask to form the opening 954 and the opening 956. A resist mask can be used as the mask. The insulating films can be processed by dry etching. When the wiring 950 is formed using a metal material or the like, the selectivity ratio of the wiring 950 and the gate insulating film 922 with respect to the wiring 950 can be high; thus, the opening 954 and the opening 956 can be formed at the same time by the dry etching.

The transistor 910 included in the pixel portion 902 is electrically connected to a display element.

A liquid crystal element 913 which is a display element includes the first electrode 930, a second electrode 931, and a liquid crystal 908. Note that an insulating film 932 and an insulating film 933 which serve as an alignment film are provided so that the liquid crystal 908 is provided therebetween. The second electrode 931 is provided on the second substrate 906 side. The second electrode 931 overlaps with the first electrode 930 with the liquid crystal 908 provided therebetween. For the liquid crystal element 913, the description of the liquid crystal element 108 in Embodiment 1 can be referred to. The first electrode 930 corresponds to the pixel electrode 121 in Embodiment 1, the second electrode 931 corresponds to the counter electrode 154 in Embodiment 1, the liquid crystal 908 corresponds to the liquid crystal 160 in Embodiment 1, the insulating film 932 corresponds to the alignment film 158 in Embodiment 1, and the insulating film 933 corresponds to the alignment film 156 in Embodiment 1.

The first electrode 930 and the second electrode 931 (each of which are also referred to as a pixel electrode, a common electrode, a counter electrode, or the like) for applying voltage to the display element can have light-transmitting properties or light-reflecting properties, which depends on the direction in which light is extracted, the position where the electrodes are provided, and the pattern structure of the electrodes.

The first electrode 930 and the second electrode 931 can be formed using, as appropriate, a material similar to that of the pixel electrode 121 and the counter electrode 154 of Embodiment 1.

A spacer 935 is a columnar spacer obtained by selective etching of an insulating film and is provided in order to control the distance between the first electrode 930 and the second electrode 931 (a cell gap). Alternatively, a spherical spacer may be used.

The first substrate 901 and the second substrate 906 are fixed in place by a sealant 905. As the sealant 905, an organic resin such as a thermosetting resin or a photocurable resin can be used. In addition, the sealant 905 is in contact with the insulating film 924.

In the semiconductor device (display device) of one embodiment of the present invention, a light-shielding film (black matrix); an optical member (an optical substrate) such as a polarizing member, a retardation member, or an anti-reflection member; and the like are provided as appropriate. For example, circular polarization may be obtained by using a polarizing substrate and a retardation substrate. In addition, a backlight, a side light, or the like may be used as a light source.

Since the transistor is easily broken owing to static electricity or the like, a protective circuit for protecting the driver circuit is preferably provided. The protection circuit is preferably formed using a nonlinear element.

Figure 31A:
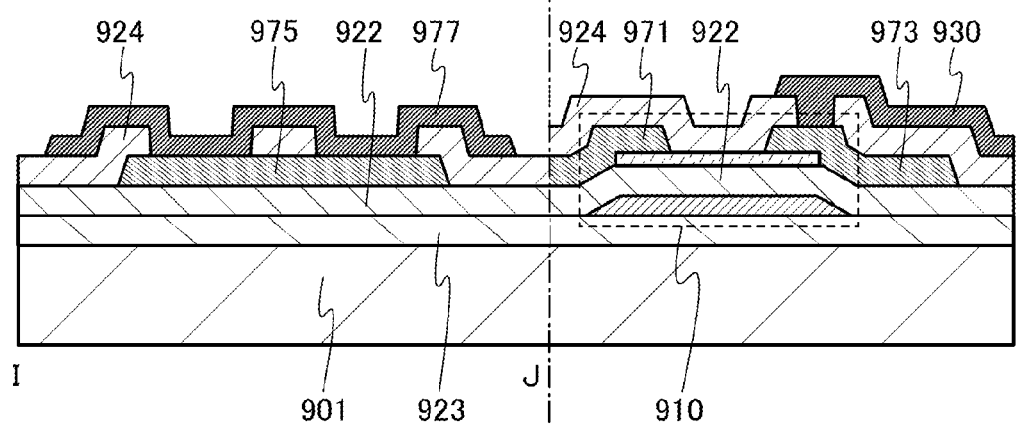
FIGS. 31A to 31C are a top view and cross-sectional views each illustrating a common connection portion of a semiconductor device.
Figure 31B:
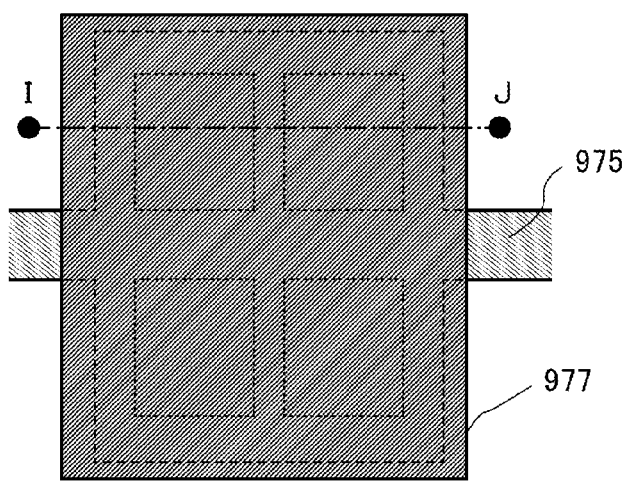
Figure 31C:
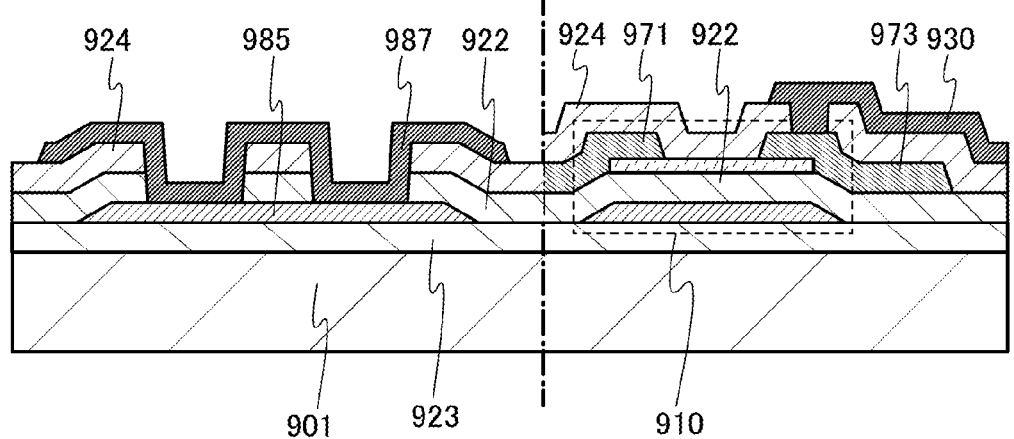

FIGS. 31A to 31C illustrate an example of the display device in FIGS. 28A to 28C and FIG. 29 in which a common connection portion (pad portion) for being electrically connected to the second electrode 931 provided on the second substrate 906 is formed over the first substrate 901.

The common connection portion is provided in a position overlapping with the sealant for bonding the first substrate 901 and the second substrate 906, and is electrically connected to the second electrode 931 through conductive particles contained in the sealant. Alternatively, the common connection portion is provided in a position not overlapping with the sealant (except for the pixel portion) and a paste including conductive particles is provided separately from the sealant so as to overlap with the common connection portion, whereby the common connection portion is electrically connected to the second electrode 931.

FIG. 31A is a cross-sectional view of the common connection portion taken along line I-J in the top view in FIG. 31B.

A common potential line 975 is provided over a gate insulating film 922 and is formed using the same material and through the same steps as a source electrode 971 or a drain electrode 973 of the transistor 910 illustrated in FIGS. 31A to 31C.

Further, the common potential line 975 is covered with the insulating film 924, and the insulating film 924 has a plurality of openings at a position overlapping with the common potential line 975. These openings are formed through the same steps as a contact hole which connects the first electrode 930 and one of the source electrode 971 and the drain electrode 973 of the transistor 910.

Further, the common potential line 975 is connected to a common electrode 977 through the openings. The common electrode 977 is provided over the insulating film 924 and is formed using the same material and through the same steps as the connection terminal electrode 915 and the first electrode 930 in the pixel portion.

In this manner, the common connection portion can be formed through the same formation process as the switching element in the pixel portion 902.

The common electrode 977 is an electrode in contact with the conductive particles contained in the sealant, and is electrically connected to the second electrode 931 of the second substrate 906.

Alternatively, as illustrated in FIG. 31C, a common potential line 985 may be formed using the same material and through the same steps as the gate electrode of the transistor 910.

In the common connection portion illustrated in FIG. 31C, the common potential line 985 is provided under the gate insulating film 922 and the insulating film 924; and the gate insulating film 922 and the insulating film 924 have a plurality of openings at a position overlapping with the common potential line 985. These openings are formed by etching the insulating film 924 through the same steps as a contact hole which connects the first electrode 930 and one of the source electrode 971 and the drain electrode 973 of the transistor 910, and then by further selectively etching the gate insulating film 922.

Further, the common potential line 985 is connected to a common electrode 987 through the openings. The common electrode 987 is provided over the insulating film 924 and is formed using the same material and through the same steps as the connection terminal electrode 915 and the first electrode 930 in the pixel portion.

Accordingly, a semiconductor film is formed as one electrode of a capacitor in the same process as a semiconductor film of a transistor, whereby a semiconductor device in which the aperture ratio is increased and the capacitance of the capacitor is increased can be manufactured. For example, when the pixel density of the semiconductor device is also about 300 ppi, the aperture ratio of the pixel can be 50% or higher, 55% or higher, or even 60% or higher in this embodiment. Further, an increase in aperture ratio can result in a semiconductor device with excellent display quality.

Further, oxygen vacancies and impurities such as hydrogen and nitrogen in the semiconductor film (specifically, the oxide semiconductor film) of the transistor are reduced, so that the semiconductor device of one embodiment of the present invention has favorable electric characteristics.

Note that the structure and the like described in this embodiment can be used as appropriate in combination with any of the structures in the other embodiments.

Embodiment 6

The semiconductor device of one embodiment of the present invention can be applied to any of a variety of electronic devices (including game machines). Examples of electronic devices include television sets (also referred to as televisions or television receivers), monitors of computers, cameras such as digital cameras or digital video cameras, digital photo frames, mobile phones, portable game consoles, portable information terminals, audio reproducing devices, game machines (e.g., pachinko machines or slot machines), housings of game machines, and the like. Examples of such electronic devices are illustrated in FIGS. 32A to 32C.

Figure 32A:
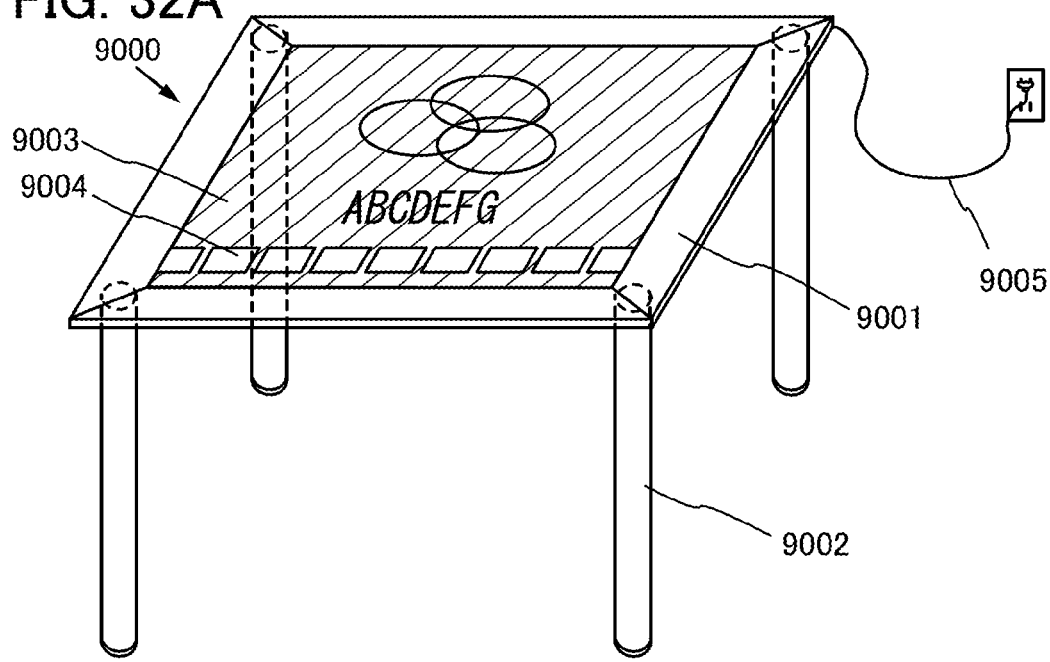
FIGS. 32A to 32C each illustrate an electronic device including a semiconductor device.
Figure 32B:
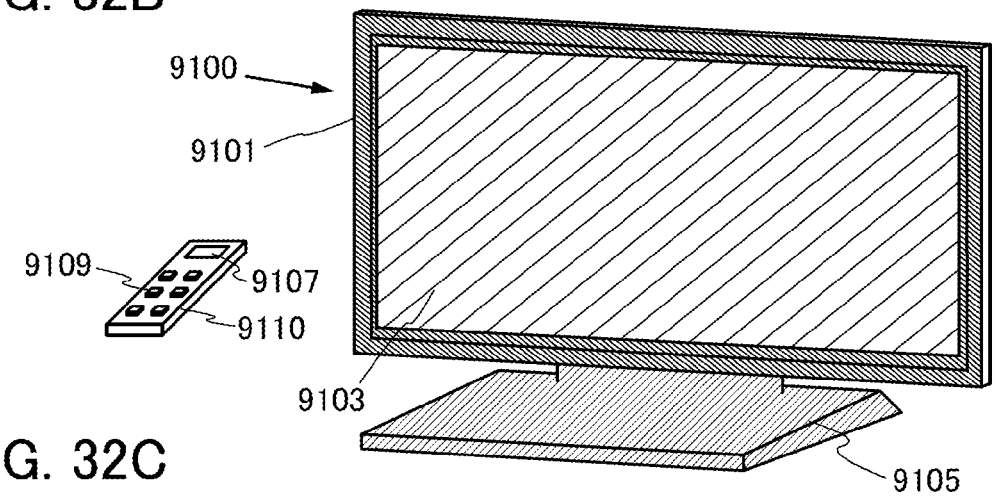
Figure 32C:
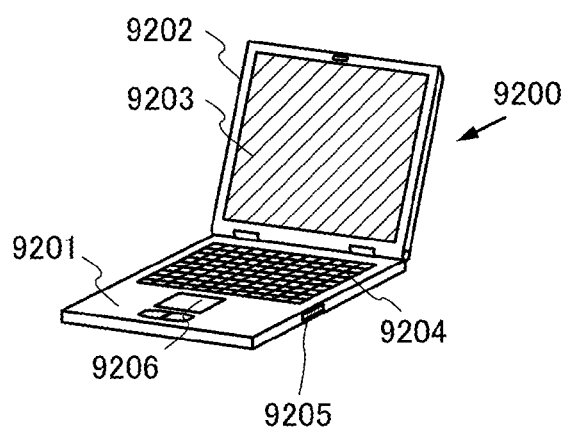

FIG. 32A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The semiconductor device described in any of the above embodiments can be used for the display portion 9003. Thus, the display quality of the display portion 9003 can be improved.

The display portion 9003 has a touch-input function. When a user touches displayed buttons 9004 which are displayed on the display portion 9003 of the table 9000 with his/her finger or the like, the user can carry out operation of the screen and input of information. Further, when the table 9000 may be made to communicate with home appliances or control the home appliances, the table 9000 may serve as a control device which controls the home appliances by operation on the screen. For example, with the use of a semiconductor device having an image sensor function, the display portion 9003 can have a touch-input function.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

FIG. 32B illustrates a television set 9100. In the television set 9100, a display portion 9103 is incorporated in a housing 9101 and an image can be displayed on the display portion 9103. Note that here, the housing 9101 is supported by a stand 9105.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Further, the remote controller 9110 may be provided with a display portion 9107 for displaying data output from the remote controller 9110.

The television set 9100 illustrated in FIG. 32B is provided with a receiver, a modem, and the like. With the use of the receiver, the television set 9100 can receive general TV broadcasts. Moreover, when the television set 9100 is connected to a communication network with or without wires via the modem, one-way (from a sender to a receiver) or two-way (between a sender and a receiver or between receivers) information communication can be performed.

The semiconductor device described in any of the above embodiments can be used for the display portions 9103 and 9107. Thus, the display quality of the television set can be improved.

FIG. 32C illustrates a computer 9200. The computer 9200 includes a main body 9201, a housing 9202, a display portion 9203, a keyboard 9204, an external connection port 9205, a pointing device 9206, and the like.

The semiconductor device described in any of the above embodiments can be used for the display portion 9203. Thus, the display quality of the computer can be improved.

Figure 33A:
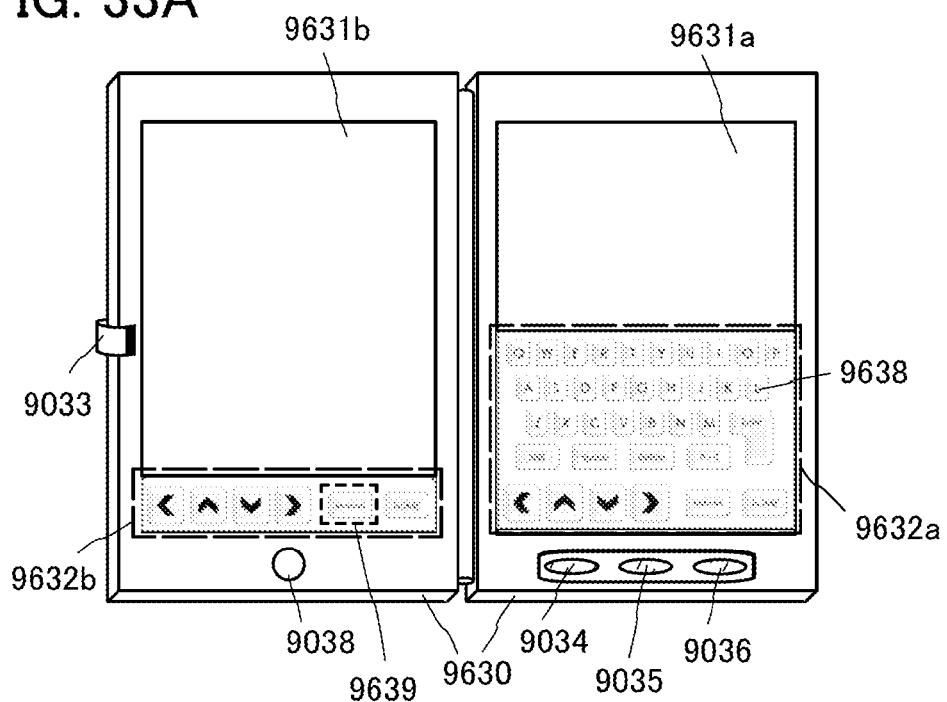
FIGS. 33A to 33C illustrate an electronic device including a semiconductor device.
Figure 33B:
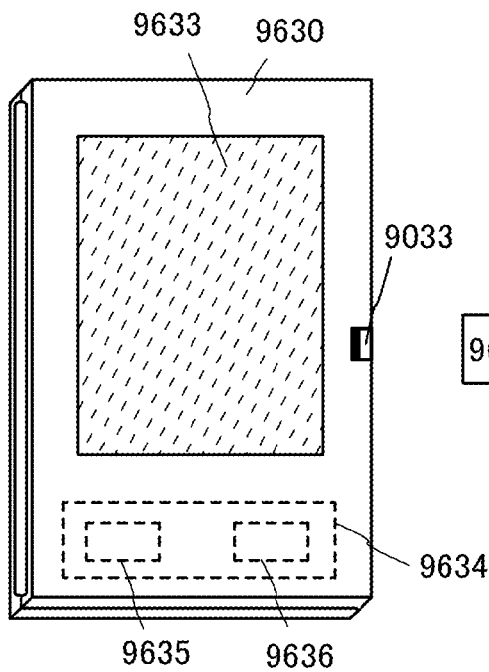

FIGS. 33A and 33B illustrate a foldable tablet terminal. In FIG. 33A, the tablet terminal is opened, and includes a housing 9630, a display portion 9631a, a display portion 9631b, a display-mode switching button 9034, a power button 9035, a power-saving-mode switching button 9036, a clip 9033, and an operation button 9038.

The semiconductor device described in any of the above embodiments can be used for the display portion 9631a and the display portion 9631b. Thus, the display quality of the tablet terminal can be improved.

Part of the display portion 9631a can be a touch panel region 9632a, and data can be input by touching operation keys 9638 that are displayed. Note that FIG. 33A shows, as an example, that half of the area of the display portion 9631a has only a display function, and the other half of the area has a touch panel function. However, the structure of the display portion 9631a is not limited to this, and all the area of the display portion 9631a may have a touch panel function. For example, all the area of the display portion 9631a can display keyboard buttons and serve as a touch panel while the display portion 9631b can be used as a display screen.

In the display portion 9631b, as in the display portion 9631a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The display-mode switching button 9034 allows switching between a portrait mode and a landscape mode, and between monochrome display and color display, for example. With the power-saving-mode switching button 9036 for switching to power-saving mode, the luminance of display can be optimized in accordance with the amount of external light at the time when the tablet terminal is in use, which is sensed with an optical sensor incorporated in the tablet terminal. The tablet terminal may include another detection device such as a sensor for detecting orientation (e.g., a gyroscope or an acceleration sensor) in addition to the optical sensor.

Although the display portion 9631a and the display portion 9631b have the same display area in FIG. 33A, one embodiment of the present invention is not limited to this example. The display portion 9631a and the display portion 9631b may have different areas or different display quality. For example, one of them may be a display panel that can display higher-definition images than the other.

FIG. 33B illustrates the tablet terminal folded, which includes the housing 9630, a solar battery 9633, and a charge and discharge control circuit 9634. Note that FIG. 33B illustrates an example in which the charge and discharge control circuit 9634 includes a battery 9635 and a DCDC converter 9636.

Since the tablet terminal can be foldable, the housing 9630 can be closed when the tablet terminal is not in use. Thus, the display portions 9631a and 9631b can be protected, whereby a tablet terminal with high endurance and high reliability for long-term use can be provided.

The tablet terminal illustrated in FIGS. 33A and 33B can also have a function of displaying a variety of kinds of data (e.g., a still image, a moving image, and a text image), a function of displaying a calendar, a date, the time, or the like on the display portion, a touch-input function of operating or editing data displayed on the display portion by touch input, a function of controlling processing by a variety of kinds of software (programs), and the like.

The solar battery 9633, which is attached to the surface of the tablet terminal, supplies electric power to a touch panel, a display portion, an image signal processor, and the like. Note that the solar battery 9633 can be provided on one or both surfaces of the housing 9630, so that the battery 9635 can be charged efficiently. When a lithium ion battery is used as the battery 9635, there is an advantage of downsizing or the like.

Figure 33C:
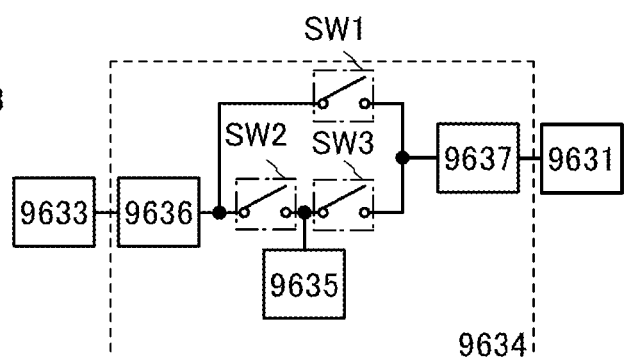

The structure and operation of the charge and discharge control circuit 9634 illustrated in FIG. 33B are described with reference to a block diagram of FIG. 33C. The solar battery 9633, the battery 9635, the DCDC converter 9636, a converter 9637, switches SW1, SW2, and SW3, and the display portion 9631 are illustrated in FIG. 33C, and the battery 9635, the DCDC converter 9636, the converter 9637, and the switches SW1 to SW3 correspond to the charge and discharge control circuit 9634 illustrated in FIG. 33B.

First, an example of operation in the case where power is generated by the solar battery 9633 using external light is described. The voltage of power generated by the solar battery 9633 is raised or lowered by the DCDC converter 9636 so that a voltage for charging the battery 9635 is obtained. When the display portion 9631 operates with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and the switch SW2 is turned on so that charge of the battery 9635 may be performed.

Here, the solar battery 9633 is illustrated as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module which is capable of charging by transmitting and receiving power by wireless (without contact), or another charging means may be used in combination.

Note that the structure and the like described in this embodiment can be used as appropriate in combination with any of the structures and the like in the other embodiments.

Example 1

In this example, the resistances of an oxide semiconductor film and a multilayer film will be described with reference to FIGS. 34A to 34D and FIG. 35.

First, the structure of a sample is described with reference to FIGS. 34A to 34D.

Figure 34A:
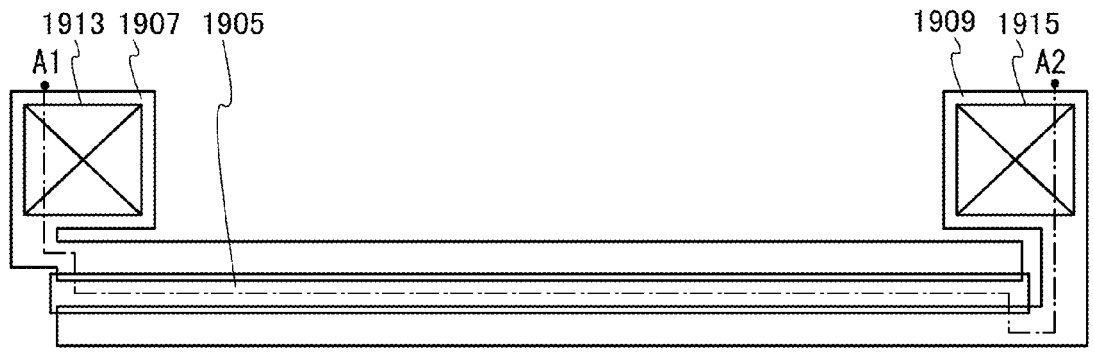
FIGS. 34A to 34D each illustrate a structure of a sample.
Figure 34B:
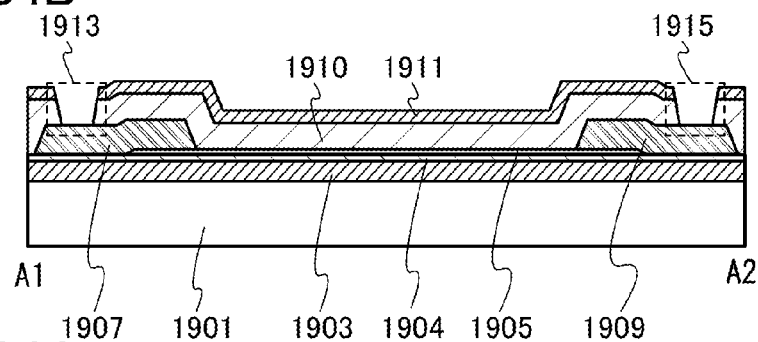
Figure 34C:
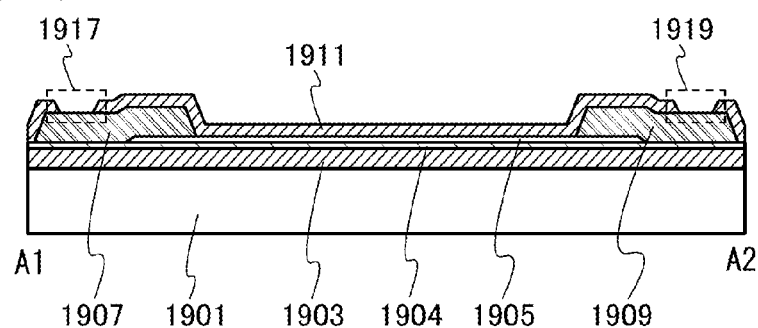
Figure 34D:
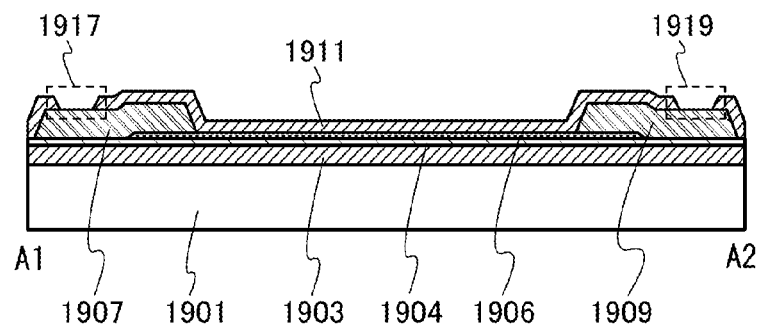

FIG. 34A is a top view of a sample 1, a sample 2, a sample 3, and a sample 4, and FIGS. 34B to 34D are cross-sectional views taken along dashed-and-dotted line A1-A2 in FIG. 34A. Note that the top views of the samples 1 to 4 are the same, and the cross-sectional views thereof are different because the stacked-layer structures of the cross sections are different. The cross-sectional views of the sample 1, the sample 2, and the samples 3 and 4 are illustrated in FIG. 34B, FIG. 34C, and FIG. 34D, respectively.

As for the sample 1, an insulating film 1903 is formed over a glass substrate 1901, an insulating film 1904 is formed over the insulating film 1903, and an oxide semiconductor film 1905 is formed over the insulating film 1904. The both ends of the oxide semiconductor film 1905 are covered with a conductive film 1907 and a conductive film 1909 each serving as an electrode, and the oxide semiconductor film 1905 and the conductive films 1907 and 1909 are covered with an insulating film 1910 and an insulating film 1911. Note that an opening 1913 and an opening 1915 are provided in the insulating films 1910 and 1911, and the conductive film 1907 and the conductive film 1909 are exposed through the opening 1913 and the opening 1915, respectively.

As for the sample 2, the insulating film 1903 is formed over the glass substrate 1901, the insulating film 1904 is formed over the insulating film 1903, and the oxide semiconductor film 1905 is formed over the insulating film 1904. The both ends of the oxide semiconductor film 1905 are covered with the conductive films 1907 and 1909 each serving as an electrode, and the oxide semiconductor film 1905 and the conductive films 1907 and 1909 are covered with the insulating film 1911. Note that an opening 1917 and an opening 1919 are provided in the insulating film 1911, and the conductive film 1907 and the conductive film 1909 are exposed through the opening 1917 and the opening 1919, respectively.

In each of the samples 3 and 4, the insulating film 1903 is formed over the glass substrate 1901, the insulating film 1904 is formed over the insulating film 1903, and a multilayer film 1906 is formed over the insulating film 1904. The both ends of the multilayer film 1906 are covered with the conductive films 1907 and 1909 each serving as an electrode, and the multilayer film 1906 and the conductive films 1907 and 1909 are covered with the insulating film 1911. Note that the openings 1917 and 1919 are provided in the insulating film 1911, and the conductive film 1907 and the conductive film 1909 are exposed through the opening 1917 and the opening 1919, respectively.

As described above, the structures of the insulating films in contact with the top surface of the oxide semiconductor film 1905 or the multilayer film 1906 are different in the samples 1 to 4. In the sample 1, the oxide semiconductor film 1905 and the insulating film 1910 are in contact with each other; in the sample 2, the oxide semiconductor film 1905 and the insulating film 1911 are in contact with each other; and in the samples 3 and 4, the multilayer film 1906 and the insulating film 1911 are in contact with each other.

Next, methods for forming the samples are described.

First, a method for forming the sample 1 is described.

A 400-nm-thick silicon nitride film was formed as the insulating film 1903 over the glass substrate 1901 by a plasma CVD method.

Next, a 50-nm-thick silicon oxynitride film was formed as the insulating film 1904 over the insulating film 1903 by a plasma CVD method.

Next, a 35-nm-thick IGZO film was formed as the oxide semiconductor film 1905 over the insulating film 1904 by a sputtering method using a metal oxide target containing In, Ga, and Zn at an atomic ratio of 1:1:1. Then, etching treatment was performed on the IGZO film with a mask formed through a photolithography process, so that the oxide semiconductor film 1905 was formed.

Next, the conductive films 1907 and 1909 were formed over the insulating film 1904 and the oxide semiconductor film 1905 in such a manner that a 50-nm-thick tungsten film, a 400-nm-thick aluminum film, and a 100-nm-thick titanium film were stacked in this order by a sputtering method, and were then subjected to etching treatment with a mask formed through a photolithography process.

Next, a 450-nm-thick silicon oxynitride film was formed as the insulating film 1910 over the insulating film 1904, the oxide semiconductor film 1905, the conductive film 1907, and the conductive film 1909 by a plasma CVD method, and then heat treatment was performed at 350° C. under a mixed atmosphere of nitrogen and oxygen for one hour.

Next, a 50-nm-thick silicon nitride film was formed as the insulating film 1911 over the insulating film 1910 by a plasma CVD method.

Next, a mask is formed over the insulating film 1911 through a photolithography process and then etching treatment was performed on the insulating film 1911, so that the openings 1913 and 1915 were formed in the insulating films 1910 and 1911.

Through the above process, the sample 1 was formed.

Next, a method for forming the sample 2 is described.

Next, a 450-nm-thick silicon oxynitride film was formed as the insulating film 1910 over the insulating film 1904, the oxide semiconductor film 1905, the conductive film 1907, and the conductive film 1909 of the sample 1 by a plasma CVD method, and then heat treatment was performed at 350° C. under a mixed atmosphere of nitrogen and oxygen for one hour. After that, the insulating film 1910 was removed.

Next, a 50-nm-thick silicon nitride film was formed as the insulating film 1911 over the insulating film 1904, the oxide semiconductor film 1905, the conductive film 1907, and the conductive film 1909 by a plasma CVD method.

Next, a mask is formed over the insulating film 1911 through a photolithography process and then etching treatment was performed on the insulating film 1911, so that the openings 1917 and 1919 were formed in the insulating film 1911.

Through the above process, the sample 2 was formed.

Next, a method for forming the sample 3 is described.

As for the sample 3, the multilayer film 1906 was used instead of the oxide semiconductor film 1905 of the sample 2. The multilayer film 1906 was formed over the insulating film 1904 in such a manner that a 10-nm-thick IGZO film with a metal oxide target containing In, Ga, and Zn at an atomic ratio of 1:3:2, a 10-nm-thick IGZO film with a metal oxide target containing In, Ga, and Zn at an atomic ratio of 1:1:1, and then a 10-nm-thick IGZO film with a metal oxide target containing In, Ga, and Zn at an atomic ratio of 1:3:2 were successively formed by a sputtering method. Then, etching treatment was performed on the stacked IGZO films with a mask formed through a photolithography process, so that the multilayer film 1906 was formed.

Through the above process, the sample 3 was formed.

Next, a method for forming the sample 4 is described.

As for the sample 4, the multilayer film 1906 was used instead of the oxide semiconductor film 1905 of the sample 2. The multilayer film 1906 was formed over the insulating film 1904 in such a manner that a 20-nm-thick IGZO film with a metal oxide target containing In, Ga, and Zn at an atomic ratio of 1:3:2, a 15-nm-thick IGZO film with a metal oxide target containing In, Ga, and Zn at an atomic ratio of 1:1:1, and then a 10-nm-thick IGZO film using a metal oxide target containing In, Ga, and Zn at an atomic ratio of 1:3:2 were successively formed by a sputtering method. Then, etching treatment was performed on the stacked IGZO films with a mask formed through a photolithography process, so that the multilayer film 1906 was formed.

Through the above process, the sample 4 was formed.

Next, the sheet resistance of the oxide semiconductor film 1905 provided in each of the samples 1 and 2 and the sheet resistance of the multilayer film 1906 provided in each of the samples 3 and 4 were measured. In the sample 1, a probe is made contact with the openings 1913 and 1915 to measure the sheet resistance of the oxide semiconductor film 1905. In each of the samples 2 to 4, a probe is made contact with the openings 1917 and 1919 to measure the sheet resistance of the oxide semiconductor film 1905 or the multilayer film 1906. Note that in the oxide semiconductor film 1905 in each of the samples 1 and 2 and the multilayer film 1906 in each of the samples 3 and 4, the widths of the conductive films 1907 and 1909 facing each other were each 1 mm and the distance between the conductive films 1907 and 1909 was 10 µm. Further, in each of the samples 1 to 4, the potential of the conductive film 1907 was a ground potential, and 1 V was applied to the conductive film 1909.

Figure 35:
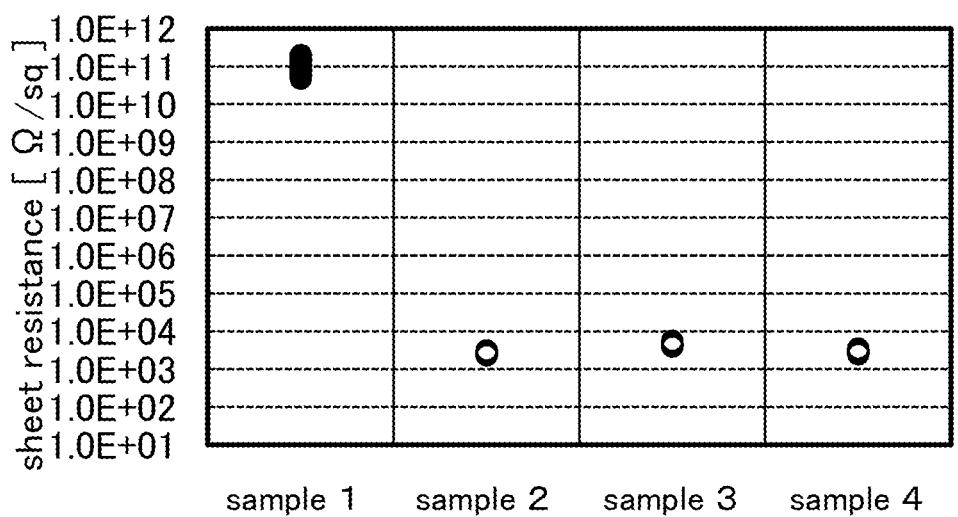
FIG. 35 is a diagram for illustrating sheet resistance.

FIG. 35 shows the sheet resistance of the samples 1 to 4.

The sheet resistance of the sample 1 was about $1\times10^{11}$ Ω/sq. The sheet resistance of the sample 2 was about 2620 Ω/sq. The sheet resistance of the sample 3 was about 4410 Ω/sq. The sheet resistance of the sample 4 was about 2930 Ω/sq.

In the above manner, the oxide semiconductor films 1905 and the multilayer films 1906 have different values of sheet resistance because the insulating films in contact with the oxide semiconductor film 1905 and the insulating films in contact with the multilayer film 1906 were different.

Note that when the above sheet resistances of the samples 1 to 4 were converted into resistivity, the resistivities of the sample 1, the sample 2, the sample 3, and the sample 4 were $3.9\times10^5$ Ωcm, $9.3\times10^{-3}$ Ωcm, $1.3\times10^{-2}$ Ωcm, and $1.3\times10^{-2}$ Ωcm, respectively.

In the sample 1, the silicon oxynitride film used as the insulating film 1910 was formed in contact with the top surface of the oxide semiconductor film 1905 and apart from the silicon nitride film used as the insulating film 1911. On the other hand, the silicon nitride film used as the insulating film 1911 was formed in contact with the top surface of the oxide semiconductor film 1905 in the sample 2 and was formed in contact with the top surface of the multilayer film 1906 in each of the samples 3 and 4. When the oxide semiconductor film 1905 or the multilayer film 1906 is thus provided in contact with the silicon nitride film used as the insulating film 1911, defects typified by oxygen vacancies are generated in the oxide semiconductor film 1905 or the multilayer film 1906, and hydrogen contained in the silicon nitride film is transferred to or diffused into the oxide semiconductor film 1905 or the multilayer film 1906. Accordingly, the conductivity of the oxide semiconductor film 1905 or the multilayer film 1906 is improved.

For example, in the case where an oxide semiconductor film is used for a channel formation region of a transistor, it is preferable to employ a structure in which a silicon oxynitride film is provided in contact with the oxide semiconductor film as shown in the sample 1. Further, as a light-transmitting conductive film used for an electrode of a capacitor, it is preferable to employ a structure in which a silicon nitride film is provided in contact with an oxide semiconductor film or a multilayer film as shown in the samples 2 to 4. With such a structure, even when an oxide semiconductor film or a multilayer film which is used for a channel formation region of a transistor and an oxide semiconductor film or a multilayer film which is used for an electrode of a capacitor are formed through the same process, the resistivity of the oxide semiconductor film and the resistivity of the multilayer film can be made different from each other.

Next, the sheet resistance values of the samples 2 and 3 which were preserved under a high-temperature high-humidity environment were measured. The conditions of the samples used here are described below. Note that here, the conditions are partly different from those of the samples 2 and 3. Thus, samples which have the same structure as the samples 2 and 3 and which were formed under the different formation conditions are referred to as a sample 2a and a sample 3a.

First, a method for forming the sample 2a is described.

The insulating film 1903 and the insulating film 1904 were formed over the glass substrate 1901.

Next, a 35-nm-thick IGZO film was formed as the oxide semiconductor film 1905 over the insulating film 1904 by a sputtering method using a metal oxide target containing In, Ga, and Zn at an atomic ratio of 1:1:1. Then, etching treatment was performed on the IGZO film with a mask formed through a photolithography process and then heat treatment was performed at 350° C. or 450° C., so that the oxide semiconductor film 1905 was formed.

Next, the conductive film 1907 and the conductive film 1909 were formed over the insulating film 1904 and the oxide semiconductor film 1905 in such a manner that a 50-nm-thick titanium film and a 400-nm-thick copper film were stacked in this order by a sputtering method, and were then subjected to etching treatment with a mask formed through a photolithography process.

Next, a 450-nm-thick silicon oxynitride film was formed as the insulating film 1910 over the insulating film 1904, the oxide semiconductor film 1905, the conductive film 1907, and the conductive film 1909 by a plasma CVD method, and then heat treatment was performed at 350° C. under a mixed atmosphere of nitrogen and oxygen for one hour.

Next, a 50-nm-thick silicon nitride film was formed as the insulating film 1911 over the insulating film 1904, the oxide semiconductor film 1905, the conductive film 1907, and the conductive film 1909 by a plasma CVD method. Note that the film formation temperature of the silicon nitride film was 220° C. or 350° C.

Next, a mask is formed over the insulating film 1911 through a photolithography process and then etching treatment was performed on the insulating film 1911, so that the opening 1917 and 1919 were formed in the insulating films 1910 and 1911.

Through the above process, the sample 2a was formed.

Next, a method for forming the sample 3a is described.

As for the sample 3a, the multilayer film 1906 was used instead of the oxide semiconductor film 1905 of the sample 2a. The multilayer film 1906 was formed over the insulating film 1904 in such a manner that a 10-nm-thick IGZO film with a metal oxide target containing In, Ga, and Zn at an atomic ratio of 1:1:1, and a 10-nm-thick IGZO film with a metal oxide target containing In, Ga, and Zn at an atomic ratio of 1:3:2 were successively formed by a sputtering method. Then, etching treatment was performed on the stacked IGZO films with a mask formed through a photolithography process and then heat treatment was performed at 350° C. or 450° C., so that the multilayer film 1906 was formed.

Through the above process, the sample 3a was formed.

Next, the sheet resistance of the oxide semiconductor film 1905 provided in the sample 2a and the sheet resistance of the multilayer film 1906 provided in the sample 3a were measured. In each of the samples 2a and 3a, a probe is made contact with the openings 1917 and 1919 to measure the sheet resistance of the oxide semiconductor film 1905 or the multilayer film 1906. Note that in the oxide semiconductor film 1905 in the sample 2a and the multilayer film 1906 in the sample 3a, the widths of the conductive films 1907 and 1909 facing each other were each 1.5 mm and the distance between the conductive films 1907 and 1909 was 10 μm. Further, in each of the samples 2a and 3a, the potential of the conductive film 1907 was a ground potential, and 1 V was applied to the conductive film 1909. The sheet resistance values of the samples 2a and 3a were measured after the samples 2a and 3a were preserved at 60° C. under an atmosphere with a humidity of 95% for 60 hours and 130 hours.

Figure 39:
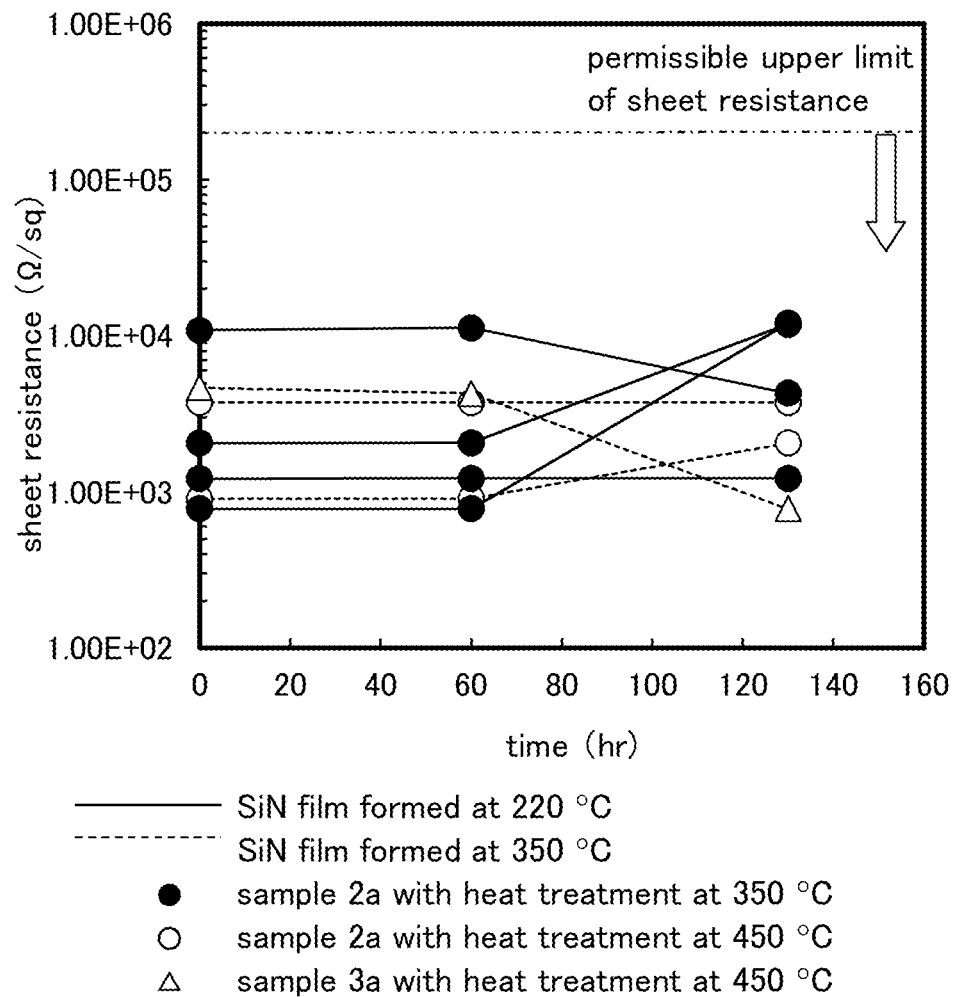
FIG. 39 is a graph showing sheet resistance.

FIG. 39 shows the sheet resistance values of the samples 2a and 3a. Note that in FIG. 39, the film formation temperature of the silicon nitride film formed as the insulating film 1911 in each sample is 220° C. (a solid line) or 350° C. (a dashed line). In addition, black circle and triangle indicate the samples each subjected to heat treatment at 350° C. after the formation of the oxide semiconductor film 1905 or the multilayer film 1906, and white circle and triangle indicate the samples each subjected to heat treatment at 450° C. after the formation of the oxide semiconductor film 1905 or the multilayer film 1906. The black and white circles indicate the samples each including the oxide semiconductor film 1905, i.e., the sample 2a, and the white triangle indicates the sample including the multilayer film 1906, i.e., the sample 3a. Note that the measurement result of the sample 3a which was subjected to heat treatment at 350° C. after the formation of the multilayer film 1906 (which is indicated by a black triangle) is not plotted in FIG. 39.

FIG. 39 shows that the samples 2a and 3a had low sheet resistance values and satisfied a preferable sheet resistance value for an electrode of a capacitor, which is 0.2 MΩ/sq., and that the amount of change over time in the sheet resistance values of the samples 2a and 3a was small. As described above, the amount of change in the sheet resistance value of the oxide semiconductor film or the multilayer film in contact with the silicon nitride film is small under a high-temperature high-humidity environment; therefore, the oxide semiconductor film or the multilayer film can be used as a light-transmitting conductive film which is used for an electrode of a capacitor.

Figure 40:
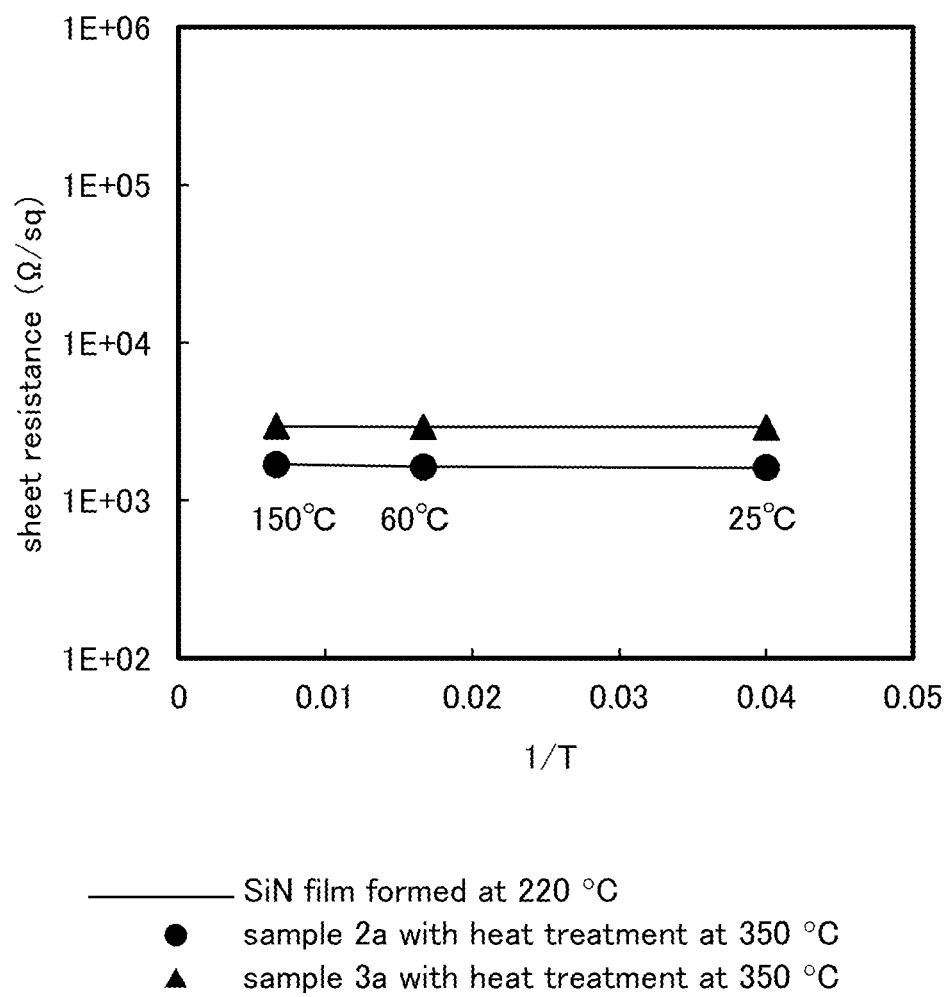
FIG. 40 is a graph showing sheet resistance.

Next, the sheet resistance values of the samples 2a and 3a when the substrate temperature was 25° C., 60° C., or 150° C. were measured, and the measurement results are shown in FIG. 40. Note that here, as each of the samples 2a and 3a, a sample which includes the silicon nitride film formed as the insulating film 1911 at 220° C. and which was subjected to heat treatment at 350° C. after the formation of the oxide semiconductor film 1905 or the multilayer film 1906 was used. Further, in FIG. 40, a black circle indicates the measurement result of the sample 2a and a black triangle indicates the measurement result of the sample 3a.

FIG. 40 shows that the sheet resistance values of the oxide semiconductor film 1905 and the multilayer film 1906 were not changed even when the substrate temperature was raised. In other words, the oxide semiconductor film or the multilayer film in contact with the silicon nitride film is a degenerated semiconductor. The amount of change in the sheet resistance value of the oxide semiconductor film or the multilayer film in contact with the silicon nitride film was small even when the substrate temperature was changed; therefore, the oxide semiconductor film or the multilayer film can be used as a light-transmitting conductive film which is used for an electrode of a capacitor.

Note that the structure described in this example can be used as appropriate in combination with any of the structures in the other embodiments and examples.

Example 2

In this example, analysis of impurities in an oxide semiconductor film and an insulating film formed over the oxide semiconductor film will be described with reference to FIGS. 36A and 36B.

In this example, two kinds of samples (hereinafter a sample 5 and a sample 6) were formed as samples for impurity analysis.

First, a method for forming the sample 5 is described below.

As for the sample 5, an IGZO film was formed over a glass substrate and a silicon nitride film was formed thereover. After that, heat treatment at 450° C. under a nitrogen atmosphere for one hour and then heat treatment at 450° C. under a mixed gas atmosphere of nitrogen and oxygen (the proportion of the nitrogen was 80%, and the proportion of the oxygen was 20%) for one hour were successively performed.

Note that as for the IGZO film, a 100-nm-thick IGZO film was formed by a sputtering method using a metal oxide target containing In, Ga, and Zn at an atomic ratio of 1:1:1 under the following conditions: the Ar gas flow rate was 100 sccm and the $O_2$ gas flow rate was 100 sccm (the proportion of the $O_2$ gas was 50%); the pressure was 0.6 Pa; the film formation power was 5000 W; and the substrate temperature was 170° C.

In addition, as for the silicon nitride film, a 100-nm-thick silicon nitride film was formed by a PE-CVD method under the following conditions: the $SiH_4$ gas flow rate was 50 sccm, the $N_2$ gas flow rate was 5000 sccm, and the $NH_3$ gas flow rate was 100 sccm; the pressure was 100 Pa; the film formation power was 1000 W; and the substrate temperature was 220° C.

Next, a method for forming the sample 6 is described below.

An IGZO film was formed over a glass substrate and a silicon oxynitride film and a silicon nitride film were stacked thereover. After that, heat treatment at 450° C. under a nitrogen atmosphere for one hour and then heat treatment at 450° C. under a mixed gas atmosphere of nitrogen and oxygen (the proportion of the nitrogen was 80%, and the proportion of the oxygen was 20%) for one hour were successively performed.

Note that the film formation conditions of the IGZO film and the silicon nitride film were similar to those of the sample 5. In addition, as for the silicon oxynitride film, a 50-nm-thick silicon oxynitride film was formed by a PE-CVD method under the following conditions: the $SiH_4$ gas flow rate was 30 sccm and the $N_2O$ gas flow rate was 4000 sccm; the pressure was 40 Pa; the film formation power was 150 W; and the substrate temperature was 220° C. After that, a 400-nm-thick silicon oxynitride film was formed by a PE-CVD method under the following conditions: the $SiH_4$ gas flow rate was 160 sccm and the $N_2O$ gas flow rate was 4000 sccm; the pressure was 200 Pa; the film formation power was 1500 W; and the substrate temperature was 220° C.

Figure 36A:
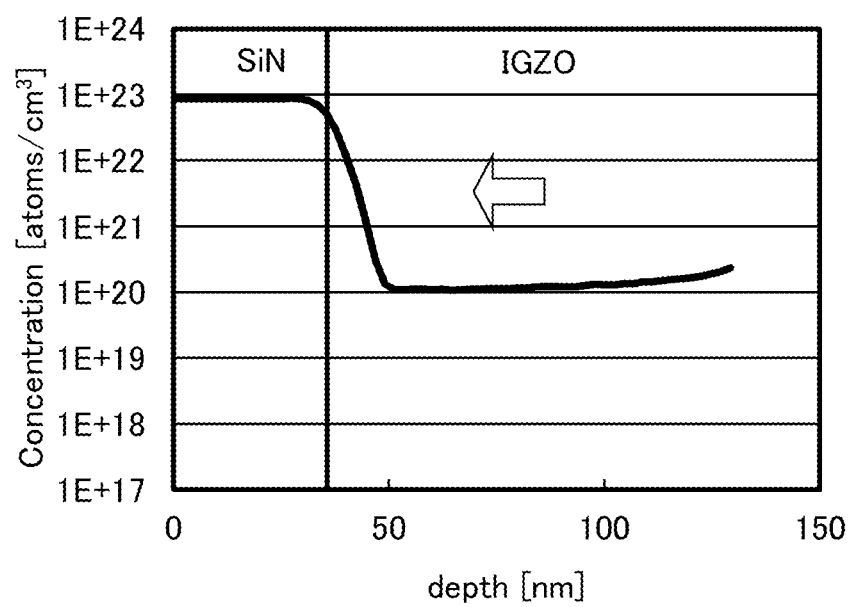
FIGS. 36A and 36B show results of SIMS measurement.
Figure 36B:
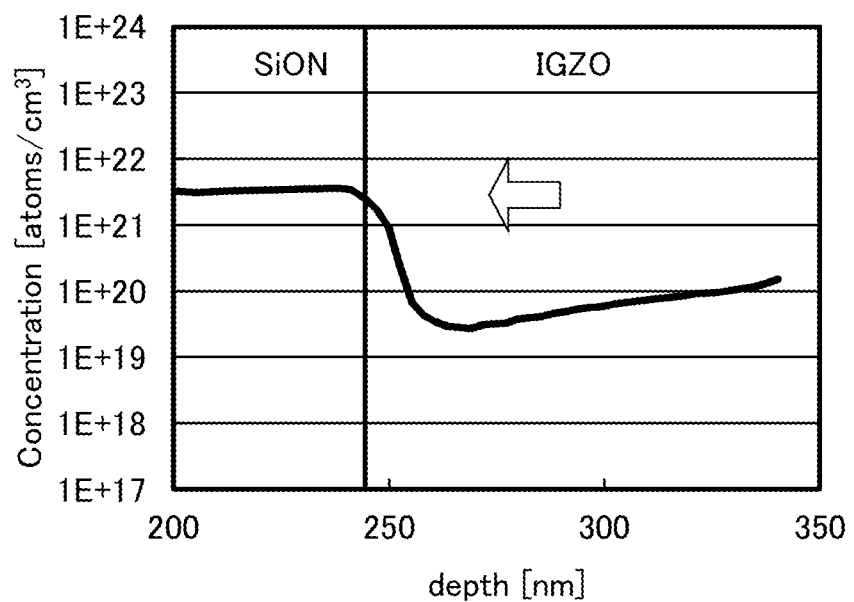

FIGS. 36A and 36B show the results of the impurity analysis of the samples 5 and 6.

Note that the impurity analysis was performed in the direction shown by the arrow in each of FIGS. 36A and 36B by secondary ion mass spectrometry (SIMS). That is, the measurement was performed from the glass substrate side.

FIG. 36A shows the concentration profile of hydrogen (H) which was obtained by measurement of the sample 5. FIG. 36B shows the concentration profile of hydrogen (H) which was obtained by measurement of the sample 6.

FIG. 36A shows that the concentration of hydrogen (H) in the IGZO film was $1.0 \times 10^{20}$ atoms/cm$^3$ and that the concentration of hydrogen (H) in the silicon nitride film was $1.0 \times 10^{23}$ atoms/cm$^3$. In addition, FIG. 36B shows that the concentration of hydrogen (H) in the IGZO film was $5.0 \times 10^{19}$ atoms/cm$^3$ and that the concentration of hydrogen (H) in the silicon oxynitride film was $3.0 \times 10^{21}$ atoms/cm$^3$.

It is known that it is difficult to obtain accurate data in the proximity of a surface of a sample or in the proximity of an interface between stacked films formed using different materials by the SIMS analysis in measurement principle. Thus, in the case where distributions of the concentrations of hydrogen (H) in the film in the thickness direction are analyzed by SIMS, an average value in a region where the film is provided, the value is not greatly changed, and an almost constant level of strength can be obtained is employed as the concentrations of hydrogen (H).

A difference between the IGZO films in the concentration of hydrogen (H) was found in this manner by changing the structure of the insulating film in contact with the IGZO film.

For example, in the case where any of the above IGZO films is formed in a channel formation region of a transistor, it is preferable to employ a structure in which a silicon oxynitride film is provided in contact with the IGZO film as shown in the sample 6. As a light-transmitting conductive film used for an electrode of a capacitor, it is preferable to employ a structure in which a silicon nitride film is provided in contact with the IGZO film as shown in the sample 5. With such a structure, even when an IGZO film which is used for a channel formation region of a transistor and an IGZO film which is used for an electrode of a capacitor are formed through the same process, the hydrogen concentrations of the IGZO films can be made different from each other.

Example 3

In this example, the amounts of defects in an oxide semiconductor film and a multilayer film will be described with reference to FIGS. 37A to 37C and FIG. 38.

First, the structure of a sample is described.

A sample 7 includes a 35-nm-thick oxide semiconductor film formed over a quartz substrate and a 100-nm-thick nitride insulating film formed over the oxide semiconductor film.

A sample 8 and a sample 9 each include a 30-nm-thick multilayer film formed over a quartz substrate and a 100-nm-thick nitride insulating film formed over the multilayer film. Note that in the multilayer film of the sample 8, a 10-nm-thick first oxide film, a 10-nm-thick oxide semiconductor film, and a 10-nm-thick second oxide film are stacked in this order. In the multilayer film of the sample 9, a 20-nm-thick first oxide film, a 15-nm-thick oxide semiconductor film, and a 10-nm-thick second oxide film are stacked in this order. The samples 8 and 9 are different from the sample 7 in that the multilayer film is included instead of the oxide semiconductor film.

A sample 10 includes a 100-nm-thick oxide semiconductor film formed over a quartz substrate, a 250-nm-thick oxide insulating film formed over the oxide semiconductor film, and a 100-nm-thick nitride insulating film formed over the oxide insulating film. The sample 10 is different from the samples 7 to 9 in that the oxide semiconductor film is not in contact with the nitride insulating film but in contact with the oxide insulating film.

Next, methods for forming the samples are described.

First, a method for forming the sample 7 is described.

A 35-nm-thick IGZO film was formed as the oxide semiconductor film over the quartz substrate. As for the IGZO film, the 35-nm-thick IGZO film was formed by a sputtering method using a metal oxide target containing In, Ga, and Zn at an atomic ratio of 1:1:1 under the following conditions: the Ar gas flow rate was 100 sccm and the $O_2$ gas flow rate was 100 sccm (the proportion of the $O_2$ gas was 50%); the pressure was 0.6 Pa; the film formation power was 5000 W; and the substrate temperature was 170° C.

Next, as first heat treatment, heat treatment at 450° C. under a nitrogen atmosphere for one hour and then heat treatment at 450° C. under a mixed gas atmosphere of nitrogen and oxygen (the proportion of the nitrogen was 80%, and the proportion of the oxygen was 20%) for one hour were successively performed.

Next, a 100-nm-thick silicon nitride film was formed as the nitride insulating film over the oxide semiconductor film. As for the silicon nitride film, the 100-nm-thick silicon nitride film was formed by a PE-CVD method under the following conditions: the $SiH_4$ gas flow rate was 50 sccm, the $N_2$ gas flow rate was 5000 sccm, and the $NH_3$ gas flow rate was 100 sccm; the pressure was 100 Pa; the film formation power was 1000 W; and the substrate temperature was 350° C.

Next, as second heat treatment, heat treatment was performed at 250° C. under a nitrogen atmosphere for one hour.

Through the above process, the sample 7 was formed.

Next, a method for forming the sample 8 is described.

As for the sample 8, the multilayer film was formed instead of the oxide semiconductor film of the sample 7. As for the multilayer film, the 10-nm-thick first oxide film was formed by a sputtering method using a metal oxide target containing In, Ga, and Zn at an atomic ratio of 1:3:2 under the following conditions: the Ar gas flow rate was 180 sccm and the $O_2$ gas flow rate was 20 sccm (the proportion of the $O_2$ gas was 10%); the pressure was 0.6 Pa; the film formation power was 5000 W; and the substrate temperature was 25° C. Then, the 10-nm-thick oxide semiconductor film was formed by a sputtering method using a metal oxide target containing In, Ga, and Zn at an atomic ratio of 1:1:1 under the following conditions: the Ar gas flow rate was 100 sccm and the $O_2$ gas flow rate was 100 sccm (the proportion of the $O_2$ gas was 50%); the pressure was 0.6 Pa; the film formation power was 5000 W; and the substrate temperature was 170° C. Then, the 10-nm-thick second oxide film was formed by a sputtering method using a metal oxide target containing In, Ga, and Zn at an atomic ratio of 1:3:2 under the following conditions: the Ar gas flow rate was 180 sccm and the $O_2$ gas flow rate was 20 sccm (the proportion of the $O_2$ gas was 10%); the pressure was 0.6 Pa; the film formation power was 5000 W; and the substrate temperature was 25° C.

Other steps are similar to those of the sample 7. Through the above process, the sample 8 was formed.

Next, a method for forming the sample 9 is described.

As for the sample 9, the multilayer film was formed instead of the oxide semiconductor film of the sample 7. As for the multilayer film, the 20-nm-thick first oxide film was formed over the quartz substrate under the same conditions as the first oxide film of the sample 8. Then, the 15-nm-thick oxide semiconductor film was formed by a sputtering method under the same conditions as the oxide semiconductor film of the sample 8. Then, the 10-nm-thick second oxide film was formed under the same conditions as the second oxide film of the sample 8.

Other steps are similar to those of the sample 7. Through the above process, the sample 9 was formed.

Next, a method for forming the sample 10 is described.

As for the sample 10, the 100-nm-thick oxide semiconductor film was formed over the quartz substrate under the same conditions as the sample 7.

Next, first heat treatment was performed under conditions similar to those of the sample 7.

Next, a 50-nm-thick first silicon oxynitride film and a 200-nm-thick second silicon oxynitride film were stacked over the oxide semiconductor film as the oxide insulating film. Here, the 50-nm-thick first silicon oxynitride film was formed by a PE-CVD method under the following conditions: the SiH$_4$ gas flow rate was 30 sccm and the N$_2$O gas flow rate was 4000 sccm; the pressure was 40 Pa; the film formation power was 150 W; and the substrate temperature was 220° C. After that, the 200-nm-thick second silicon oxynitride film was formed by a PE-CVD method under the following conditions: the SiH$_4$ gas flow rate was 160 sccm and the N$_2$O gas flow rate was 4000 sccm; the pressure was 200 Pa; the film formation power was 1500 W; and the substrate temperature was 220° C. Note that the second silicon oxynitride film is a film containing oxygen at a higher proportion than oxygen in the stoichiometric composition.

Next, a 100-nm-thick silicon nitride film was formed over the oxide insulating film under the same conditions as the sample 7.

Next, second heat treatment was performed under conditions similar to those of the sample 7.

Through the above process, the sample 10 was formed.

Next, the samples 7 to 10 were measured by ESR. In the ESR measurement performed at a predetermined temperature, a value of a magnetic field (H$_0$) where a microwave is absorbed is used for an equation g=hn/bH$_0$, so that a parameter of a g-factor can be obtained. Note that the frequency of the microwave is denoted by ν, and the Planck constant and the Bohr magneton are denoted by, respectively, h and β which are both constants.

Here, the ESR measurement was performed under the conditions as follows. The measurement temperature was room temperature (25° C.), the high-frequency power (power of microwaves) of 8.92 GHz was 20 mW, and the direction of a magnetic field was parallel to a surface of each sample.

FIG. 37A shows a first derivative curve obtained by ESR measurement of the oxide semiconductor film in the sample 7; and FIGS. 37B and 37C show first derivative curves obtained by ESR measurement of the multilayer films in the samples 8 and 9. FIG. 37A shows the measurement result of the sample 7, FIG. 37B shows the measurement result of the sample 8, and FIG. 37C shows the measurement result of the sample 9.

Figure 38:
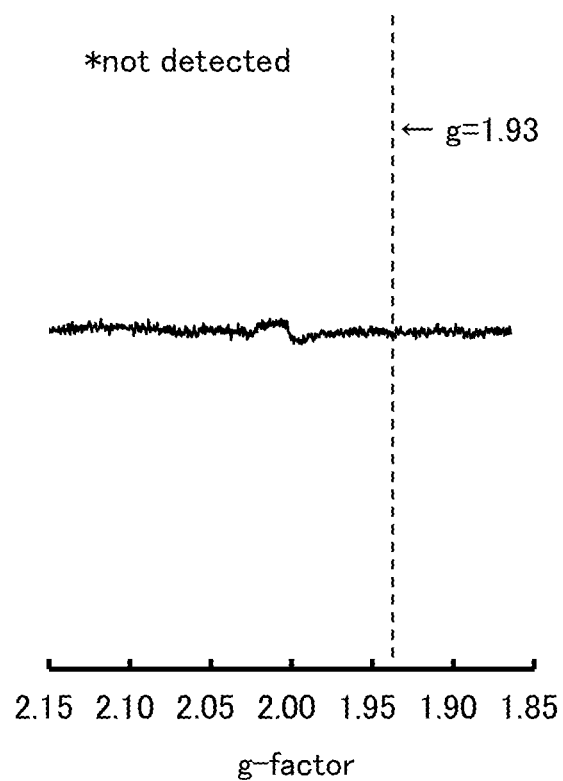
FIG. 38 shows a result of ESR measurement.

FIG. 38 shows a first derivative curve obtained by ESR measurement of the oxide semiconductor film in the sample 10.

In FIGS. 37A to 37C, the sample 7 has signal symmetry due to a defect in the oxide semiconductor film when a g-factor is 1.93. The samples 8 and 9 each have signal symmetry due to a defect in the multilayer film when a g-factor is 1.95. As for the sample 7, the spin density when a g-factor was 1.93 was 2.5×10$^{19}$ spins/cm$^3$, in the sample 8, the total spin densities when g-factors were 1.93 and 1.95 were 1.6×10$^{19}$ spins/cm$^3$, and in the sample 9, the total spin densities when g-factors were 1.93 and 1.95 were 2.3×10$^{19}$ spins/cm$^3$. That is, it is found that the oxide semiconductor film and the multilayer film include defects. Note that an oxygen vacancy is an example of the defect in the oxide semiconductor film and the multilayer film.

Although, in FIG. 38, the thickness of the oxide semiconductor film of the sample 10 is thicker than that of the sample 7 and those of the multilayer films of the samples 8 and 9, signal symmetry due to a defect was not detected, i.e., the number of defects was less than or equal to the lower limit of detection (here, the lower limit of detection was 3.7×10$^{16}$ spins/cm$^3$). Accordingly, it is found that the number of defects in the oxide semiconductor film cannot be detected.

It is found that when a nitride insulating film, here the silicon nitride film formed by a PE-CVD method is in contact with an oxide semiconductor film or a multilayer film, defects typified by oxygen vacancies are generated in the oxide semiconductor film or the multilayer film. On the other hand, when an oxide insulating film, here the silicon oxynitride film is provided over an oxide semiconductor film, excess oxygen contained in the silicon oxynitride film, i.e., oxygen contained at a higher proportion than oxygen in the stoichiometric composition is diffused into the oxide semiconductor film and thus the number of defects in the oxide semiconductor film is not increased.

As described above, as shown in the samples 7 to 9, the oxide semiconductor film or the multilayer film which is in contact with the nitride insulating film has a number of defects typified by oxygen vacancies, and has a high conductivity and therefore can be used as an electrode of a capacitor. On the other hand, as shown in the sample 10, an oxide semiconductor film which is in contact with the oxide insulating film has a small number of oxygen vacancies and low conductivity and therefore can be used as a channel formation region of a transistor.

Here, the cause of a reduction in resistivity of the oxide semiconductor film or the multilayer film which is in contact with the nitride insulating film is described below.

<Energy and Stability Between Existing Modes of Hydrogen (H)>

First, the energy difference and stability in a mode of H which exists in an oxide semiconductor film is described with calculated results. Here, InGaZnO$_4$ was used as the oxide semiconductor film.

The structure used for the calculation is based on an 84-atom bulk model in which twice the number of a hexagonal unit cell of the InGaZnO$_4$ is arranged along the a-axis and b-axis.

Figure 41A:
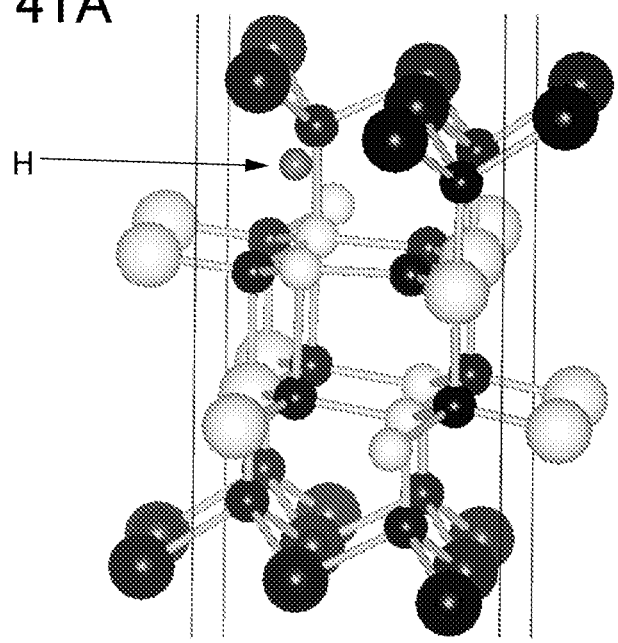
FIGS. 41A and 41B each illustrate a bulk model of $InGaZnO_4$.

As the bulk model, a model in which one O atom bonded to three In atoms and one Zn atom is substituted with a H atom was prepared. This is expressed as VoH (see FIG. 41A).

Figure 41B:
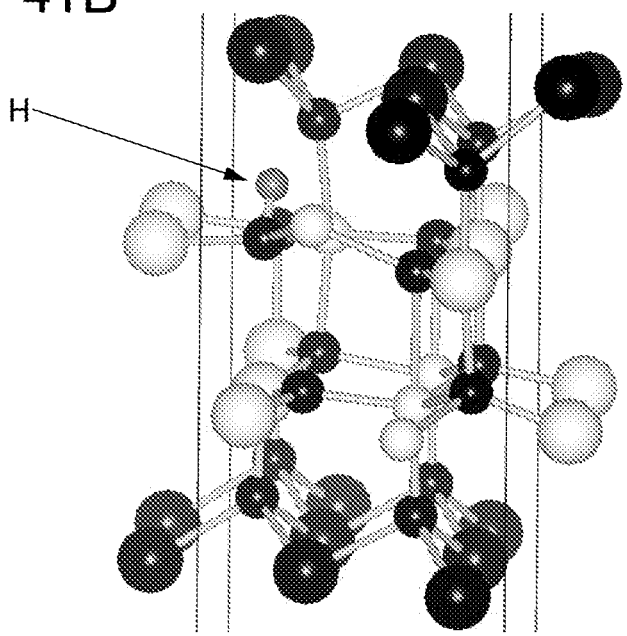

In the bulk model, one O atom bonded to three In atoms and one Zn atom is removed, whereby an oxygen vacancy Vo is formed. A model in which, in the vicinity of the oxygen vacancy Vo, a H atom is bonded to one O atom to which one Ga atom and two Zn atoms are bonded on the a-b plane was prepared. This is expressed as Vo+H (see FIG. 41B).

Optimization calculation was performed on the above two models with a fixed lattice constant to calculate the total energy. Note that as the value of the total energy is smaller, the structure becomes more stable.

In the calculation, first principles calculation software VASP (The Vienna Ab initio Simulation Package) was used. The calculation conditions are shown in Table 1.

TABLE 1

| Software | VASP |
| --- | --- |
| Pseudopotential | PAW |
| Functional | CGA/PBE |
| Cut-off energy | 500 eV |
| K-point | 4 × 4 × 1 |

As pseudopotential calculation of electronic states, a potential generated by a projector augmented wave (PAW) method was used, and as a functional, generalized-gradient-approximation/Perdew-Burke-Ernzerhof (GGA/PBE) was used.

In addition, the total energy of the two models which were obtained by the calculations is shown in Table 2.

TABLE 2

| Model | Total Energy |
| --- | --- |
| VoH | −456.084 eV |
| Vo + H | −455.304 eV |

According to Table 2, the total energy of VoH is lower than that of Vo+H by 0.78 eV. Thus, VoH is more stable than Vo+H. Accordingly, when a H atom comes close to an oxygen vacancy (Vo), the H atom might be easily trapped in the oxygen vacancy (Vo) than bonding with an O atom.

<Thermodynamic State of VoH>

Next, the formation energy and the charge state of VoH which is generated by a H atom trapped in an oxygen vacancy (Vo) is described with calculated results. The formation energy of VoH is different depending on the charge state and also depends on the Fermi energy. Thus, the stable charge state of VoH is different depending on the Fermi energy. Here, (VoH)$^+$ denotes a state in which one electron is discharged by VoH, (VoH)$^-$ denotes a state in which one electron is trapped by VoH, and (VoH)$^0$ denotes a state in which an electron is not transferred. The formation energies of (VoH)$^+$, (VoH)$^-$, and (VoH)$^0$ were calculated.

In the calculation, the first principles calculation software VASP was used. The calculation conditions are shown in Table 3.

TABLE 3

| Software | VASP |
| --- | --- |
| Pseudopotential | PAW |
| Functional | HSE06 |
| Cut-off energy | 800 eV |
| Number of k-point sampling | 2 × 2 × 1 (opt.) |
|  | 4 × 4 × 1 (single) |
| Spin polarization | setup |
| Shielding parameter | 0.2 |
| Fraction of the nonolcal Fock-exchange | 0.25 |
| Number of atoms | 84 |

As pseudopotential calculation of electronic states, a potential generated by a projector augmented wave (PAW) method was used, and as a functional, Heyd-Scuseria-Ernzerhof (HSE) DFT hybrid factor (HSE06) was used.

Note that the formation energy of an oxygen vacancy was calculated as follows: a dilute limit of the concentration of oxygen vacancies was assumed, and excessive expansion of electrons and holes to the conduction band and the valence band was corrected. In addition, shift of the valence band due to the defect structure was corrected using the average electrostatic potential with the top of the valence band of a complete crystal serving as the origin of energy.

Figure 42A:
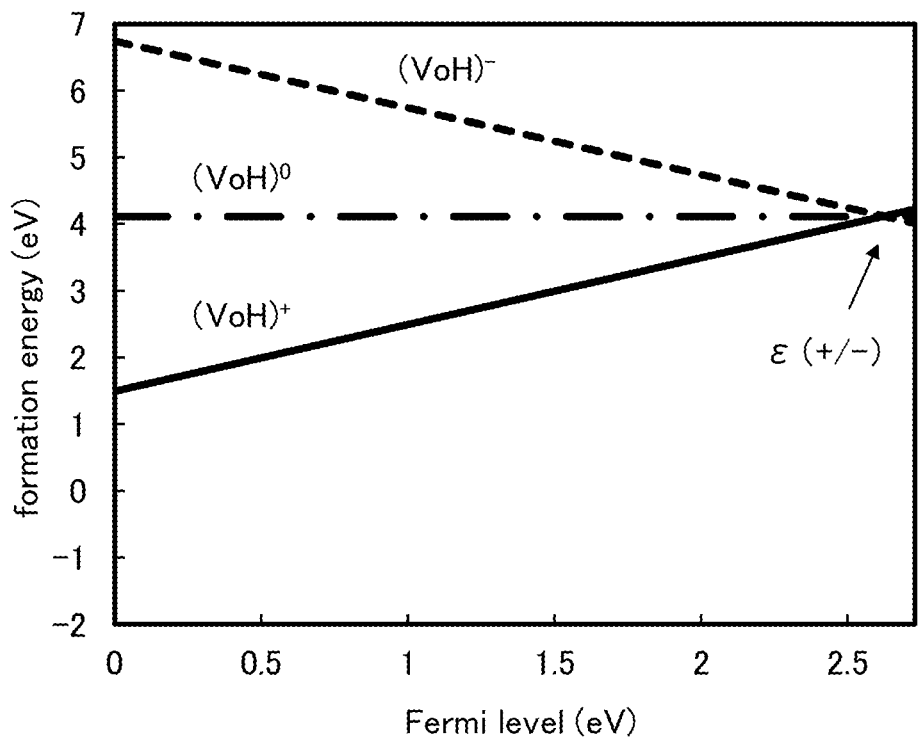
FIGS. 42A and 42B illustrate formation energy and thermodynamic transition level of VoH.

FIG. 42A shows the formation energies of (VoH)$^+$, (VoH)$^-$, and (VoH)$^0$. The horizontal axis represents the Fermi level, and the vertical axis represents the formation energy. The solid line represents the formation energy of (VoH)$^+$, the dashed-dotted line represents the formation energy of (VoH)$^0$, and the dashed line represents the formation energy of (VoH)$^-$. In addition, the transition level from a positive VoH charge to a negative VoH charge through 0 is represented by $\in (+/-)$.

Figure 42B:
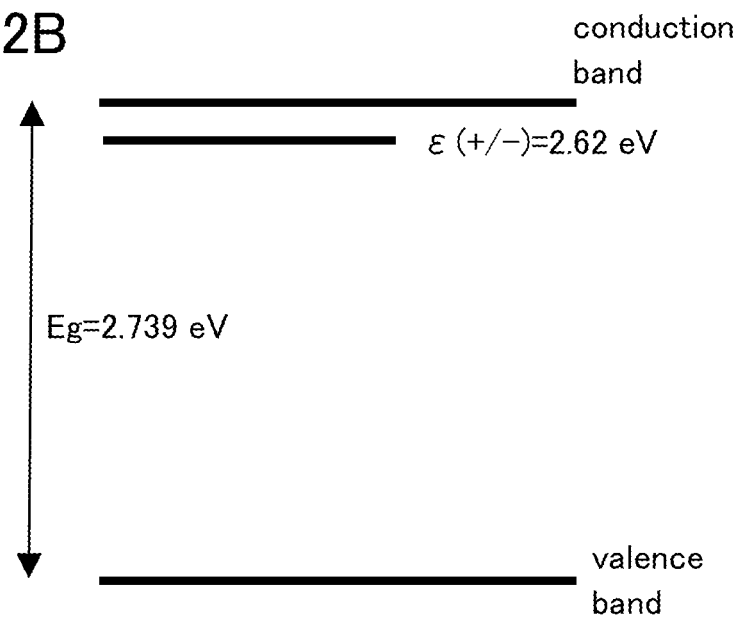

FIG. 42B shows a thermodynamic transition level of VoH. From the calculation result, the energy gap of InGaZnO$_4$ was 2.739 eV. In addition, when the energy of the valence band is 0 eV, the transfer level ($\in(+/-)$) is 2.62 eV, which exists just under the conduction band. This shows that InGaZnO$_4$ is n-type by trapping a H atom in an oxygen vacancy Vo.

When an oxide semiconductor film is exposed to plasma, the oxide semiconductor film is damaged and defects typified by oxygen vacancies are generated in the oxide semiconductor film. In addition, when a nitride insulating film is in contact with an oxide semiconductor film, hydrogen contained in the nitride insulating film is transferred to the oxide semiconductor film. As a result, VoH is formed in an oxide semiconductor film by entry of hydrogen into an oxygen vacancy in the oxide semiconductor film, so that the oxide semiconductor film becomes n-type film and the resistivity thereof is reduced. As described above, the oxide semiconductor film in contact with the nitride insulating film can be used as an electrode of a capacitor.

This application is based on Japanese Patent Application serial no. 2012-188010 filed with Japan Patent Office on Aug. 28, 2012 and Japanese Patent Application serial no. 2013-053989 filed with Japan Patent Office on Mar. 15, 2013, the entire contents of which are hereby incorporated by reference.

What is claimed is:

1. A semiconductor device comprising:
   a signal line;
   a first scan line;
   a second scan line;
   a first transistor comprising a source, a drain, and a gate;
   a second transistor comprising a source, a drain, and a gate;
   a pixel electrode; and
   a capacitor comprising an electrode and the pixel electrode over the electrode,
   wherein one of the source and the drain of the first transistor is electrically connected to the pixel electrode,
   wherein the first scan line is electrically connected to the gate of the first transistor,
   wherein the signal line is electrically connected to the other of the source and the drain of the first transistor and one of the source and the drain of the second transistor,
   wherein the second scan line is directly connected to the gate of the second transistor,
   wherein the electrode of the capacitor comprises an oxide film comprising indium and zinc,
   wherein a first insulating film is provided over the first scan line and the second scan line,
   wherein the source and the drain of the first transistor are over the first insulating film,
   wherein the first insulating film comprises an opening, and
   wherein the electrode of the capacitor is in direct contact with the second scan line in the opening of the first insulating film.

2. The semiconductor device according to claim 1, wherein the first transistor comprises an oxide semiconductor film over the gate of the first transistor.

3. The semiconductor device according to claim 2, wherein the oxide semiconductor film comprises indium and zinc.

4. The semiconductor device according to claim 2, further comprising a second insulating film over the oxide semiconductor film, wherein the source and the drain of the first transistor are over the second insulating film.

5. The semiconductor device according to claim 2, wherein the electrode of the capacitor has higher conductivity than the oxide semiconductor film.

6. The semiconductor device according to claim 2, wherein the electrode of the capacitor and the oxide semiconductor film of the first transistor are provided on a same surface of the first insulating film.

7. The semiconductor device according to claim 1, further comprising a nitride insulating film in contact with an upper surface of the electrode of the capacitor.

8. The semiconductor device according to claim 1, further comprising a nitride insulating film in contact with a lower surface of the electrode of the capacitor.

9. The semiconductor device according to claim 1, wherein the electrode of the capacitor comprises an impurity including at least one selected from the group consisting of boron, nitrogen, fluorine, aluminum, phosphorus, arsenic, indium, tin, antimony, and a rare gas element.

10. The semiconductor device according to claim 1, further comprising a liquid crystal over the pixel electrode.

11. A semiconductor device comprising:
a substrate;
a first scan line and a second scan line over the substrate;
a first insulating film over the first scan line and the second scan line;
a first oxide film, a second oxide film, and a third oxide film each over the first insulating film;
a signal line over and electrically connected to the first oxide film and the third oxide film;
a conductive film over and electrically connected to the first oxide film;
a second insulating film over the signal line, the conductive film, and the second oxide film; and
a pixel electrode over the second insulating film and electrically connected to the conductive film,
wherein each of the first oxide film, the second oxide film, and the third oxide film comprises indium and zinc,
wherein the first oxide film overlaps with the first scan line,
wherein the second oxide film overlaps with the pixel electrode,
wherein the third oxide film overlaps with the second scan line, and
wherein the second oxide film is directly connected to the second scan line.

12. The semiconductor device according to claim 11, wherein the second oxide film has higher conductivity than the first oxide film and the third oxide film.

13. The semiconductor device according to claim 11, wherein the first insulating film is a nitride film and in contact with the second oxide film.

14. The semiconductor device according to claim 11, wherein the second insulating film is a nitride film and in contact with the second oxide film.

15. The semiconductor device according to claim 11, wherein the second oxide film comprises an impurity including at least one selected from the group consisting of boron, nitrogen, fluorine, aluminum, phosphorus, arsenic, indium, tin, antimony, and a rare gas element.

16. The semiconductor device according to claim 11, wherein the first insulating film is an oxide film and in contact with the first oxide film and the third oxide film.

17. The semiconductor device according to claim 11, wherein the second insulating film is an oxide film and in contact with the first oxide film and the third oxide film.

18. The semiconductor device according to claim 11, further comprising a third insulating film between the second insulating film and the signal line, wherein the second insulating film is in contact with the second oxide film.

19. The semiconductor device according to claim 11, further comprising a liquid crystal over the pixel electrode.

20. The semiconductor device according to claim 11,
wherein the second insulating film comprises a first region and a second region,
wherein the first region overlaps with the signal line and the conductive film, and
wherein the second region overlaps with the second oxide film and is thinner than the first region.

21. The semiconductor device according to claim 11,
wherein a hydrogen concentration measured by secondary ion mass spectrometry of the second oxide film is greater than or equal to $1\times10^{20}$ atoms/cm$^3$.

* * * * *